United States Patent
Wang et al.

(10) Patent No.: US 10,615,771 B2
(45) Date of Patent: Apr. 7, 2020

(54) UNRELEASED COUPLED MEMS RESONATORS AND TRANSMISSION FILTERS

(71) Applicants: Wentao Wang, Cambridge, MA (US); Andreja Erbes, Juan les Pins (FR); Dana Weinstein, Cambridge, MA (US); Ashwin A. Seshia, Cambridge (GB)

(72) Inventors: Wentao Wang, Cambridge, MA (US); Andreja Erbes, Juan les Pins (FR); Dana Weinstein, Cambridge, MA (US); Ashwin A. Seshia, Cambridge (GB)

(73) Assignee: Massachusetts Institute of Technology, Cambridge, MA (US)

( * ) Notice: Subject to any disclaimer, the term of this patent is extended or adjusted under 35 U.S.C. 154(b) by 666 days.

(21) Appl. No.: 15/274,056

(22) Filed: Sep. 23, 2016

(65) Prior Publication Data

US 2017/0012338 A1    Jan. 12, 2017

Related U.S. Application Data

(63) Continuation of application No. PCT/US2015/035116, filed on Jun. 10, 2015.
(Continued)

(51) Int. Cl.
*H03H 9/02* (2006.01)
*H03H 9/24* (2006.01)
(Continued)

(52) U.S. Cl.
CPC ......... *H03H 9/02244* (2013.01); *H01L 41/09* (2013.01); *H01P 5/02* (2013.01);
(Continued)

(58) Field of Classification Search
CPC ................. H03H 9/00; H03H 9/02244; H03H 2009/02251; H03H 9/24; H03H 9/2405;
(Continued)

(56) References Cited

U.S. PATENT DOCUMENTS

| 4,178,571 A | * | 12/1979 | Mitchell | ............ | H03H 9/02795 |
| | | | | | 333/194 |
| 4,247,836 A | | 1/1981 | Redwood et al. | | |

(Continued)

OTHER PUBLICATIONS

S. Mohammadi et al.: "Resonator/Waveguide Coupling in Phononic Crystals for Demultiplexing and Filtering Applications"; 2010 IEEE International Ultrasonics Symposium Proceedings, Conference dates Oct. 11-14, 2010, pp. 155-157. (Year: 2010).*
(Continued)

*Primary Examiner* — Barbara Summons
(74) *Attorney, Agent, or Firm* — Smith Baluch LLP

(57) ABSTRACT

Examples of the present invention include unreleased coupled multi-cavity resonators and transmission filters. In some examples, the resonators include resonant cavities coupled by acoustic couplers (ABGCs) and acoustic reflectors (ABRs). These acoustic components enable improved confinement of acoustic modes within the resonator to increase the quality factor (Q) and lower the motional resistance ($R_x$). A coupled resonator with 5 cavities coupled by 4 ABGCs can achieve a Q of 1095 while a single-cavity resonator of the same device size has a Q of 760. In some examples, the devices can be configured to work as electronic transmission filters in at least two types of filter configurations. In the transmission line filter configuration, the device can include a filter structure in an arrangement $(LH)^N H (LH)^N$, defined as a Fabry-Perot Resonator (FPR). In the multi-pole filter configuration, the device can include a filter structure in an arrangement similar to the multi-cavity resonator design.

16 Claims, 31 Drawing Sheets

Related U.S. Application Data

(60) Provisional application No. 62/009,990, filed on Jun. 10, 2014, provisional application No. 62/011,107, filed on Jun. 12, 2014.

(51) Int. Cl.
  *H01L 41/09* (2006.01)
  *H01P 5/02* (2006.01)
  *H01P 7/06* (2006.01)
  *H02N 2/00* (2006.01)

(52) U.S. Cl.
  CPC ............. *H01P 7/065* (2013.01); *H02N 2/001* (2013.01); *H03H 9/2405* (2013.01); *B81B 2201/0271* (2013.01)

(58) Field of Classification Search
  CPC .. H03H 2009/241; H03H 9/462; H03H 9/485; H03H 9/525; B81B 2201/0271; B81B 2203/0315; H01L 41/09; H01P 5/02; H01P 7/065; H02N 2/001; G01N 29/022; G01N 2291/0423; G01N 2291/106
  USPC .................................................. 333/186, 189
  See application file for complete search history.

(56) References Cited

U.S. PATENT DOCUMENTS

| | | | |
|---|---|---|---|
| 4,354,129 A | 10/1982 | Ieki | |
| 6,670,866 B2 * | 12/2003 | Ella ...................... | H03H 9/0095 310/366 |
| 7,242,270 B2 * | 7/2007 | Larson, III ............. | H03H 9/132 333/187 |
| 7,836,566 B1 * | 11/2010 | Olsson ................... | G10K 11/20 29/25.35 |
| 8,054,145 B2 * | 11/2011 | Mohammadi ......... | H01L 41/107 333/186 |
| 8,406,084 B2 | 3/2013 | Buccafusca et al. | |
| 8,841,818 B2 | 9/2014 | Marathe et al. | |
| 9,041,492 B2 | 5/2015 | Wang et al. | |
| 9,232,289 B2 | 1/2016 | Bahr et al. | |
| 2013/0033338 A1 | 2/2013 | Wang et al. | |
| 2013/0214878 A1 * | 8/2013 | Gorisse .............. | H03H 9/02086 333/187 |
| 2013/0214879 A1 * | 8/2013 | Gorisse .............. | H03H 9/02086 333/191 |
| 2014/0152146 A1 * | 6/2014 | Kimura .............. | H03H 9/02228 310/313 B |

OTHER PUBLICATIONS

S. Mohammadi et al.; "VHF Phononic Band Gap Band Pass Filters using Coupled Resonator Acoustic Waveguides (CRAW)", 2011 IEEE International Ultrasonics Symposium Proceedings, Conference dates Oct. 18-21, 2011, pp. 2158-2160. (Year: 2011).*
Aigner R., "SAW and BAW technologies for RF filter applications: A review of the relative strengths and weaknesses," in Ultrasonics Symposium, 2008. IUS 2008. IEEE, Nov. 2008, pp. 582-589. 2, 3.
Aigner, R., "High performance RF filters suitable for above IC integration: film bulk-acoustic-resonators (FBAR) on silicon," Custom Integrated Circuits Conference, Proceedings of the IEEE 2003, Sep. 2003, pp. 141-146. 3.
Avago Technologies' FBAR Filter Technology Designed Into Latest Generation of 4G & LTE Smartphones, http://www.avagotech.com/docs/ A V 02-3869EN , Oct. 11, 2012.
Bannon et al., "High frequency microelectromechanical IF filters," Technical Digest, IEEE, International Electron Devices Meeting, San Francisco, California, Dec. 8-11, 1996, pp. 773-776.
Bannon et al., "High-Q HF microelectromechanical filters," IEEE Journal of Solid-State Circuits, vol. 35, No. 4, pp. 512-526, Apr. 2000.
C. Zuo, N. Sinha, and G. Piazza, "Very high frequency channel-select MEMS filters based on self-coupled piezoelectric AlN contour-mode resonators," Sensors and Actuators A: Physical, vol. 160, No. 12, pp. 132-140, 2010. 6.
Chandrahalim et al., "Digitally-tunable MEMS filter using mechanically-coupled resonator array," in Micro Electro Mechanical Systems, 2008. MEMS 2008. IEEE 21st International Conference on, Jan. 2008, pp. 1020-1023. 25.
Dana Weinstein and Sunil A. Bhave, "Internal dielectric transduction in bulk-mode resonators," IEEE Journal ofMicroelectromechanical Systems (JMEMS), 18(6), 1401-1408 (2009).
Demirci, M. and C.-C. Nguyen, "A low impedance VHF micromechanical filter using coupled-array composite resonators," in Solid-State Sensors, Actuators and Microsystems, 2005. Digest of Technical Papers. Transducers '05. The 13th International Conference on, vol. 2, Jun. 2005, pp. 2131-2134 vol. 2. 5.
Demirci, M.U.; Nguyen, C.T.-C., "Mechanically Corner-Coupled Square Microresonator Array for Reduced Series Motional Resistance,"Microelectromechanical Systems, Journal of, vol. 15, No. 6, pp. 1419,1436, Dec. 2006.
E. Vittoz, M. Degrauwe, and S. Bitz, "High-performance crystal oscillator circuits: theory and application," Solid-State Circuits, IEEE Journal of, vol. 23, No. 3, pp. 774-783, Jun. 1988.
G. Piazza, P. Stephanou, and A. Pisano, "Single-chip multiple-frequency ALN MEMS filters based on contour-mode piezoelectric resonators," Microelectromechanical Systems, Journal of, vol. 16, No. 2, pp. 319-328, Apr. 2007. 5.
J. Meltaus and T. Pensala, "Laterally coupled BAW filter using two acoustic modes," in Ultrasonics Symposium (IUS), 2013 IEEE International, Jul. 2013, pp. 232-235. 6.
K. Wang and C.-C. Nguyen, "High-order medium frequency micromechanical electronic filters," Microelectromechanical Systems, Journal of, vol. 8, No. 4, pp. 534-556, Dec. 1999. 5.
Nguyen, C.T. MEMS technology for timing and frequency control. (2007) IEEE transactions on ultrasonics, ferroelectrics, and frequency control, 54 (2), pp. 251-270.
P. Stephanou, G. Piazza, C. White, M. Wijesundara, and A. Pisano, "Mechanically coupled contour mode piezoelectric aluminum nitride MEMS filters," in Micro Electro Mechanical Systems, 2006. MEMS 2006 Istanbul. 19th IEEE International Conference on, 2006, pp. 906-909. 5.
P. Thiruvenkatanathan, J. Yan, J. Woodhouse and A. A. Seshia, "Manipulating vibration energy confinement in electrically coupled micro-electro-mechanical resonator arrays," Journal of Micro-ElectroMechanical Systems, vol. 20, No. 1, Feb. 2011, pp. 157-164, 2011.
R. Ruby, "Review and comparison of bulk acoustic wave FBAR, SMR technology," in Proceedings of the IEEE Ultrasonics Symposium (IUS'07), pp. 1029-1040, Oct. 2007.
R. Ruby, P. Bradley, Y. Oshmyansky, A. Chien, and I. Larson, J.D., "Thin film bulk wave acoustic resonators (FBAR) for wireless applications," in Ultrasonics Symposium, 2001 IEEE, vol. 1, 2001, pp. 813-821 vol. 1. 1, 3.
S. Lee and C. T.-C. Nguyen, "Mechanically-coupled micromechanical arrays for improved phase noise," Proceedings, IEEE Int. Ultrasonics, Ferroelectrics, and Frequency Control 50th Anniv. Joint Conf., Montreal, Canada, Aug. 24-27, 2004, pp. 280-286.
S. Pourkamali, R. Abdolvand, and F. Ayazi, "A 600 kHz electrically-coupled MEMS bandpass filter," in Micro Electro Mechanical Systems, 2003. MEMS-03 Kyoto. IEEE the Sixteenth Annual International Conference on, Jan. 2003, pp. 702-705. 6.
S.-S. Li, M. Demirci, Y.-W. Lin, Z. Ren, and C. T.-C. Nguyen, "Bridged micromechanical filters," in Frequency Control Symposium and Exposition, 2004. Proceedings of the 2004 IEEE International, Aug. 2004, pp. 280-286. 5.
T. Pensala, J. Meltaus, and M. Ylilammi, "An eigenmode superposition model for lateral acoustic coupling between thin film BAW resonators," in Ultrasonics Symposium, 2008. IUS 2008. IEEE, Nov. 2008, pp. 1540-1543. 6.
V. Kaajakari, J. Koskinen, and T. Mattila, "Phase noise in capacitively coupled micromechanical oscillators," Ultrasonics, Ferroelectrics and Frequency Control, IEEE Transactions on, vol. 52, No. 12, pp. 2322-2331, Dec. 2005.

(56) References Cited

OTHER PUBLICATIONS

Wang et al., "Acoustic Bragg reflectors for Q-enhancement of unreleased MEMS resonators," IEEE Frequency Control Symposium (FCS 2011), San Francisco, CA, May 1-5, 2011. pp. 15.1.1-15.1.4.

Wang et al., "Deep Trench Capacitor Drive of a 3.3 GHz Unreleased Si MEMS Resonator" IEEE International Electron Device Meeting (IEDM 2012), Dec. 10-12, 2012, San Francisco, CA.

Weinstein et al., "Dielectrically transduced single-ended to differential MEMS filter," in Solid-State Circuits Conference, 2006. ISSCC 2006. Digest of Technical Papers. IEEE International, Feb. 2006, pp. 1236-1243. 6.

Bryan Ingram, "FBAR: a MEMS success story." Avago Technologies, Oct. 4, 2004, 14 pages (downloaded from http://www.avagotech.com/about/executi ves/20041004_MEMS_Forum_pdf).

Chandrahalim, H., PhD Thesis: "Voltage tunable radio frequency microelectromechanical resonators and filters." Cornell University, Aug. 2009. 206 pages.

\* cited by examiner

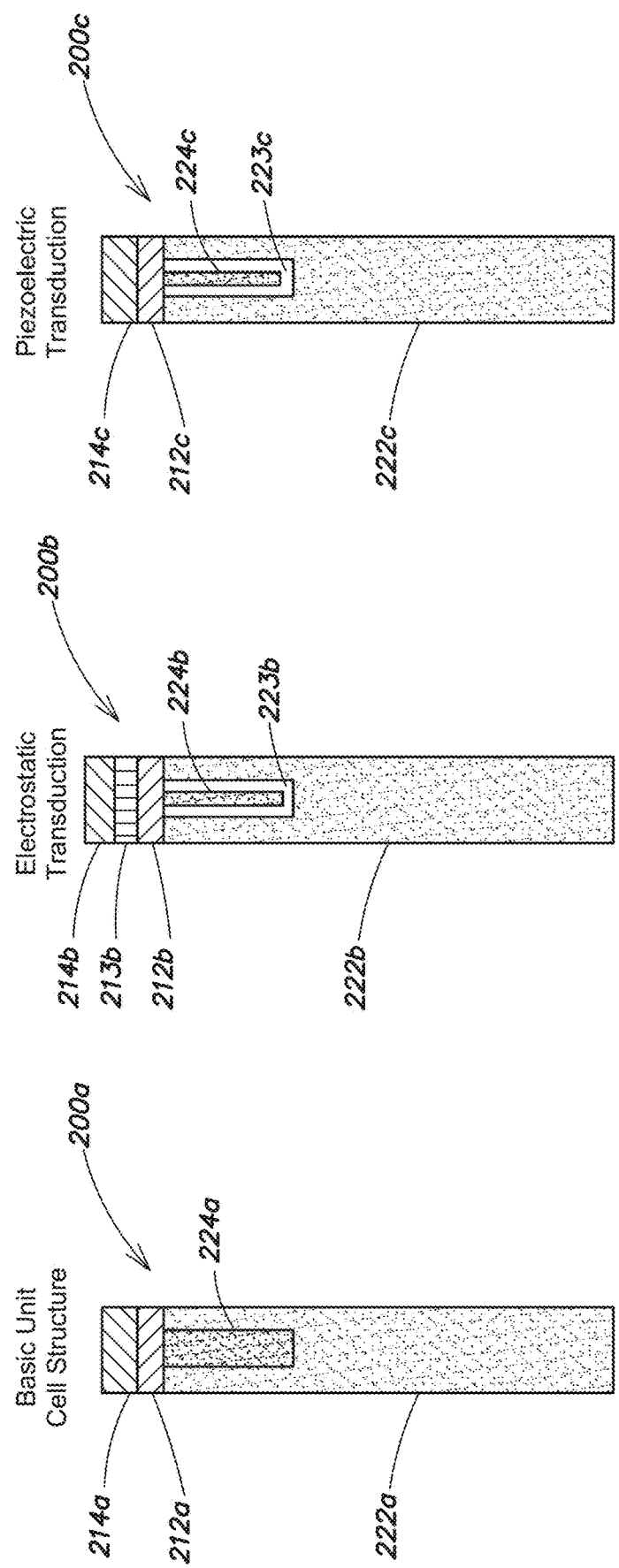

UNRELEASED COUPLED MEMS RESONATORS AND TRANSMISSION FILTERS

CROSS-REFERENCE TO RELATED PATENT APPLICATION

This application is a bypass continuation of International Application No. PCT/US2015/035116, filed on Jun. 10, 2015, and entitled "Unreleased Coupled MEMS Resonators and Transmission Filters," which claims priority, under 35 U.S.C. § 119(e), from U.S. Application No. 62/009,990, filed Jun. 10, 2014, and entitled "Unreleased Coupled MEMS Resonators and Transmission Filters," and from U.S. Application No. 62/011,107, filed Jun. 12, 2014 and also entitled "Unreleased Coupled MEMS Resonators and Transmission Filters." Each of these applications is hereby incorporated herein by reference in its entirety.

GOVERNMENT SUPPORT

This invention was made with government support under Grant No. ECCS1150493 awarded by the National Science Foundation. The government has certain rights in the invention.

BACKGROUND

The demand for high performance and reduced size wireless communication devices has pushed research interests towards the design and development of low power, small footprint, and single chip Complementary Metal-Oxide Semiconductor (CMOS) integrated wireless-transceiver solutions. The potential of Micro Electro Mechanical Systems (MEMS) technology to meet some of these requirements has led to the recent development and adoption of miniaturized, silicon micro-machined mechanical resonators for operation as timing references. These silicon MEMS resonators provide high mechanical quality factors (Q), low static power dissipation, and CMOS manufacturing compatibility, making them attractive alternatives to quartz based timing references. Here the quality factor Q can be defined as $2\pi$ times the stored energy divided by the energy dissipated per cycle; equivalently, Q can also be defined as the angular frequency ($\omega$) times the stored energy divided by power loss, or as the resonance peak frequency divided by half power bandwidth ($\omega/\Delta\omega$). In order to achieve low power and frequency stable electronic clocks, the MEMS resonators should exhibit reduced motional resistance ($R_x$) parameters and increased Q. The motional resistance $R_x$ can be defined as the series resistance in the Butterworth-Van Dyke (BVD) model, specifically where the $R_x$ is equal to the driving voltage divided by the sensing current at resonance frequency.

Wireless communication devices also rely on high performance band-pass transmission filters, which are used to reject any unwanted incoming RF signals. In some wireless communication applications (e.g., GSM telephony, 3G, LTE, WiFi, etc.), band-pass transmission filters let through only a very narrow strip of the incoming frequency spectrum. To achieve this frequency selectivity, electronics manufacturers, phone manufacturers, and wireless communication developers use Thin-Film Bulk Acoustic Wave Resonators (FBARs) and/or Surface Acoustic Wave (SAW) resonators. Such FBAR/SAW devices are micro-electro-mechanical (MEM) acoustic cavities that can achieve large Q and very low $R_x$ values. The simplest configuration of an FBAR resonator is a thin film of piezoelectric material sandwiched between two metal electrodes. These devices are then connected in a network of resonators (either in half-ladder, full-ladder, lattice or stacked topologies) to produce the desired narrow-band transmission filters. FBAR/SAW resonators, however, can currently not be monolithically integrated with other CMOS devices. They are surface-mounted to the printed-circuit-boards (PCBs) of the wireless communication devices and are manufactured separately from the integrated circuits. This separate manufacturing route increases the cost, time, and complexity of fabrication.

SUMMARY

The inventors have recognized there is a strong urge for monolithic integration of MEMS devices with complementary integrated circuits towards a lower cost, high performance, and lower power consumption of wireless communication devices. The recent development of MEMS has made possible for direct implementation with electronic circuits. However, the majority of these MEMS resonators still require a release-step to create freely suspended moving structures. This release step adds processing complexity to the manufacturing of monolithically integrated MEMS with CMOS. Furthermore, to achieve high mechanical Q and lower $R_x$ to confine the mechanical vibration within the resonators, these require a good vacuum environment to minimize the damping due to air and other viscous dissipations.

Embodiments of the present invention include unreleased coupled multi-cavity resonators and transmission filters, and the methods of fabricating such devices. These devices utilize multiple acoustic resonant cavities that are acoustically coupled together using acoustic Bragg grating couplers (ABGCs) and acoustic gradient index sections (GRINs), altogether bounded by acoustic Bragg reflectors (ABRs) to achieve high quality factor Q and low motional resistance $R_x$. Tuning the periodicity and the pitch size of the Bragg gratings within these components and structures, along with finding the best acoustic material combinations are crucial to attaining high-performing resonators and transmission filters with the desired Q and $R_x$. Unlike traditional surface acoustic wave (SAW) and bulk acoustic wave (BAW) devices, the CMOS-compatible unreleased coupled multi-cavity resonators and transmission filters can operate at multiple frequencies, and can be fabricated on a single wafer/die/chip.

Embodiments described herein include an apparatus comprising a substrate, a plurality of resonant cavities defined by one solid material disposed in and/or on the substrate and the plurality of resonant cavities comprising a first resonant cavity and a second resonant cavity. It also includes a first acoustic coupler, disposed between the first resonant cavity and the second resonant cavity, to couple an acoustic wave between the first resonant cavity and the second resonant cavity. In this apparatus, the first resonant cavity is configured to resonate at a first frequency and the second resonant cavity is configured to resonate at a second frequency different than the first frequency.

The acoustic coupler may have an acoustic path length less than or equal to half a wavelength of the acoustic wave and comprises a solid material having an acoustic impedance lower than the acoustic impedance of the first resonant cavity. The first acoustic coupler can also comprise alternating layers of a first solid material having an acoustic impedance and a second solid material having a second acoustic impedance different than the first acoustic impedance, and the alternating layers alternate at a first period and the first resonant cavity has a first length equal to about half the first period. Additionally, the apparatus can have the alternating layers alternate at a first period, and the first resonant cavity has a first length greater than the first period.

The apparatus can comprise a second acoustic coupler disposed between the second resonant cavity and a third resonant cavity in the plurality of resonant cavities, and the second acoustic coupler can comprise layers of the first solid material and the second solid material alternating at a second period different than the first period. The apparatus can also comprise a reflector, in acoustic communication with the first resonant cavity, to reflect the acoustic wave at least partially toward the first resonant cavity. The apparatus can include a transducer in acoustic communication with the first resonant cavity to apply a driving signal to the first resonant cavity to generate the acoustic wave. A sensor can also be included in the apparatus for acoustic communication with at least one resonant cavity in the plurality of resonant cavities to sense the acoustic wave. Lastly, the apparatus can also include a top surface layer of solid material disposed on top of the resonant cavities.

The method of using the resonant device apparatus is also disclosed herein. The resonant device comprises a plurality of resonant cavities and one acoustic coupler defined by a plurality of solid materials disposed in or on a substrate. The method of operation is applying a driving signal to a first resonant cavity in the plurality of resonant cavities to generate an acoustic wave, and coupling the acoustic wave from the first resonant cavity to a second resonant cavity in the plurality of resonant cavities via one acoustic coupler. In addition, the apparatus can reflect at least a portion of the acoustic wave towards the plurality of resonant cavities with at least one reflector acoustically coupled to one cavity in the plurality of resonant cavities. Likewise, the apparatus can also sense at least a portion of the acoustic wave with at least one sensor acoustically coupled to at least one cavity in the plurality of resonant cavities.

In some embodiments, the apparatus can include a substrate, a plurality of resonant cavities defined by at least one solid material disposed in and/or on the substrate, at least one transducer, in acoustic communication with in the plurality of resonant cavities, to apply a driving signal to the at least one resonant cavity so as to generate an acoustic wave, a plurality of acoustic Bragg grating couplers (ABGCs), each ABGC in the plurality of ABGCs disposed between a respective pair of resonant cavities in the plurality of resonant cavities to couple the acoustic wave among the plurality of resonant cavities, and a sensor, in acoustic communication with the plurality of resonant cavities, to sense the acoustic wave.

In this apparatus, the plurality of resonant cavities can include a first resonant cavity comprising a first solid material having a first acoustic impedance and a second solid material having a second acoustic impedance greater than the first acoustic impedance. Similarly, the apparatus also includes the first solid material and the second solid material that are arrayed at a period greater than a period of at least one ABGC in the plurality of ABGCs. In addition, the plurality of resonant cavities in the apparatus may comprise at least one resonant cavity having a length equal to about half of a period of at least one ABGC in the plurality of ABGCs, in which a first ABGC can have a first grating period and a second ABGC can have a second grating period greater than the first grating period. Furthermore, the apparatus can also include a pair of acoustic Bragg grating reflectors, in acoustic communication with the plurality of resonant cavities, to at least partially confine the acoustic wave within the plurality of resonators.

Another embodiment comprises an apparatus including a substrate, at least one periodic array of first unit cells (e.g., an ABR) defined in or disposed on the substrate at a first period, and at least one periodic array of second unit cells (e.g., an ABGC) defined in or disposed on the substrate at a second period. The periodic array of first unit cells has a first period selected to at least partially reflect an acoustic wave having a wavelength $\lambda$. Each unit cell in the plurality of first unit cells comprises a first layer of solid material having a first acoustic impedance and a second layer of solid material having a second acoustic impedance. The periodic array of second unit cells has a second period selected to at least partially transmit the acoustic wave. Each unit cell in the at least one plurality of first unit cells comprises a third layer of solid material having a third acoustic impedance and a fourth layer of solid material having a fourth acoustic impedance. In some examples, the first period is about $\lambda/2$ and the second period is about $\lambda$. The apparatus may also comprise at least one cavity defined in or disposed on the substrate in acoustic communication with the periodic array of first unit cells and the periodic array of second unit cells.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 2A shows an exemplary acoustic Bragg grating unit cell used in unreleased structure with multiple coupled cavities.

FIG. 2B shows an exemplary acoustic Bragg grating unit cell that can be used as an electrostatic transducer or electrostatic sensor in an unreleased coupled multi-cavity resonator.

FIG. 2C shows an exemplary acoustic Bragg grating unit cell that can be used as a piezoelectric and/or piezoresistive transducer or sensor in an unreleased coupled multi-cavity resonator.

DETAILED DESCRIPTION

Figure 1:
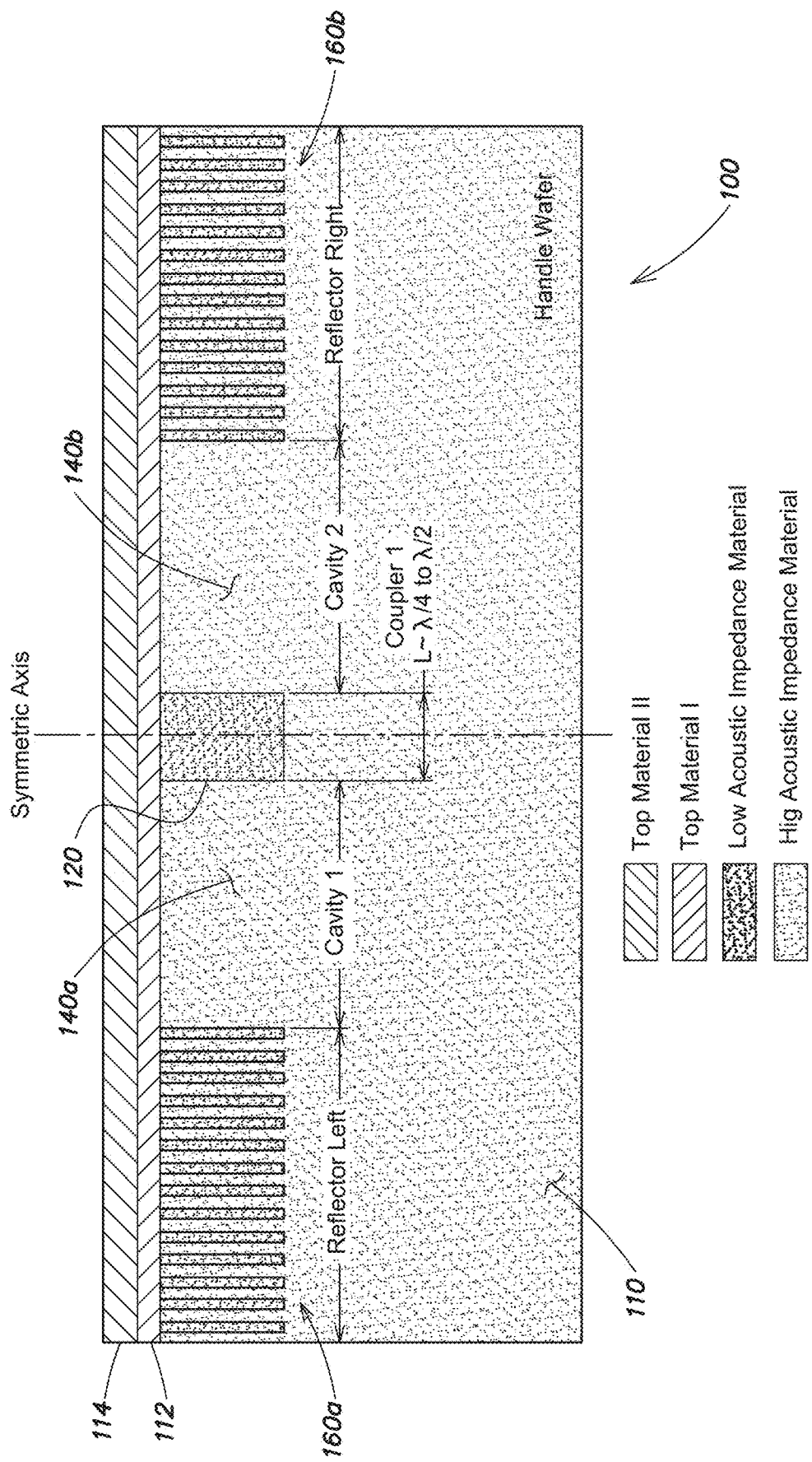
FIG. 1 is a schematic illustration of an unreleased coupled resonator with two cavities connected by an acoustic coupler.

CMOS-compatible unreleased, acoustically coupled multi-cavity resonators and transmission filters are described in detail. These multi-cavity resonators and filters can be designed to operate in the UHF/SHF frequency spectrum. Without the need for post-processing release steps or vacuum packaging, this technology enables fabrication of multiple acoustically coupled resonators and transmission filters with distinct operating frequencies (lithographically defined) on the same substrate (e.g., a die or wafer).

These coupled multi-cavity resonators can be used as timing references, much like the quartz based electronic clocks, but with a much smaller size, lower operating power, higher stable frequencies, and CMOS manufacturing compatibility. Similarly, coupled multi-cavity transmission filters can be used as RF transmission filters that can be monolithically integrated with other CMOS devices. Tuning the structural components and design parameters can provide highly-configurable resonators and transmission filters with a high Q and a low $R_x$, which make them attractive alternatives to quartz based timing references and traditional FBAR/SAW based filters, respectively.

In order to tune the devices' parameters, the basic operating concept of acoustically coupled resonant cavities is described herein. To couple two resonant cavities, one approach is to insert an appropriate coupling material between the cavities to act as a conduit for acoustic energy transfer between the cavities. This coupling material can be a homogeneous block of material or a heterogeneous material, such as an Acoustic Bragg Grating Coupler (ABGC) made of alternating layers of materials with high and low acoustic impedance. This technique is not unique to acoustic waves: An analogous example can be found in fiber optics couplers that use optical Bragg gratings for transferring energy between optical resonant cavities in the manipulation of electromagnetic waves. As in the field of optics, ABGC structures can be used to perform acoustic energy transfer between two adjacent cavities.

Similarities also extend to the periodic structure of the optical refractive index modulation technique employed in optical Bragg couplers. In the periodic structure of an ABGC, the structural arrangement for acoustic refractive index modulation can include alternating layers of materials with high and low acoustic impedance, much like the ensemble of materials with high and low optical refractive indices used in optical Bragg grating couplers.

And to further improve the performance of multi-cavity devices, an innovative approach is to reduce undesired scattering of acoustic waves at the interfaces between the ABGCs and resonant cavities. To implement this approach, gratings of different periods and/or with spatially varying periods (e.g., chirped gratings) can be utilized to provide a smoother transition in acoustic energy transfer (i.e., gradual modulation of acoustic waves) between the ABGCs and neighboring cavities that can help maintain a translational symmetry in acoustic resonance. (Gratings with spatially varying periods are also called Gradient Index (GRIN) Sections.) Incorporating ABGCs between resonant cavities along with the GRIN structures in coupled multi-cavity devices can enable the use of these devices as resonators and transmission filters. Furthermore, GRIN can also be used to provide a smoother transition of the structural parameters between the coupled cavities and the outer-most ABR reflectors (which can have extremely different pitch sizes and/or structures to provide the desired reflectivity).

In the resonator configuration, acoustically coupled resonant cavities enhance the device performance by increasing the Q and/or reducing the $R_x$ through customization of the acoustic modes generated and/or present inside the coupled multi-cavity resonators. Said another way, such Mode Localization is a phenomenon in which the vibration energy becomes spatially localized; and confining and optimizing these acoustic modes within the coupled resonators can increase the Q while lowering the $R_x$. Therefore, the availability of tools to "engineer" Mode Localization in coupled resonators is these devices' distinct and inherent advantage. As for comparison, the vibration energy in single-cavity resonators can only be spatially localized using ABRs, whereas significant enhancement in vibration confinement can be achieved via Mode Localization by the use of multiple ABGC-coupled-cavities and outer ABRs.

In addition, Mode Localization can be further induced through structural perturbations, for example, by designing the resonant cavities with slightly different lengths, and/or using asymmetric ABGC couplers and/or GRIN structures. Hence, there is a great potential to significantly improve the performance metrics in Q and $R_x$ in more than one way. The increase in the vibration amplitude (the generated output electrical signal) and/or the reduction in vibration energy leakage from the coupled-cavity system can now be constituted using fewer outer ABRs, as otherwise would be difficult to achieve in quality single-cavity resonators. Moreover, the use of devices with multi-cavity structures described herein can also improve the motional resistance $R_x$ values by enabling multiple-drive/multiple-sense configurations where the motional current generated by adjacent cavities can be summed together in phase to increase the total output signal from the devices.

Similarly, these coupled multi-cavity devices can be used as band-pass transmission filters, much like the electronic band-pass transmission filters based on FBAR and SAW devices. Differences between coupled-cavity devices and FBAR and SAW devices include operation of coupled-cavity devices at lower power and at higher tunable and stable frequencies. And unlike FBAR and SAW devices, coupled-cavity devices can be fabricated with CMOS manufacturing processes. Just as in the case of CMOS resonators, this technology also enables production of a filter bank having multiple filters operating at different center frequencies with different band-pass widths, etc., on the same die. This is not possible with SAW devices, which have only one operating frequency per manufactured wafer, because the thickness of the wafer defines the operating frequency. And therefore, just as the coupled multi-cavity resonators described above, tuning the structural components and design parameters of the ABGCs, resonant cavities, and GRIN structures in these devices can provide highly-configurable transmission filters with the desired mode-shapes of acoustic band-pass transmission profile, operable in the desired frequency range at high Q and low $R_x$ values.

There are at least two structurally distinct types of transmission filters: a Transmission Line (TL) configuration and a Multi-Pole (MP) topology. By adjusting the coupling strength between the cavities, the number of cavities, and cavity lengths, the central frequency, bandwidth of pass-band, pass-band ripple, and shape-factors can be specifically designed to attain some target filter properties. For example, a TL filter can be configured for use as a customized narrowband transmission filter operating at a desired center frequency with its tunable band-pass behavior determined by the number of Fabry-Perot repeating units included within the filter structure, whereas a MP filter can be configured so that a combined band-pass behavior can be generated by a collection of overlapping acoustic modes from individual operating frequencies of coupled-cavities in the MP configuration.

Unreleased Acoustically Coupled Resonators

FIG. 1 is a schematic illustration of an unreleased coupled resonator 100 that includes a substrate 110 and an acoustic coupler 120, which is sandwiched between two adjacent resonant cavities 140a and 140b (collectively, resonant cavities 140). The acoustic coupler 120 is configured to allow vibration energy at certain wavelengths to flow between the cavities 140 to enhance the acoustic properties of the unreleased coupled resonator 100. Optionally, one or more acoustic reflectors 160a and 160b (collectively, reflectors 160) can be used to further confine the acoustic waves within the cavity-coupler-cavity structure. Additionally, a plurality of top surface layers 112 and 114 can be used to protect the resonator 100, to function as an electrical interface, and/or to act as an acoustic confining layer for the unreleased coupled resonator 100.

The substrate 110 can include, but is not limited to wafers and/or dies comprising single-crystalline silicon, poly-crystalline silicon, amorphous silicon, silicon dioxide, silicon nitride, silicon oxynitride, silicon-on-insulator, silicon dioxide coated silicon, ion-implanted (doped-) silicon, sapphire crystal, silicon carbide, diamond, and generally low loss acoustic materials, such as lithium niobate as used in SAW, III-V semiconductor materials, such as gallium nitride (GaN), and any similar material made by any available semiconductor processing technique. The substrate 110 can also include non-semiconducting materials, such as metal, ceramic and/or insulating materials. In some embodiments, the substrate 110 can include a thin layer of material disposed on another substrate. The thickness of the substrate 110 can range from about 100 nm to 1 mm (e.g., 200 nm, 300 nm, 400 nm, 500 nm, 1 µm, 2 µm, 3 µm, 4 µm, 5 µm, 10 µm, 20 µm, 30 µm, 40 µm, 50 µm, 60 µm, 70 µm, 80 µm, 100 µm, 200 µm, 300 µm, 400 µm, 500 µm, 600 µm, 700 µm, 800 µm, or 900 µm).

Table 1 shows elastic properties of some of the exemplary materials used in the fabrication of the unreleased coupled multi-cavity devices:

TABLE 1

Properties of Materials Used in Unreleased Coupled Multi-Cavity Devices

| Parameters | Si | poly-Si | $SiO_2$ | $Si_3N_4$ | Cu | Al | W | AlN | $Al_2O_3$ |
|---|---|---|---|---|---|---|---|---|---|
| $\rho$ [kg/m$^3$] | 2329 | 2320 | 2200 | 3100 | 8960 | 2700 | 19350 | 3255 | 3880 |
| Modulus [Pa] | 1.70E+11 | 1.60E+11 | 7.00E+10 | 2.50E+11 | 1.20E+11 | 7.00E+10 | 4.11E+11 | 3.20E+11 | 3.17E+11 |
| Poisson Ratio | 0.28 | 0.22 | 0.17 | 0.23 | 0.34 | 0.35 | 0.28 | 0.281 | 0.23 |
| Acoustic Impedance [Pa*s/m] | 2.25E+7 | 2.06E+7 | 1.29E+7 | 3.00E+7 | 4.07E+7 | 1.74E+7 | 1.01E+8 | 3.65E+7 | 3.78E+7 |
| Acoustic wave speed [m/s] | 9660 | 8873 | 5848 | 9669 | 4540 | 6450 | 5210 | 11218 | 9732 |
| Wavelength at 1 GHz [m] | 9.66E−06 | 8.87E−06 | 5.85E−06 | 9.67E−06 | 4.54E−06 | 6.45E−06 | 5.21E−06 | 1.12E−05 | 9.73E−06 |
| Dielectric Constant | 11.68 | N/A | 3.9 | 7.5 | N/A | N/A | N/A | N/A | 9.8 |

The acoustic coupler 120 may comprise a solid material having an acoustic path length l equal to one quarter ($\lambda$/4) to one half ($\lambda$/2) of the acoustic wavelength $\lambda$. The acoustic coupling of the acoustic coupler 120 to the cavities 140 can be relatively weak at $\lambda$/4 and strong at $\lambda$/2. The acoustic coupler 120 can include one or more electrically conductive materials with low acoustic impedance, such as poly-crystalline silicon or aluminum. In some embodiments, the acoustic coupler 120 can comprise electrically conducting materials with high acoustic impedance, such as single-crystalline silicon, amorphous silicon, silicon dioxide, silicon nitride, silicon oxynitride, silicon-on-insulator, silicon dioxide coated silicon, ion-implanted (doped-) silicon, and any similar material made by any available semiconductor processing technique. An acoustic coupler 120 with an acoustic impedance that is more distinct than that of the substrate 110 may provide weaker coupling than an acoustic coupler 120 whose acoustic impedance is closer to that of the substrate 110.

In some configurations, the acoustic coupler 120 can include an Acoustic Bragg Grating Coupler (ABGC) structure, comprising a plurality of repeating alternating pairs of high (H) and low (L) acoustic impedance materials, as shown and described in greater detail below with respect to FIG. 3. In each ABGC pair, the low acoustic impedance slab can include electrically conductive materials, such as polycrystalline silicon and aluminum, and the high acoustic impedance slab can be also electrically conductive and can include materials, such as highly-doped ion-implanted silicon and silicon. The doping species used in these embodiments can include standard semiconductor dopants, depending on the substrate type. If the substrate is silicon, then the dopants can include, but not limited to Boron, Phosphorous, Antimony, etc. If the substrate is a different semiconductor, such as GaN, the dopant species can be different. In general, the substrate can be either n-doped or p-doped, so long as it is conductive. The doping concentrations can range, e.g., from $10^{15}$ cm$^{-3}$ to $10^{19}$ cm$^{-3}$. Moreover, selective regions of the substrate can be doped to form a thin top layer of about 1 µm where the electrical routing reaches.

Each resonant cavity 140 may comprise or be defined by one or more regions of material whose acoustic impedance is different than that of at least one material in the acoustic coupler 120. The region(s) may be defined lithographically in or on the substrate 110. For example, if the substrate 110 is a single-crystalline silicon wafer, then a lithographically defined region in the substrate 110 can be designated as a resonant cavity 140 by demarcating a set of boundaries. At each of the boundaries, a sharp acoustic interface can be formed by creating a mismatch in acoustic impedance between the cavity material and the boundary material. The other side of each of the boundary edges can be any material that is different from the single-crystalline silicon of the substrate 110. In this embodiment, the boundary material can include silicon oxide, silicon nitride, poly-crystalline silicon and doped (ion-implanted) single-crystalline silicon.

In another example, the resonant cavity 140 can be formed by turning the lithographically defined region of the substrate 110 into a different material, instead of using a foreign material on the outside of the cavity region, as described above, to create the acoustic impedance mismatch. Said another way, this example is the transpose of the structure described in the previous paragraph, and as such, the resonant cavity 140 in this embodiment can comprise materials, such as silicon oxide, silicon nitride, poly-crystalline silicon and doped single-crystalline silicon, and the boundary material will be part of the substrate 110 that is made of single-crystalline silicon.

As described above, the resonant cavities 140 may comprise a conducting material with high acoustic impedance, such as doped-silicon. In other embodiments, the resonant cavities 140 may comprise a material with low acoustic impedance, such as single-crystalline silicon. The substrate 110 can be high impedance material, and the filling material can be material with a lower impedance than the substrate 110. In some exemplary configurations, a plurality of resonant cavities 140 may be disposed between a pair of acoustic reflectors 160, shown in FIG. 1 as Acoustic Bragg Reflector (ABR) structures. There may also be configurations in which a resonant cavity 140 may be disposed next to an ABGC structure on one side and an ABR structure on the other, where as another resonant cavity 140 may be disposed between two adjacent ABGC structures.

Said another way, the boundary of the resonant cavity 140 can be an ABR 160, an ABGC 120, or a GRIN structure (described below with respect to FIG. 10). Both ends (edges) of the device 100 are terminated with an ABR; and the middle portion of the resonator 100 can include a combination of resonant cavities 140 and ABGCs 120. In the case where the device includes inter-digitated drive/sense transducers, the cavity can be defined as a specific region where the inter-digitation has a given pitch size (e.g., as in FIG.

12B). Different pitch sizes may represent different cavities (in some instances, cavities are defined as solid block sections of uniform material, whereas other cavities may comprise multiple layers of material).

As shown in FIG. 1, optional acoustic reflectors 160 can be disposed in the bounding regions in the unreleased coupled resonator 100. In some embodiments, the acoustic reflector 160 can be a set of ABR structures, consisting of a plurality of repeating alternating pairs of high and low impedance acoustic materials. In each ABR pair, both the low and high acoustic impedance slabs can be conductive with each having an acoustic path length of λ/4 (i.e., one-quarter of the acoustic wavelength) of the unreleased coupled resonator 100. The low impedance slab can include materials, such as poly-crystalline silicon and aluminum, and the high acoustic impedance slab can include materials, such as highly-doped ion-implanted silicon and silicon.

Optionally, the top surface layers 112 and 114 can be included in the unreleased coupled resonator 100. The layers 112 and 114 can comprise any functional material that can serve as a protective coating, an acoustic reflector, an electromechanical interface, and/or a piezoelectric and/or piezoresistive interface for signal transduction and/or sensing between external sources and the unreleased coupled resonator 100. For electrostatic transduction, the applied signal is typically a direct current (DC) bias plus an alternating current (AC) driving signal; while for piezoelectric transduction, the applied signal may be an AC signal. Both resonators and filters may use the same signal configurations.

The top layers may function as electrical interconnects—there are layers used for insulation other conductive layers. The same layers can be used to better confine acoustic energy within the cavities. Simulations show that the free surface tends to scatter acoustic waves. Therefore, instead of directly open the structure top to air, adding a few more layers reduces this wave-scattering effect and increases the quality factor Q. Moreover, these structures could also be fully buried in the bulk such that all of the CMOS circuitry (e.g., n-p wells, transistors, metal interconnects) is situated above.

In operation as an electronic clock, a timing reference or frequency reference, the unreleased coupled resonator 100 can be electrically connected to an outside signal source to generate signals at the resonator's operating (resonant) frequency. For example, such an electrical connection can be established through the top surface layer 112 for the input of the signal and another connection can be formed through the other top surface layer 114 to facilitate the output of the signal, all operating at the resonant frequency. In doing so, the resonator 100 can maintain the desired frequency and timing reference.

When an electrical signal is received at the first cavity 140a, an elastic strain proportional to the incoming voltage is generated within the first cavity 140a. If the signal includes any spectral components at or near the resonant frequency of the first cavity 140a, the resulting time-dependent strain of the material in the first cavity 140a turns into acoustic vibrations at the first cavity's resonant frequency. The acoustic coupler 120 transmits acoustic vibrations at or near the first cavity's resonant frequency to the second cavity 140b and attenuates or reflects acoustic vibrations at other frequencies. If the second cavity's resonant frequency matches the first cavity's resonant frequency, then the acoustic vibrations will resonate in the second cavity 140b as well. In other cases, the cavities may have different resonance frequencies due to slight perturbations in their structural parameters (e.g., as in FIG. 8D). For example, the acoustic coupler 120 may transmit acoustic waves at different frequencies, e.g., if the first cavity's resonant frequency differs from the second cavity's resonant frequency or if either or both cavities 140 resonate at more than one frequency. These differences in resonance frequency can be selected to promote mode localization.

The ABRs 160 reflect acoustic vibrations at the cavities' resonant frequency, thereby confining the resonant acoustic vibrations to the first cavity 140a, the acoustic coupler 120, and the second cavity 140b. The ABRs' reflectivities, which depend in part on the number of periods per ABR 160, determine how well the acoustic wave is confined within the cavities 140; the substrate also helps to confine the acoustic wave within the cavities 140. Depending on the configuration, the first ABR 160a and the second ABR 160b may have the same reflectivity or different reflectivities.

The transmission via the acoustic coupler 120 and the reflection from the ABRs 140 results from the interference of acoustic waves caused by reflections/transmissions at interfaces between materials with different acoustic impedances. Equating the total displacement and total stress at such an interface yields reflection and transmission coefficients in terms of the acoustic impedance values $Z_1$ and $Z_2$:

$$T_{1\to 2} = \frac{a_2}{a_1} = \frac{2Z_1}{Z_1+Z_2} \quad R_{12} = \frac{b_1}{a_1} = \frac{Z_1-Z_2}{Z_1+Z_2} \quad (1)$$

From Eq. (1), the reflection and transmission parameters are adjusted by employing different CMOS ready/compatible material pairs (e.g. Si/SiO2, Si/poly-Si, etc.). They can be adjusted by changing the ratio of acoustic impedances of the materials at the interface.

Unit Cell Structures

FIG. 2A shows an exemplary unit cell 200a of the unreleased coupled resonator 100 shown in FIG. 1. In this embodiment, the unit cell 200a may comprise a high acoustic impedance material 222a, a low acoustic impedance material 224a, and two optional top surface layers 212a and 214a. Examples of materials used as high acoustic impedance material 222a are single-crystalline silicon, amorphous silicon, silicon dioxide, silicon nitride, silicon oxynitride, silicon-on-insulator, silicon dioxide coated silicon, ion-implanted silicon, and any similar material made by any available semiconductor processing technique. Examples of materials used as low acoustic impedance material 222a are poly-crystalline silicon or aluminum. The top surface layers 212a and 214a may comprise any functional material that can serve as, for example a protective coating, an acoustic reflector, an electromechanical interface, and/or a piezoelectric and/or piezoresistive interface for signal transduction and/or sensing between external sources and the unreleased coupled resonator 100.

FIG. 2A shows the unit cell 200a as a symmetric three-layer stack. But those of skill in the art will readily recognize that the unit cell 200a can also be defined or depicted as an asymmetric two-layer stack. Other unit cells with are also possible, including unit cells with three, four, or more different layers of material.

Depending on the design and function of the unit cell 200a, a plurality of repeating units 200a can be included as acoustic Bragg gratings in the construction of acoustic structures, such as ABGCs, GRINs, and ABRs in the unreleased coupled resonator 100. An ABR is reflective at a particular band of frequencies and an ABGC transmits acoustic waves a particular band of frequencies. Forming an ABGC or ABR is to select the layer impedances and layer lengths, or periodicity, of the unit cell to provide the desired transmission or reflection properties. Apart from changing layer lengths, another factor that affects ABGC transmissivity and ABR reflectivity is the number of layers. For example, a 3-layers ABR is much less reflective than a 50-layer ABR, all other factors being equal.

In an exemplary configuration, acoustic Bragg gratings can be constructed by periodically stacking alternating layers (or slabs) of a material with high acoustic impedance $222a$ and a material with low acoustic impedance $224a$. In other embodiments, a period of a Bragg grating can include more than two layers per period. The thickness of each of the slabs $222a$ and $224a$ can be one quarter ($\lambda/4$) to one half ($\lambda/2$) of the acoustic wavelength $\lambda$, depending on the function of the gratings. For example, the combined thickness of the layers, i.e., the period of the unit cell $200a$, may be about $\lambda/2$ in ABRs and about $\lambda$ in ABGCs. In physical dimensions, the thickness of the slabs $222a$ and $224a$ can range from about 100 nm to about 100 µm (e.g., 200 nm, 300 nm, 400 nm, 500 nm, 600 nm, 700 nm, 800 nm, 900 nm, 1 µm, 5 µm, 10 µm, 15 µm, 20 µm, 30 µm, 40 µm, 50 µm, 60 µm, 70 µm, 80 µm, 90 µm). The acoustic property of the gratings depends on the physical dimensions of the slabs $222a$ and $222b$, including relative thickness and relative placement of the individual slabs $222a$ and $224a$. In addition, the acoustic property of the gratings can be tuned by adjusting N, the number of participating pairs $222a$ and $224a$.

In some embodiments, a unit cell $200a$ can include a pair of slabs $222a$ and $224a$. In another embodiment, a unit cell $200a$ can include a stack of three slabs $222a$, $224a$ and $222a$. Optionally, the top surface layers $212a$ and $214a$ can further improve the performance of the unit cell $200a$ by confining the acoustic waves within the unreleased features of the resonator 100. The top surface layers $212a$ and $214a$ can also be used as or to provide contact points for signal input/transduction and/or signal output/sensing.

The criteria to satisfy transmission and reflection of acoustic waves using Bragg gratings are well-known. For an ABR pair to reflect acoustic waves, the periodicity of the ABR pair may be chosen to cause destructive interference of a standing wave at the desired reflection wavelength. For example, the periodicity may be about half of the acoustic wavelength ($\lambda/2$). If the ABR pair includes two layers of high and low acoustic impedance materials, the period is the sum of the acoustic thicknesses of the two layers of material. For example, if the high-impedance (H) layer has an acoustic path length of about $\lambda/3$, the low-impedance layer (L) may have an acoustic path length of about $\lambda/6$ to reach $\lambda/2$ as the total thickness of the ABR pair. If the (H) layer is $\lambda/4$, the (L) layer may be $\lambda/4$; if the (H) layer is $\lambda/8$, the (L) layer may be $3\lambda/8$, and so on.

For an ABGC to transmit acoustic waves efficiently, the periodicity of the ABGC should be selected to produce constructive interference of a standing wave at the desired transmission wavelength. In other words, the ABGC period may be about one acoustic wavelength ($\lambda$). If the ABGC includes two layers of high and low acoustic impedance materials, the period is the sum of the acoustic thicknesses of the layers. For example, if the (H) layer is $\lambda/2$, the (L) layer may be about $\lambda/2$ to reach $\lambda$ as the period of the ABGC. If the (H) layer is $\lambda/3$, the (L) layer may be about $2\lambda/3$; if the (H) layer is $\lambda/4$, the (L) layer may be about $3\lambda/4$; if the (H) layer is $\lambda/5$, the (L) layer may be about $4\lambda/5$; if the (H) layer is $2\lambda/5$, the (L) layer may be about $3\lambda/5$; and so on and so forth.

FIG. 2B shows an exemplary unit cell $200b$ used for electrostatic transduction and/or sensing in unreleased coupled resonators 100. In this embodiment, the unit cell $200b$ may comprise a high acoustic impedance material $222b$, a dielectric material $223b$, a low acoustic impedance material $224b$ and three optional top surface layers $212b$, $213b$ and $214b$. In other embodiments, a period of a Bragg grating in the unit cell $200b$ can include any number of layers per period. The unit cell $200b$ can be constructed by creating a trench in the high acoustic impedance material $222b$, disposing a layer of dielectric material $223b$ inside the trench to cover the surface of the high acoustic impedance material $222b$, and filling the rest of the trench with the low acoustic impedance material $224b$. Depending on the design and function of the unit cell $200b$, the combined thickness of the layers, i.e., the period, may be about $\lambda/2$ for the unit cells $200b$ to be used as ABRs and about $\lambda$ for unit cells to be used as ABGCs. In some embodiments, the unit cell $200b$ is electrically connected to the top surface layers $212b$ and $214b$, a plurality of repeating units $200b$ can be included as components of transducers and/or components of sensors in unreleased coupled resonators 100.

In an unreleased coupled resonator 100, an electrostatic Transducer can include one or more of unit cells $200b$. The electrostatic transducer can be included inside a resonant cavity to transduce an electrical signal to a mechanical motion (vibration) within the resonant cavity. In a "simple" electrostatic transducer, only one unit cell $200b$ may be included as the transducing element. For an electrostatic transducer with multiple transducing unit cells $200b$, the spacing and the placement of each of the unit cells $200b$ may be designed to tune the performance of the transducer. Thus, having multiple transducing unit cells $200b$ can provide greater flexibility in the design configuration of unreleased coupled resonators 100 compared to the simple transducer with a single transduction unit cell $200b$.

In an unreleased coupled resonator 100, an electrostatic Sensor can include one or more unit cells $200b$. The sensor can be included inside a resonant cavity to transduce acoustic (mechanical motion) vibrations into an electrical signal within the resonant cavity. In a "simple" electrostatic sensor, only one unit cell $200b$ may be included as the sensing element. In an electrostatic sensor with multiple sensing unit cells $200b$, the spacing and the placement of each of the unit cells $200b$ may be designed to tune the performance of the sensor. Thus, having multiple sensing unit cells $200b$ can provide greater flexibility in the design configuration of unreleased coupled resonators 100 compared to the simple sensor with a single sensing unit cell $200b$.

Within an electrostatic transducing/sensing unit cell $200b$, the acoustic path length of each of the slabs $222b$ and $224b$ can be one quarter ($\lambda/4$) to one half ($\lambda/2$) of the acoustic wavelength $\lambda$, depending on the function (e.g., transduction or sensing) of the unit cell $200b$. In physical dimensions, acoustic path length of the slabs $222b$ and $224b$ can range from about 100 nm to about 100 µm (e.g., 200 nm, 300 nm, 400 nm, 500 nm, 600 nm, 700 nm, 800 nm, 900 nm, 1 µm, 5 µm, 10 µm, 15 µm, 20 µm, 30 µm, 40 µm, 50 µm, 60 µm, 70 µm, 80 µm, 90 µm). Sandwiched between $222b$ and $224b$, the dielectric slab $223b$ can be much thinner than the thickness of $222b$ and $224b$. In some embodiments, the thickness of the dielectric material $223b$ can range from about 1 nm to about 100 µm (e.g., 5 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 200 nm, 300 nm, 400 nm, 500 nm, 600 nm, 700 nm, 800 nm, 900 nm, 1 μm, 5 μm, 10 μm, 15 μm, 20 μm, 30 μm, 40 μm, 50 μm, 60 μm, 70 μm, 80 μm, 90 μm).

Depending on the transducer/sensor configuration, the top surface layers 212b, 213b and 214b can be employed to receive the electrical signal, send the output electrical signal, and improve the electrostatic-mechanical coupling during transduction. Two of the top surface layers 212b and 214b can comprise any functional material that can serve as, for example a protective coating, an acoustic reflector, and/or an electromechanical interface for signal transduction and/or sensing between external sources and the unreleased coupled resonator 100. The additional top surface layer 213b in this unit cell, for example, can be a portion of a conducting metal line that interconnects the unreleased coupled resonator 100 to other components of an Integrated Circuit (IC) that reside on the same substrate 110.

FIG. 2C shows an exemplary unit cell 200c used for piezoelectric/piezoresistive transduction and/or sensing in unreleased coupled resonators 100. In this embodiment, the unit cell 200c may comprise a high acoustic impedance material 222c, a piezoelectric/piezoresistive material 223c, a low acoustic impedance material 224c and three optional top surface layers 212c, 213c and 214c. In other embodiments, a period of a Bragg grating in the unit cell 200c can include any number of layers per period. The unit cell 200c can be constructed by creating a trench in the high acoustic impedance material 222c, disposing a layer of piezoelectric/piezoresistive material 223c inside the trench to cover the surface of the high acoustic impedance material 222c, and filling the rest of the trench with the low acoustic impedance material 224c. Depending on the design and function of the unit cell 200c, the combined thickness of the layers, i.e., the period, may be about λ/2 for unit cells 200c to be used as ABRs and about λ for unit cells 200c to be used as ABGCs. In some embodiments, the unit cell 200c is electrically connected to the top surface layers 212c and 214c, a plurality of repeating units 200c can be included as components of transducers and/or components of sensors in unreleased coupled resonators 100.

In an unreleased coupled resonator 100, a piezoelectric transducer can include one or more of a plurality of unit cells 200c. The piezoelectric transducer can be included inside a resonant cavity to piezoelectrically transduce an electrical signal to a mechanical motion (vibration) within the resonant cavity. In a "simple" piezoelectric transducer, only one unit cell 200c may be included as the transducing element. In a piezoelectric transducer with multiple transducing unit cells 200c, the spacing and the placement of each of the unit cells 200c may be designed to tune the performance of the transducer. Thus, having multiple transducing unit cells 200c can provide greater flexibility in the design configuration of unreleased coupled resonators 100 compared to the simple transducer with a single transduction unit cell 200c.

In an unreleased coupled resonator 100, a piezoelectric/piezoresistive sensor can include one or more of a plurality of unit cells 200c. The piezoelectric/piezoresistive sensor can be included inside a resonant cavity to transduce acoustic (mechanical motion) vibrations into an electrical signal via the piezoelectric/piezoresistive effect. In a "simple" piezoelectric/piezoresistive sensor, only one unit cell 200c may be included as the sensing element. In a piezoelectric/piezoresistive sensor with multiple sensing unit cells 200c, the spacing and the placement of each of the unit cells 200c may be designed to tune the performance of the sensor. Thus, having multiple sensing unit cells 200c can provide greater flexibility in the design configuration of unreleased coupled resonators 100 compared to the simple sensor with a single sensing unit cell 200c.

Within a piezoelectric/piezoresistive transducing/sensing unit cell 200c, the thickness of each of the slabs 222c and 224c can be one quarter (λ/4) to one half (λ/2) of the acoustic wavelength λ, depending on the function (e.g., transduction or sensing) of the unit cell 200c. In physical dimensions, the thickness of the slabs 222c and 224c can range from about 100 nm to about 100 μm (e.g., 200 nm, 300 nm, 400 nm, 500 nm, 600 nm, 700 nm, 800 nm, 900 nm, 1 μm, 5 μm, 10 μm, 15 μm, 20 μm, 30 μm, 40 μm, 50 μm, 60 μm, 70 μm, 80 μm, 90 μm). Sandwiched between 222c and 224c, the piezoelectric/piezoresistive slab 223c can be as thin or as thick as the thickness of 222c and 224c. In some embodiments, the thickness of the dielectric material 223c can range from about 1 nm to about 100 μm (e.g., 5 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 200 nm, 300 nm, 400 nm, 500 nm, 600 nm, 700 nm, 800 nm, 900 nm, 1 μm, 5 μm, 10 μm, 15 μm, 20 μm, 30 μm, 40 μm, 50 μm, 60 μm, 70 μm, 80 μm, 90 μm).

Depending on the transducer/sensor configuration, the top surface layers 212c, 213c and 214c can be employed to drive, sense and improve the piezoelectrical-mechanical and/or piezoresistivity-mechanical coupling during transduction. Two of the top surface layers 212c and 214c can comprise any functional material that can serve as, for example a protective coating, an acoustic reflector, an electromechanical interface, and/or a piezoelectric/piezoresistive interface for signal transduction and/or sensing between external sources and the unreleased coupled resonator 100. The additional top surface layer 213c in this unit cell, for example, can be a portion of a conducting metal line that interconnects the buried unreleased coupled resonator 100 to other components of an Integrated Circuit (IC) that reside on the same substrate 110.

Figure 2D:
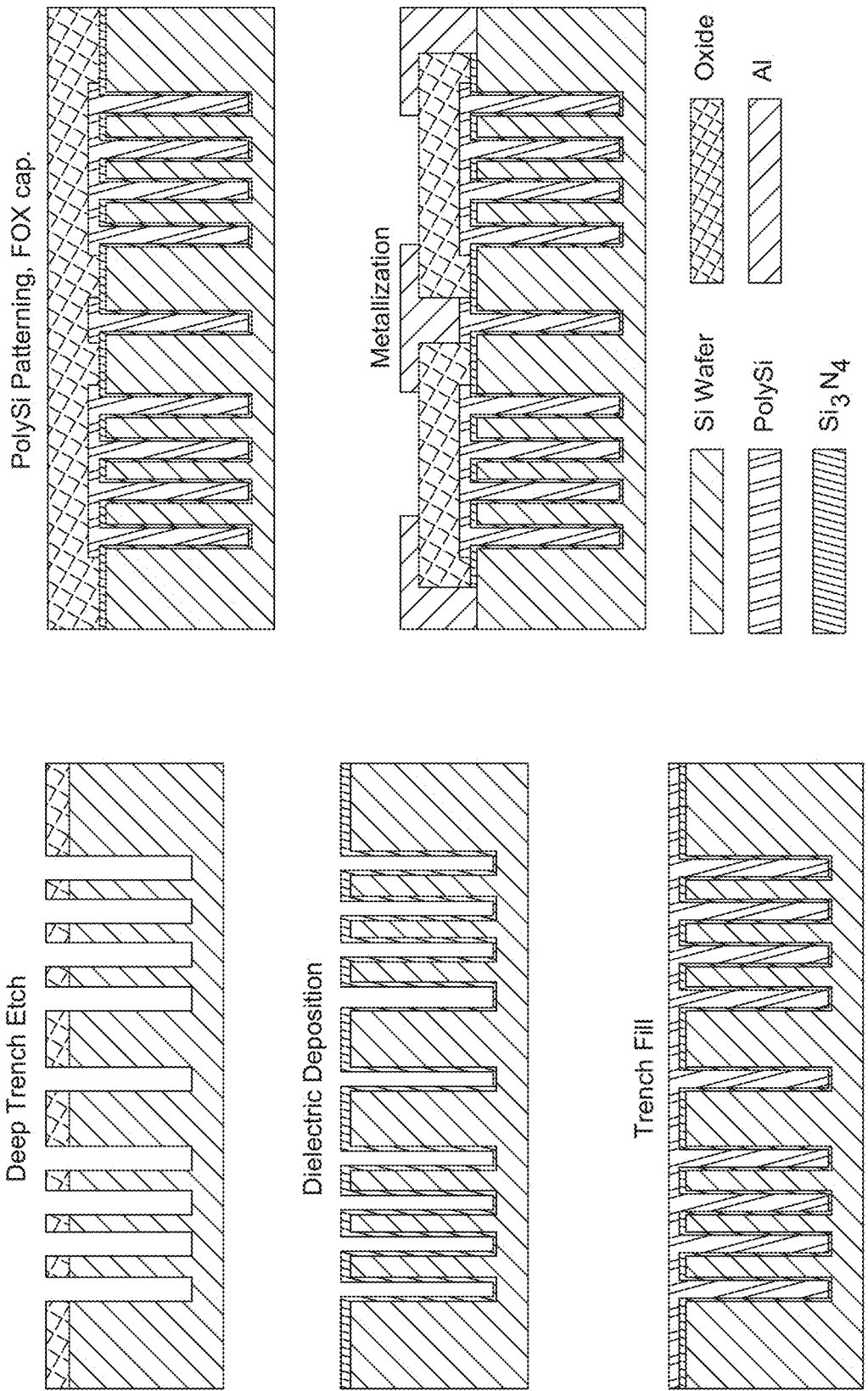
FIG. 2D shows an exemplary fabrication process flow for creating a unreleased coupled resonator device with unit cells like those shown in FIGS. 2A-2C.

FIG. 2D shows an exemplary fabrication process flow for creating acoustic Bragg grating unit cells 200b in an unreleased coupled resonator. In this exemplary process flow, a set of high-aspect ratio trenches are etched away in a substrate, as shown in step (a). A dielectric material is conformally deposited in the trenches, as shown in step (b), followed by a filling step (c) where, for example, polycrystalline silicon is deposited to fill in the trenches. Step (b) can also be carried out by depositing piezoelectric materials to create piezoelectric transducer unit cells 200c, as described in FIG. 2C. Similarly, the step (c) can also be implemented to include more than one type of material by depositing more than one type of fill-in material. Step (d) can include process steps that can be used to pattern the fill-in materials and/or to deposit passivation layers, including with a top surface layer of silicon dioxide. Step (e) is a metallization step in this exemplary process flow in which different devices within the same die are interconnected via the deposited and patterned metal layer. These process steps are exemplary in nature, and any CMOS compatibility processing can be included in the fabrication.

Unreleased Coupled Resonators with an Acoustic Bragg Grating Coupler (ABGC)

Figure 3:
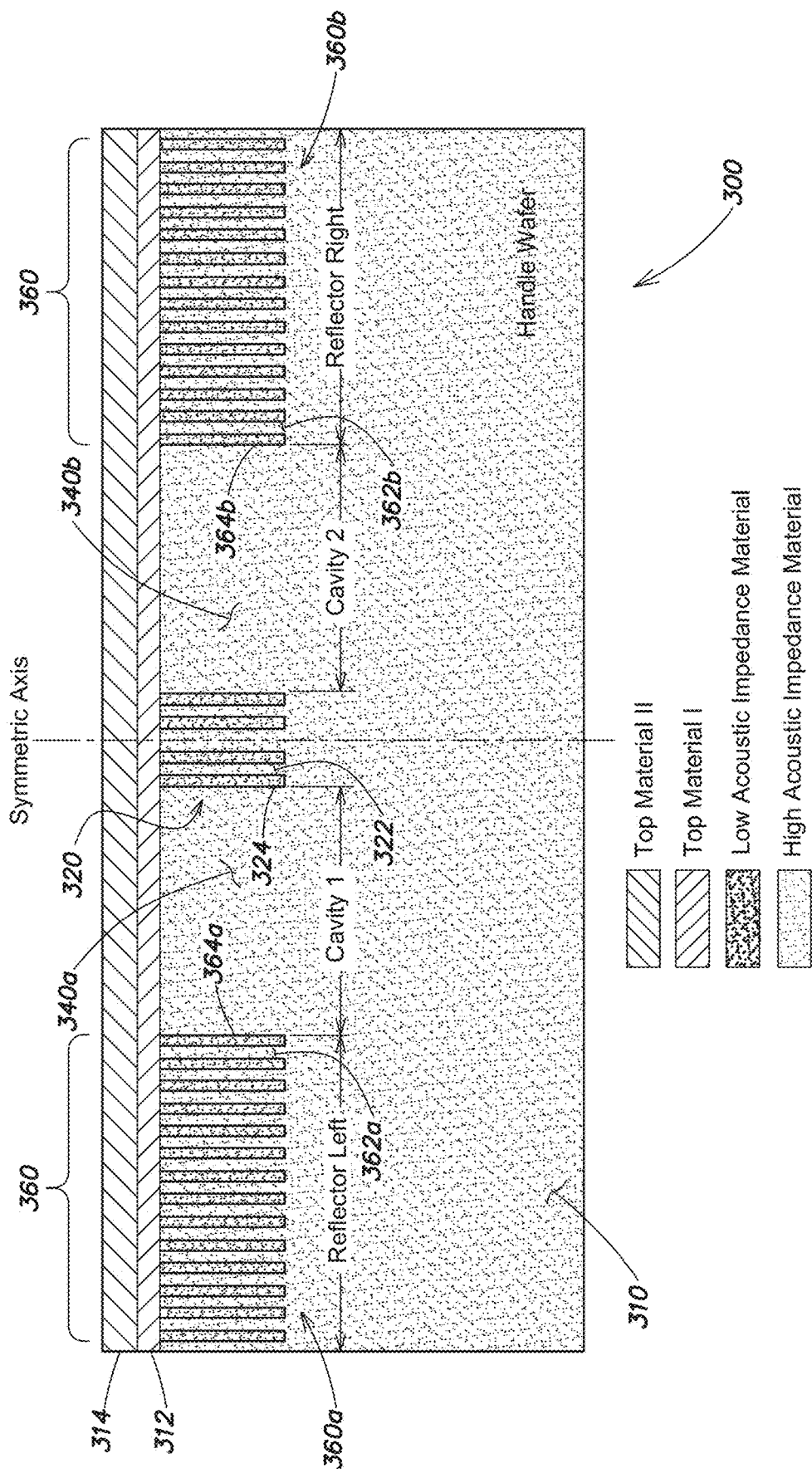
FIG. 3 is a schematic illustration of an unreleased coupled multi-cavity resonator using acoustic Bragg grating couplers (ABGCs) as acoustic couplers and acoustic Bragg reflectors (ABRs) as acoustic reflectors.

FIG. 3 is a schematic illustration of an unreleased multicavity coupled resonator 300 with an ABGC. In this embodiment, the resonator 300 may comprise an acoustic Bragg grating coupler (ABGC) 320, a pair of resonant cavities 340a and 340b (collectively, resonant cavities 340), a pair of acoustic Bragg reflectors 360a and 360b (collectively, ABRs 360) and two optional top surface layers 312 and 314 disposed on a substrate 310.

Depending on the design, type and function of the resonator 300, each of the ABGC 320, resonant cavities 340 and ABRs 360 may comprise one or more repeating unit cells 200a, 200b and 200c. The unit cells used in ABRs 360 and ABGCs 320 can include different materials and different periodicities to accentuate different acoustic properties. For example, the unit cells used in ABRs 360 are designed for acoustic reflection, whereas the ABGCs 320 are designed for acoustic coupling. In some embodiments, the ABGC 320 can contain four repeating units of unit cell 200a that may comprise a pair of alternating slabs of a high acoustic impedance material 322 and a low acoustic impedance material 324. In this configuration, the coupling efficiency can depend on the periodicity, the number N of repeating units cell 200a and the acoustic characteristics of the slabs, i.e., individual thickness of each of the slabs 322 and 324, and the relative thickness ratio of 322 to 324. Tuning the relative and absolute thicknesses of the slabs 322 and 324 can be implemented by lithographically defining the physical dimensions; and the resulting device configuration with specific structural arrangements ensures that the acoustic components perform as designed. Said another way, the acoustic thicknesses of each of the slabs 322 and 324 is selected such that the period of the ABGC 320 is about equal to the acoustic wavelength λ. (In other cases, the ABGC 320 may comprises a few (e.g., less than 5) layer stacks with a period of less than the acoustic wavelength (e.g., a period of about 212). The material types of each of the slabs 322 and 324 are substantially similar to those of 222a and 224a, respectively, as described above in FIG. 2A.

Sandwiching the ABGC 320 in the resonator 300 are two resonant cavities 340a and 340b. Collectively, the resonant cavities 340 can include homogenous material regions that are lithographically defined regions of the substrate 310. In this case, the material of the resonant cavities 340 is the same material of the substrate 310 and both can be similar to the materials of 110, as described in FIG. 1. It is also possible to configure the resonant cavities 340 to be a different material than that of the substrate 310. In this case, the materials for the resonant cavities 340 can include, but are not limited to silicon, silicon dioxide, silicon nitride, poly-crystalline silicon, and doped silicon, etc., as long as the material is different from that of the substrate 310.

Also included in the unreleased multi-cavity coupled resonator 300 are the binding regions on the outer edges of the resonator 300 that make up the ABRs 360. As illustrated in FIG. 3, each of the ABRs 360 contains fourteen repeating units of unit cell 200a that may comprise a pair of alternating slabs of a high acoustic impedance material 362 and a low acoustic impedance material 364. In this configuration, the acoustic reflectivity of the ABRs 360 can depend on the periodicity, the number N of repeating units cell 200a and the acoustic characteristics of the slabs, i.e. individual thickness of each of the slabs 362 and 364, and the relative thickness ratio of 362 to 364. Tuning the relative and absolute thicknesses of the slabs 362 and 364 can be implemented by lithographically defining the physical dimensions; and the resulting device configuration with specific structural arrangements will ensure that the acoustic components can perform as designed. Said another way, the thicknesses of each of the slabs 362 and 364 is configured to fall somewhere between λ/4 to λ/2 of the acoustic wavelength λ and the physical dimensions and material types of each of the slabs 362 and 364 are substantially similar to those of 222a and 224a, respectively, as described in FIG. 2A.

However, the structural arrangements of the left ABR 360a and right ABR 360b are not exactly the same as they are not superimposable. In this embodiment, the left ABR 360a and the right ABR 360b function as the right and left facing mirrors, respectively, to contain the acoustic waves generated and/or transmitted within the resonator 300. For example, to reduce or minimize leakage of acoustic waves/ energy from the resonator 300 and to increase or maximize reflectivity at the boundaries, the structural components of the ABR 360a are arranged in a configuration to best reflect the incoming (left going) waves back towards the center with reflected (right going) waves. The reverse is true for the ABR 360b, in that it is configured to reflect the incoming acoustic (right going) waves back to the center with reflected (left going) waves. Said another way, the ABR 360a and ABR 360b are mirror-images of each other with their reflection symmetry axis at the center of the resonator 300, and hence, the arrangement of structural components of each ABR are mirrored with respect to the center. For example, the left-most slab 362a of the ABR 360a is not the same as the left-most slab 364b of the ABR 360b. The inner-most slab 364a of the ABR 360a, however, is the same as the inner-most layer 364b of the ABR 360b. Likewise, the outer-most slab 362a of the ABR 360a is the same as the outer-most layer 362b of the ABR 360b.

Also included in this embodiment are two optional top surface layers 312 and 314 that can perform functions similar to those of top surface layers 112 and 114 as described in FIG. 1. For example, the layer 314 can be polycrystalline silicon, which acts as a conductive layer for electrical routing. In this embodiment, the layer 312 is silicon dioxide that can be used as the insulating layer to isolate the conductive layer 314 from the buried components, and for better acoustic confinement. Note that even though the top surface layers 312 and 314 are shown as functional layers covering all the structural components, they do not necessarily extend continuously across the top surface of the device 300. For example, if the conductive layer 314 is used for interconnect electrical routing, continuous coverage of this layer 314 to all the components would short-circuit the entire structure. Therefore, depending on the functionality, the layer 314 can include traces and gaps in the layer to better align with the underlying structure. For instance, the conductive layer 314 may be a nonuniform layer, with such structures such as mesas and gaps, e.g., with the same periodicity as the underlying resonator structure.

In operation as an electronic clock, a timing or frequency reference, the unreleased coupled resonator 300 can be electrically connected to an outside signal source to generate signals at the resonator's operating (resonant) frequency. For example, such an electrical connection can be established through the top surface layer 312 for the input of the signal and another connection can be formed through the other top surface layer 314 to facilitate the output of the signal, all operating at the resonant frequency. In doing so, the resonator 300 can maintain the desired frequency and timing reference.

When an electrical signal is received at the resonant cavities 340a, an elastic strain proportional to the incoming voltage is generated within the cavity 340a. If the signal is input at or near the resonant frequency of the cavity 340a, the resulting time-dependent strain of the material in the cavity 340a turns into the acoustic vibrations at the resonant frequency. To keep building up the amplitude of the acoustic vibrations at the resonant frequency, the ABR 360a reflects the outgoing acoustic vibrations back into the cavity 340a. To couple the resonant cavities 340a and 340b in the resonator 300, the ABGC 320 transmits acoustic vibrations between the cavity 340a and cavity 340b (for comparison, the acoustic coupler 120 comprising a homogeneous block of material is used for coupling in FIG. 1). Once the vibrations reach the cavity 340b, they keep resonating. Any outgoing vibration away from the cavity 340b is reflected at the ABR 360b. The acoustic vibrations can then be channeled back into the cavity 340a via the ABGC 320. This vibration energy shuttled back and forth between the cavities 340 leads to the overall increase in the Q and reduction in the $R_x$.

Unreleased Coupled Resonators with Integrated Transducer and Sensor

Figure 4A:
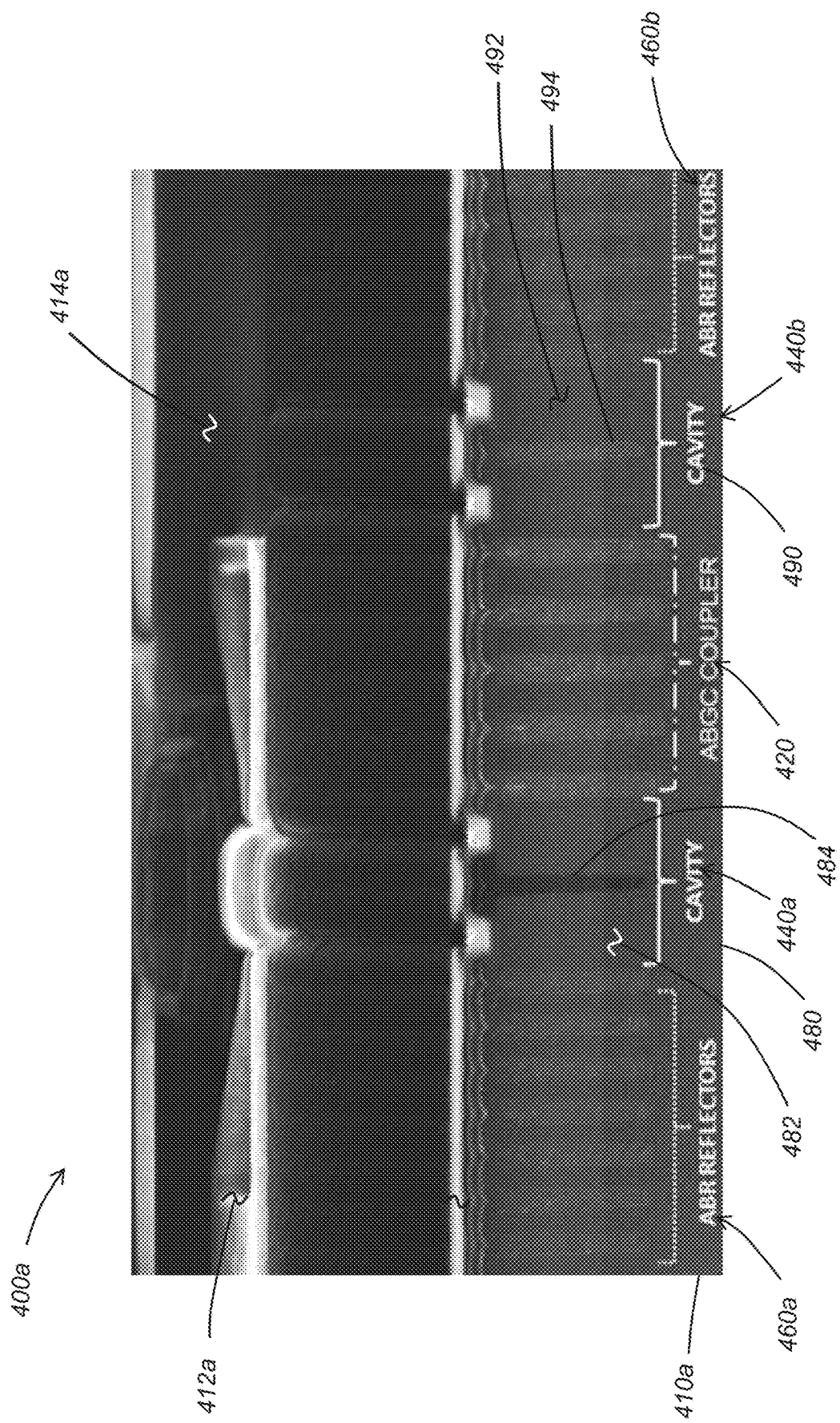
FIG. 4A shows a scanning electron micrograph of the cross-section of a micro-fabricated unreleased coupled multi-cavity resonator with an electrostatic transducer and an electrostatic sensor.

FIG. 4A is a scanning electron micrograph of a cross-section of an unreleased multi-cavity coupled resonator 400a. The structural components shown in the SEM image include a substrate 410a, an ABGC 420, an ABR 460a, an ABR 460b, top surface layers 412a and 414a. This configuration is similar to that of the resonator 300 as described in FIG. 3, but with the exception of the resonant cavities 440, of which the configuration of the resonator 400a includes a different type of resonant cavities 440. In this embodiment, each of the resonant cavities 440a and 440b (collectively, resonant cavities 440) comprises non-monolithic materials (e.g., the resonant cavities 440 are heterogeneous structures containing more than one type of material). In this configuration, the resonant cavity 440a serves as the transducing unit (transducer 480) and the resonant cavity 440b functions as the sensing unit (sensor 490).

Included within the resonant cavity 440a is a transducer similar to the unit cell 200b and unit cell 200c, as described in FIGS. 2B and 2C, respectively. In this embodiment, transducer 480, is similar to the unit cell 200a and includes a high acoustic impedance material 482 and a low acoustic impedance material 484. Note that although the thicknesses of the slab 482 and 484 are not equal, and the physical dimensions and material types of each of the slabs 482 and 484 are substantially similar to those of 222a and 224a, respectively, as described in FIG. 2A. In this configuration, the transducer 480 is a single stack of three slabs of 482, 484 and 482 that work as the transducing unit. Disposed on top of the stack is the top surface layer 412a that serves as the metal contact layer for electrical signal input for the transducer 480. Specifically, the top metal layer 412a is connected to the low acoustic impedance material slab 484 to transduce electrical energy into mechanical motion (vibration) inside the resonant cavity 440a (e.g., acoustic waves are created by the transducer 480 inside the resonant cavity 440a).

Contained within the resonant cavity 440b is also a structure similar to the unit cell 200a. The components of the sensor 490 include a high acoustic impedance material 492 and a low acoustic impedance material 494. Note that although the thicknesses of the slab 492 and 494 are not equal, the range of thickness for both slabs is similar to that of 222a and 224a as described in FIG. 2A. In this configuration, the sensor 490 is a single stack of three slabs of 492, 494 and 492 that work as the sensing unit. Disposed on top of the stack is the top surface layer 414a that serves as the metal contact for electrical signal output from the sensor 490. Specifically, the top surface layer 414a is connected to the high acoustic impedance material slab 492 to transduce mechanical motion (vibration) into electrical energy inside the resonant cavity 440b (e.g., electrical pulses/signals are created by the sensor 490 inside the resonant cavity 440b).

Figure 4B:
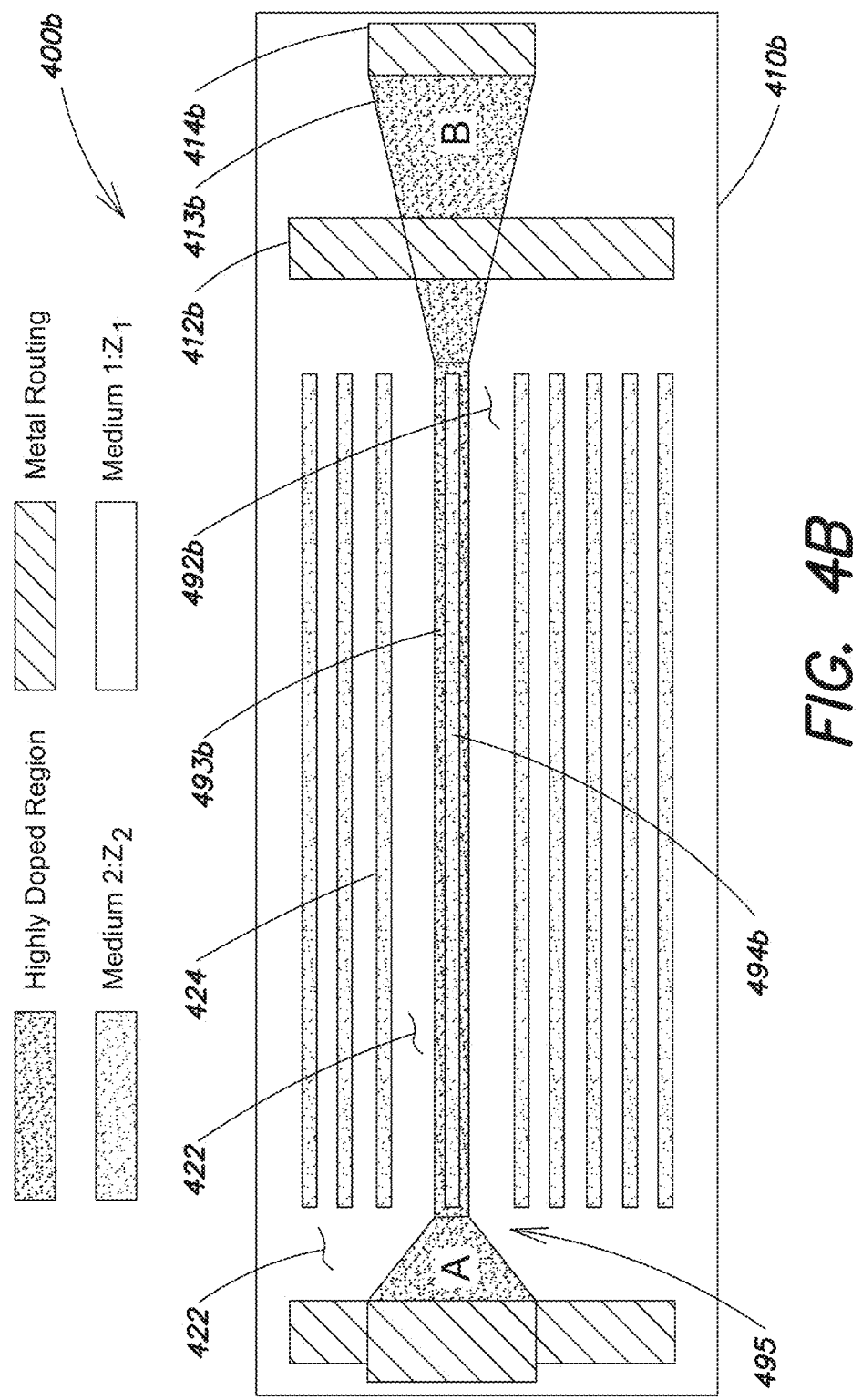
FIG. 4B is a plan view of a piezoresistive sensing mechanism of an unreleased coupled multi-cavity resonator.

FIG. 4B shows a plan view of an unreleased coupled resonator 400b with a different sensor configuration using a piezoresistive sensing unit (sensor 495). In addition, the resonator 400b includes a substrate 410b, a high acoustic impedance material 422, a low acoustic impedance material 424, and top surface layers 412b, 413b, and 414b. The highly-doped region is used for sensing the mechanical motion piezoresistively by making the region into a resistor. In this case, the low-impedance material is polycrystalline silicon, which doesn't have an exceptionally high piezoresistive coefficient. In FIG. 4B, the highly doped region, labeled as layer 413b, can provide for a highly conductive channel where the sense current can be generated and evacuated through the sense electrodes. The thickness of the layer 413b can range from around 1 nm to 100 μm (e.g., 2 nm, 3 nm, 4 nm, 5 nm, 6 nm, 7 nm, 8 nm, 9 nm, 10 nm, 20 nm, 30 nm, 40 nm, 50 nm, 60 nm, 70 nm, 80 nm, 90 nm, 100 nm, 200 nm, 300 nm, 400 nm, 500 nm, 600 nm, 700 nm, 800 nm, 900 nm, 1 μm, 5 μm, 10 μm, 15 μm, 20 μm, 30 μm, 40 μm, 50 μm, 60 μm, 70 μm, 80 μm, 90 μm). The doping concentration of layer 413b can range from $10^{15}$ cm$^{-3}$ to $10^{19}$ cm$^{-3}$, and the dopants can include, but not limited to Boron, Phosphorous, Antimony, etc. The high doping reduces the resistivity which further increases the ΔR/R term in piezoresistive sensing. Furthermore, the highly doped region can also be used to provide for a good electrical ground contact.

Included within the piezoresistive sensing unit of the sensor 495 is a structural arrangement similar to the unit cell 200a, as described in FIG. 2A. The components of the sensor 495 include a high acoustic impedance material 492b and a low acoustic impedance material 494b. In this configuration, the sensor 495 is a single stack containing materials with different acoustic properties with a top layer 413b. The stack, 492b, 494b, and 492b, altogether combines with the highly-doped layer 413b to work as a single piezoresistive sensing unit.

Disposed on top of the stack are the three top surface layers 412b, 413b and 414b that each serves as a contact layer for electrical input or output. In this configuration, the top surface layers 412b and 414b can be connected for electrical signal input and output, respectively, to a transducer (not shown). Similarly, the top surface layer 413b can be connected to the piezoresistive material slab 493b with a high piezoresistive coefficient that can generate an electrical signal from the mechanical motion (vibration) generated within the resonator 400b. Note that the electrical current is measured at the sensor 495 across the contacts A and B, as shown in FIG. 4B.

Unreleased Coupled Multi-Cavity Resonators Enable Mode Localization

Mode localization of acoustic waves generated by unreleased coupled multi-cavity resonators enhances the quality factor Q and motional resistance $R_x$. All the acoustic energy that is pumped into or generated by the resonant cavities eventually decays and gets scattered away into the surrounding bulk material. In order to better control the decaying mechanism of the resonators and to prevent acoustic energy leakage via the lateral (outer) reflectors and/or the substrate, the vibration energy can be well-confined within the resonators to lower the $R_x$ and increase the Q.

Figure 5:
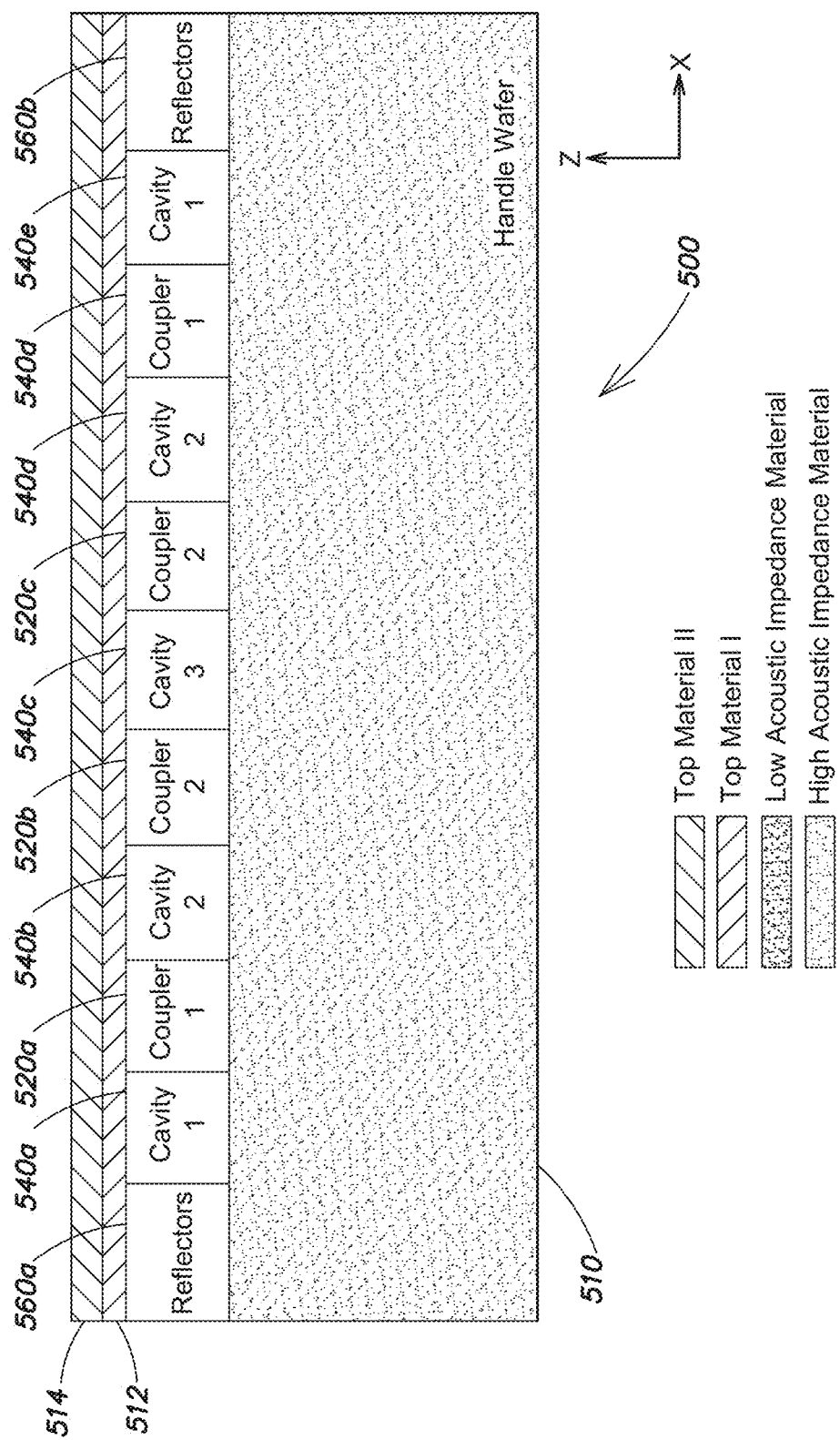
FIG. 5 is an schematic illustration of an unreleased coupled multi-cavity resonator with multiple acoustic couplers, resonant cavities, and acoustic reflectors at both ends of the structure.

FIG. 5 a schematic illustration of an unreleased coupled multi-cavity resonator 500 for improving the motional resistance $R_x$ and the quality factor Q via Mode localization. The resonator 500 includes a plurality of acoustic couplers 520a, 520b, 520c, 520d (collectively, ABGCs 520), a plurality of resonant cavities 540a, 540b, 540c, 540d, 540e (collectively, resonant cavities 540), a pair of outer acoustic reflectors 560a and 560b (collectively, ABRs 560) and two optional top surface layers 512 and 514 disposed on a substrate 510.

In this configuration, each of the plurality of ABGCs 520 may comprise a plurality of repeating Bragg grating units, while each of the plurality of resonant cavities 540 can be configured to confine the acoustic waves into a specific wave mode. As for example, families of coupled resonator are defined as, $$ABR(N_1|CAVITY(1)| \ldots CAVITY(j) \ldots ABGC(N_j)| \ldots CAVITY(N)|ABR(N_1)$$

where $ABR(N_i)$ and $ABGC(N_j)$ defines ABR 560 and ABGC 520 structures with replication periods of $N_i$ and $N_j$, respectively, and CAVITY (j) is the jth type of cavity design. These are different cavities which can have have different structural designs (e.g., in one example different lengths, in another different pitch size of the unit cell, different materials, etc.).

While the resonant cavities 540 can be formed by having a single continuous high acoustic impedance material similar to that of resonant cavities 340 shown in FIG. 3, more advanced designs can be implemented using configurations similar to those of resonant cavities 440 that contain either the transducing or sensing units, as described in FIGS. 4A and 4B.

Figure 6:
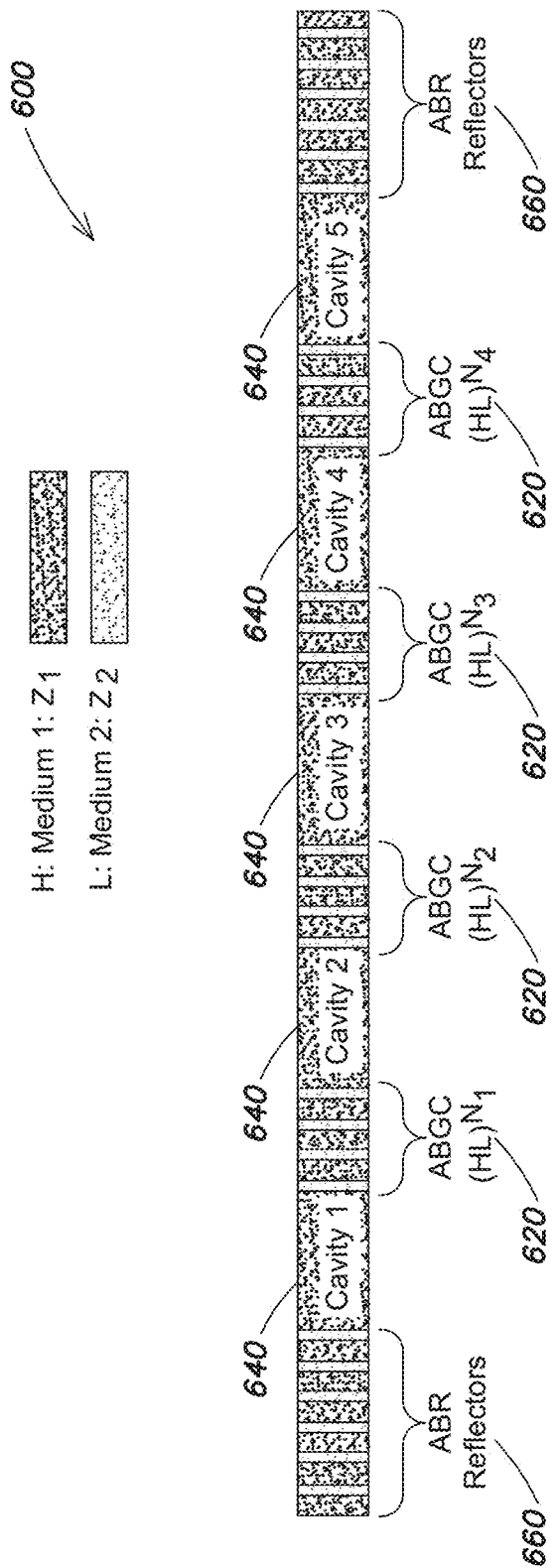
FIG. 6 shows an unreleased coupled multi-cavity resonator with 5 cavities acoustically coupled together using 4 ABGC acoustic couplers.

FIG. 6 shows a simplified schematic of an unreleased coupled multi-cavity resonator 600 with 5 resonant cavities 640 acoustically coupled using 4 ABGCs 620 and altogether flanked by a pair of outer ABRs 660. In this configuration, the number of outer ABGCs (N1=N4) and inner ABGCs (N2=N3) are specified as the couplers between the cavities 640 (1 and 2; 4 and 5) and (2 and 3; 3 and 4) respectively. In order to enhance further the vibration localization within the central cavities, non-symmetric cavity designs can be implemented where the outer cavities 640 (1 and 2; 4 and 5) and the outer ABGCs 620 (N1=N4) coupling those cavities would have different lengths as compared to the inner cavities 640 (2 and 3; 3 and 4) and the inner ABGCs (N2=N3) coupling those cavities.

Unreleased Coupled Multi-Cavity Resonators for $R_x$ Enhancement

Figure 7A:
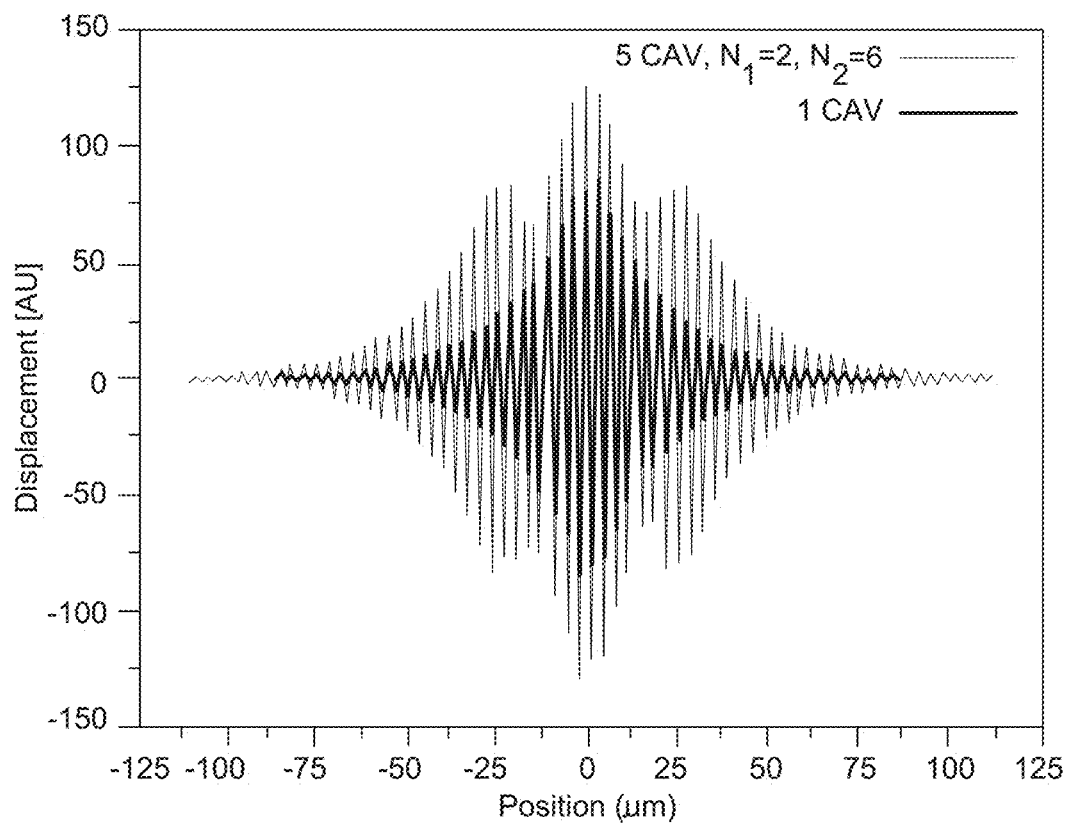
FIG. 7A shows a plot of simulated mode-shape amplitude responses at a given vibration mode from a single-cavity resonator (darker line) and a resonator with 5 coupled cavities (lighter line).

FIG. 7A shows a plot comparing a mode-shape amplitude response of the unreleased coupled multi-cavity resonator 600 with 5 cavities to that of a single-cavity resonator. The configuration used in the single-cavity resonator has 50-period outer ABRs adjacent to the cavity to contain the vibration energy within the resonator. The configuration used in the coupled 5-cavity resonator 600 includes a pair of ABGCs of periodicity N1 and N2 sandwiched between 5 resonant cavities and 50 outer ABR pairs. The plot shows that the coupled 5-cavity resonator has a much larger amplitude response within the center of the cavity for confining the vibration energy. This leads to a clear and pronounced effect of coupled multi-cavity resonator with the increase in the displacement amplitude versus a normal displacement response of the single-cavity resonator. The peak amplitude to the resonator 600 is roughly twice as large as the single-cavity resonator. This effect leads to a much reduced motional resistance $R_x$ in the coupled resonator compared to that of the single cavity resonator.

Unreleased Coupled Multi-Cavity Resonators for Q Enhancement

Figure 7B:
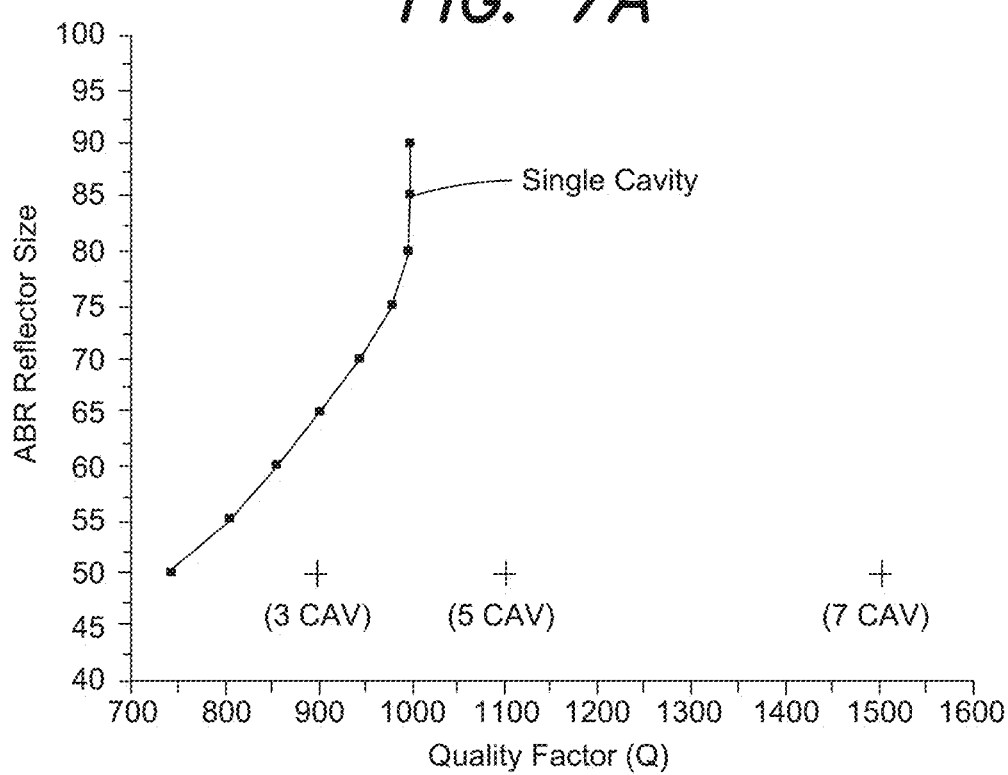
FIG. 7B shows a plot of simulated quality factor Q as a function of the number of ABR grating periods for unreleased resonators with one cavity, 3 coupled cavities, 5 coupled cavities, and 7 coupled cavities.

FIG. 7B shows a plot of simulated quality factor Q as a function of outer ABRs deployed in an unreleased single-cavity resonator using a computer simulation program COMSOL. The simulation indicates that the Q increases steadily as the number of outer ABR periods used in the resonator increases until the number of ABR periods used reaches 80. When the number of ABR periods used reaches 80, the Q levels off to 1000 and deploying additional ABR periods does not contribute further to increase the quality factor.

FIG. 7B also includes simulated quality factors from three different coupled resonators with 3, 5 and 7 coupled resonant cavities, and all have 50 outer ABR pairs. The plot shows that a single-cavity resonator with 50 outer ABRs has the Q of 750 and increasing the number of ABRs to 80 in the single-cavity resonator results in the Q of 1000, whereas a 3-cavity coupled resonator with 50 ABR can generate the Q of 900, and a 5- and a 7-cavity coupled resonators with 50 ABRs each can increase the Q up to 1100 and 1500, respectively. The results indicate that multi-cavity resonators with fewer outer ABRs can achieve a higher Q than a single-cavity resonator with many outer ABRs structures.

Figure 8A:
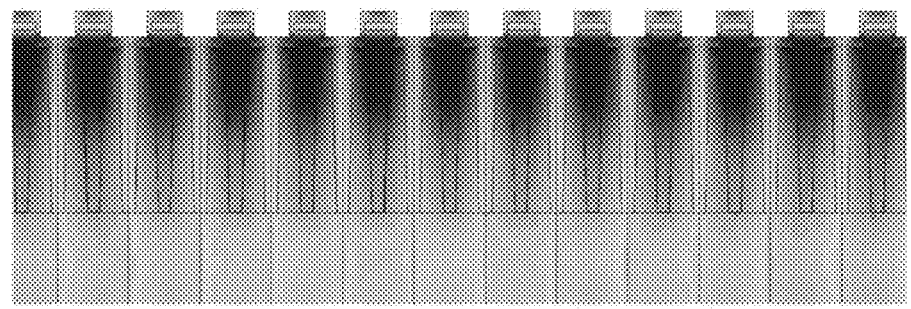
FIG. 8A shows the simulated longitudinal strain distribution of an unreleased coupled 5-cavity resonator (dark regions represent large absolute strain and light regions represent low absolute strain).

FIG. 8A shows a cross-section of a simulated longitudinal strain distribution of an unreleased coupled multi-cavity resonator with 5 coupled cavities. FIG. 8A just shows the modeshape. The transducers are not specified, but they can be arranged in accordance with the modeshape. As illustrated, the darker regions show a set of resonant cavities possessing high absolute strain values, whereas the lighter cavities possess low absolute strain values. The alternating sets of light and dark regions in FIG. 8A represent the differential strains induced across adjacent cavities inside the resonator unit to generate the acoustic vibration. Creating a bigger differential strain across adjacent sets of cavities can potentially lead to a higher vibration response in the resonator.

Figure 8B:
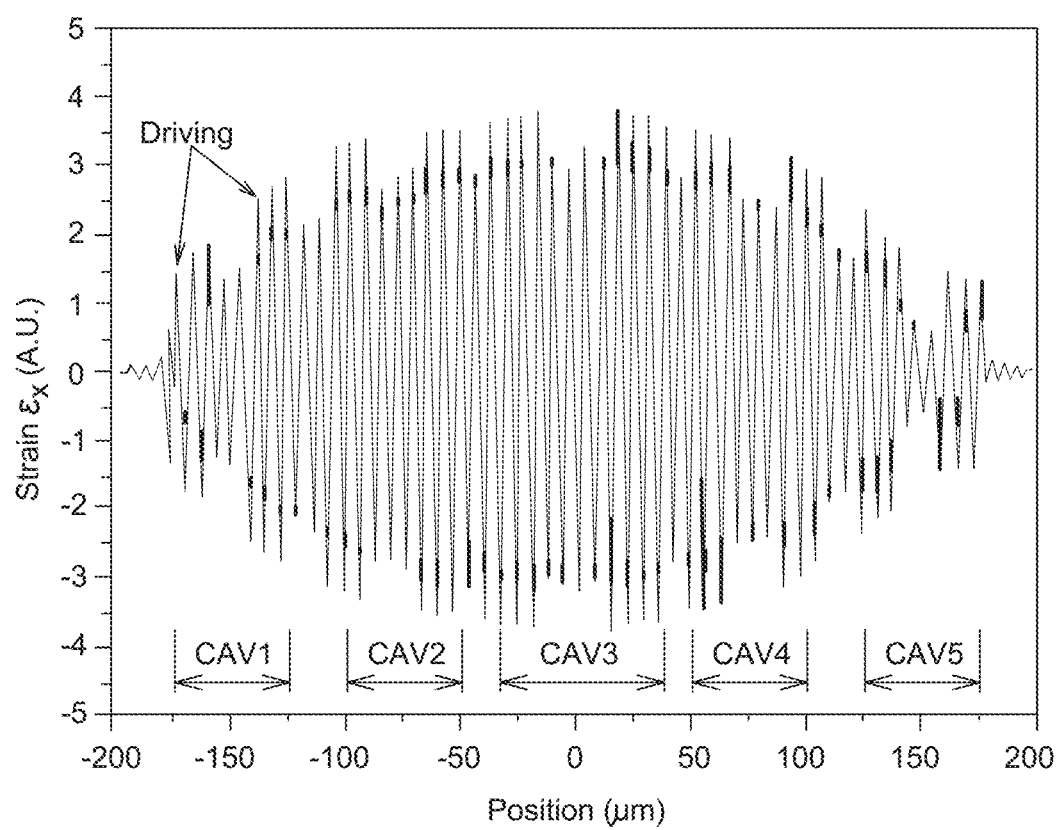
FIG. 8B shows a plot of longitudinal strain as a function of position within the unreleased coupled 5-cavity resonator of FIG. 8A.

FIG. 8B shows a plot of the longitudinal strain as a function of position in an unreleased coupled multi-cavity resonator. The different spikes in the response are due to the numerical delta functions at the transducer (dielectric) interfaces (i.e., location where the cavity structures are driven into resonance). As illustrated, the strains induced in the inner cavities are higher than those produced in the outer cavities, and as a result, not all the cavities produce the same magnitudes in the simulation response.

Figure 8C:
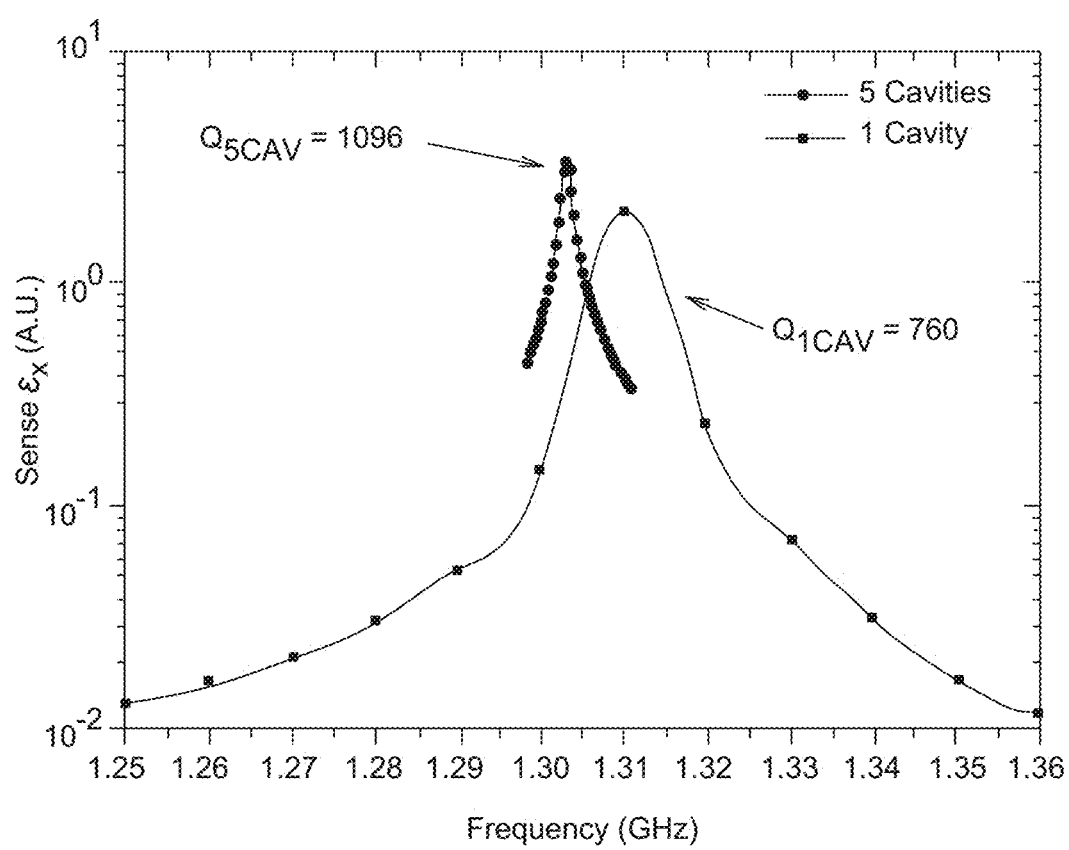
FIG. 8C shows a plot of simulated strain as a function of the driving frequency for unreleased resonators with a single-cavity and 5 coupled-cavities. The Q is extracted from the sharpness of the resonance peak.

FIG. 8C shows a simulated and extracted frequency response of an unreleased coupled 5-cavity resonator with an estimated Q=1096 at $f_0$=1.309 GHz compared to a Q=760 at $f_0$=1.315 GHz for a single-cavity design. These plots highlight the Q enhancement as well as the total output signal from the coupled 5-cavity resonator compared to a single-cavity resonator.

Unreleased Coupled Multi-Cavity Resonators Used in Manipulation of Vibration Localization Perturbations induced in the structural symmetry can significantly affect the vibration dynamics and energy distribution within the system. In the case of unreleased resonators, this can be done by using asymmetric resonator designs (e.g., having multi-cavity structures with ABGC sections of different coupling strengths), or by inducing perturbation and/or defects within the structures (e.g., by having cavities of different sizes within a coupled structure). Other methods include the gradual change in the structural designs of the different building blocks of the coupled resonators. To evaluate the potential of cavity perturbation on resonator metrics, consider the example of 5 coupled-cavities with the following structure, $$ABR(50)|CAV1(L_0)|ABGC(N_1=4)|CAV2(L_{02})|ABGC(N_2=8)|$$

$$|CAV3(L_{01})|ABGC(N_2=8)|CAV4(L_{02})ABGC(N_1=4)|CAV5(L_0)$$

Using the coupled structure of the unreleased coupled multi-cavity resonator 600 described in FIG. 6, $L_0$ is defined as the length of resonant cavities 1 and 5, $L_{01}=p_1L_0$ as the length of resonant cavity 3, and $L_{02}=p_2L_0$ as the perturbed length of resonant cavities 2 and 4. In order to achieve the best performance from the ABRs 660, a structure is considered as optimized when the particular mode of interest is located right at the center of the band-gap. This is done by using two-dimensional contour plots presented in detail below with respect to FIGS. 8E and 8F. In this embodiment, three distinct configurations are evaluated:

Configuration 1: $L_0=3.56$ µm, $p_1=p_2=0$, $f/f_0=1$

Configuration 2: $L_0=3.73$ µm, $p_1=0.14$, $p_2=0.1$, $f/f_0=1$

Configuration 3: $L_0=3.87$ µm, $p_1=0.14$, $p_2=0$, $f/f_0=1$

In all three configurations, the particular mode of interest is located at the center of the band-gap (i.e., $f/f_0=1$).

Figure 8D:
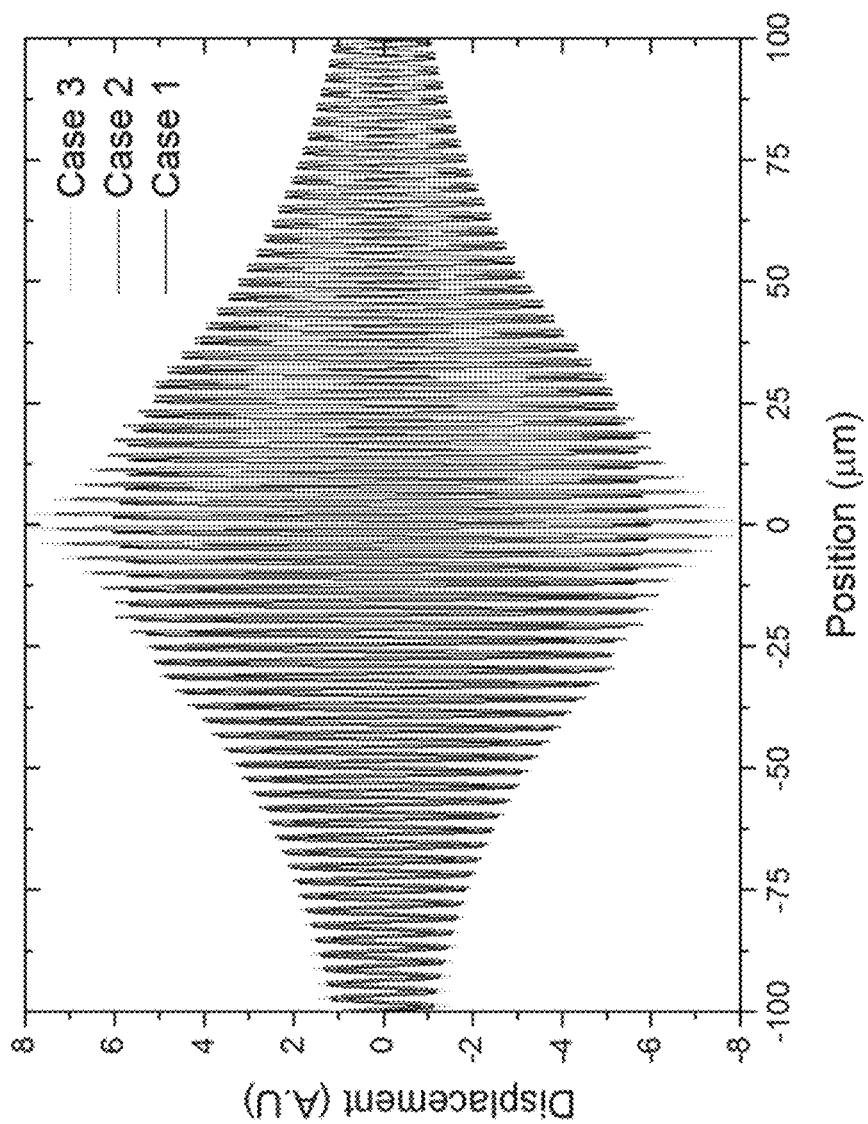
FIG. 8D shows a plot of mode-shape amplitude response of an unreleased coupled multi-cavity resonator with three different design configurations, with each having a slight perturbation in the structural dimensions of the resonator.

FIG. 8D shows the simulated vibration mode-shapes for the three configurations presented above. Configuration 3, which features a perturbation of 14% in the central cavity, is able to achieve the largest localization of the vibration amplitude in the center of the resonator. Configuration 1, on the other hand, has a symmetric structure which translates in having a mode which extends much more uniformly throughout the 5 cavities. Compared to the single cavity design, all three configurations have enhanced localization of the vibration energy and thus, can achieve larger amplitudes of vibrations (i.e., achieving smaller $R_x$) in the central cavities.

Figure 8E:
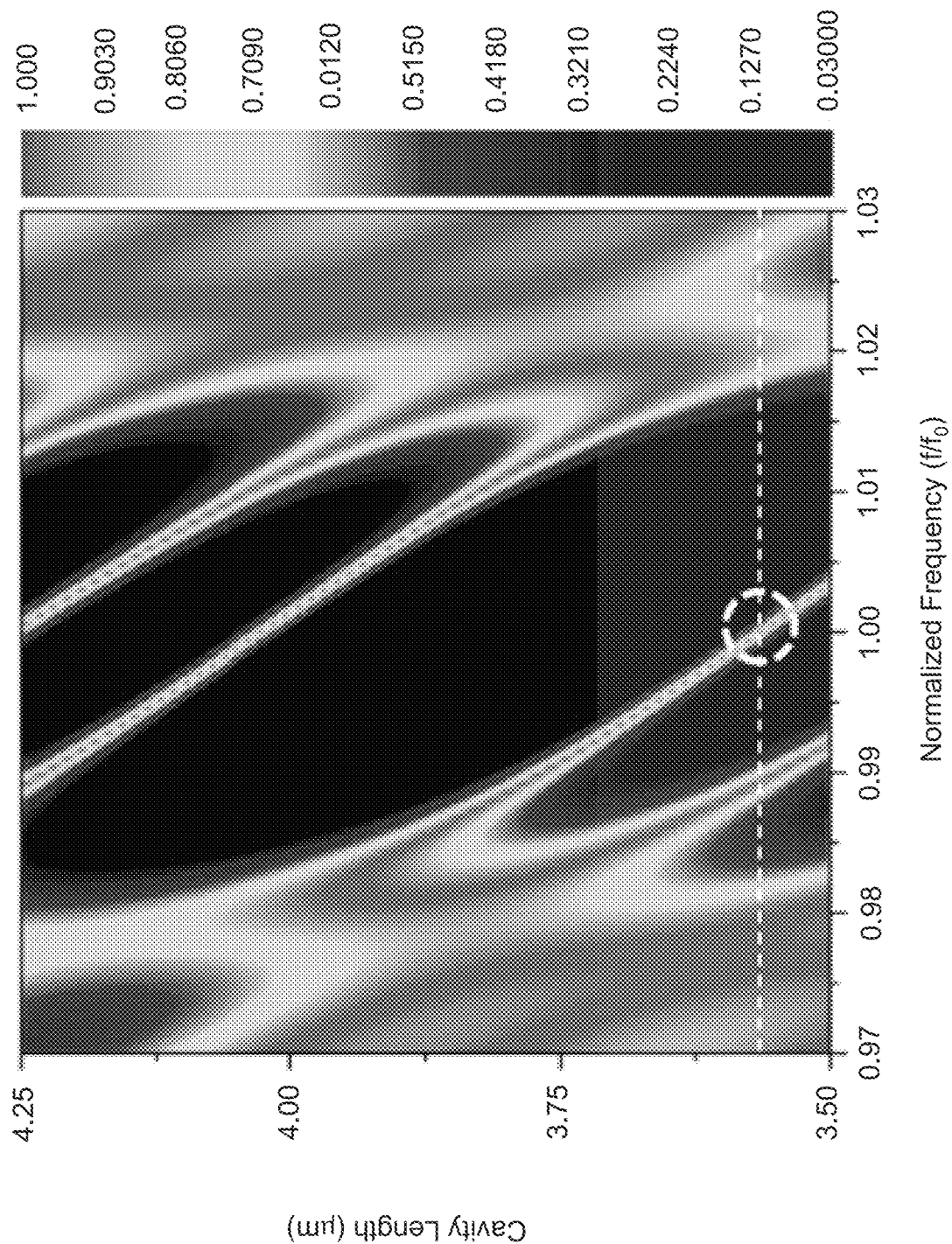
FIGS. 8E and 8F show the design process to find the correct cavity size that leads to the unreleased coupled multi-cavity resonator with Cases 1 and 3, respectively, of FIG. 8D; horizontal slices represent the frequency response of a single configuration used to determine the desired design parameters.
Figure 8F:
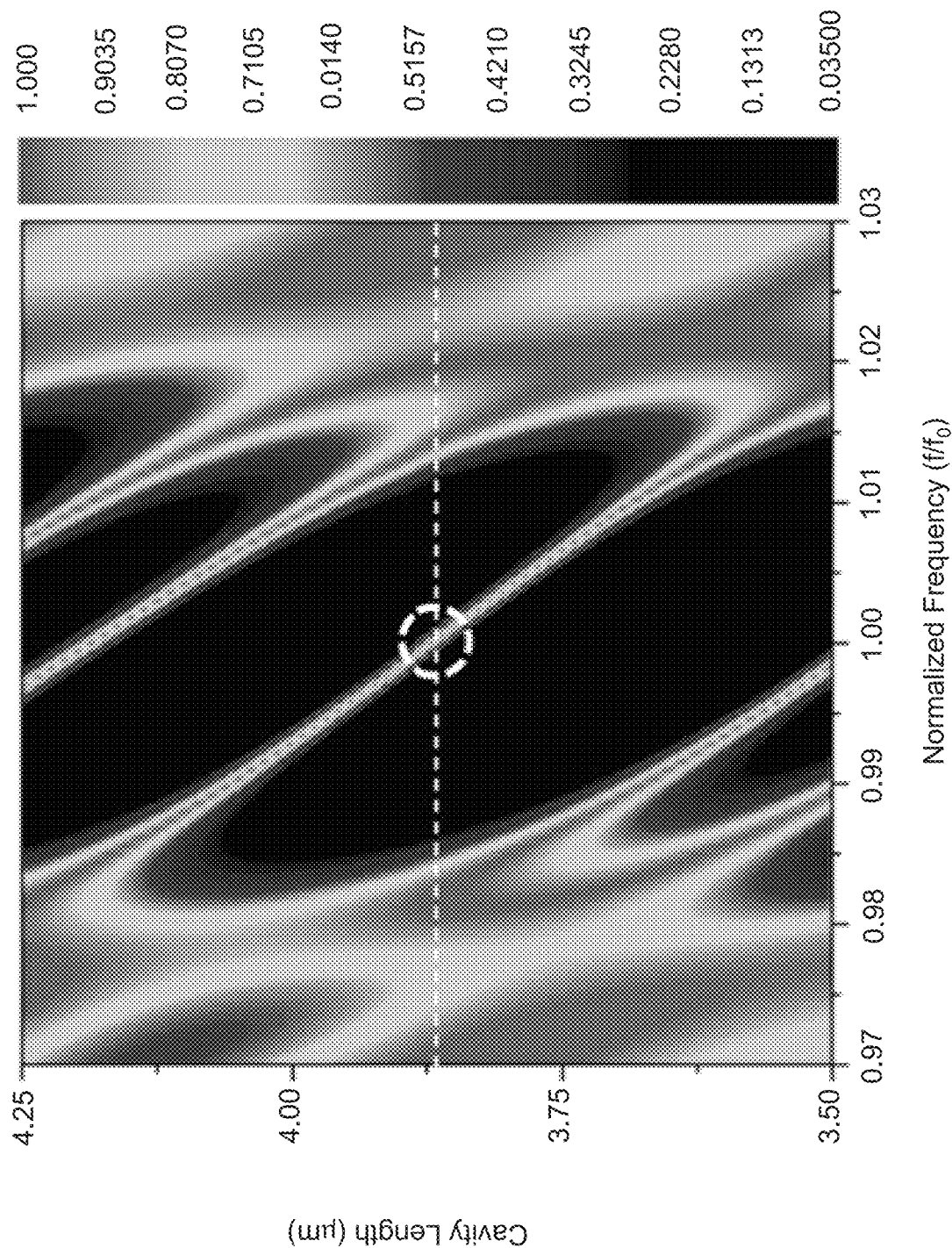

The presence of these small perturbations in the cavity lengths affects the density of available modes within the ABR band-gap. FIGS. 8E and 8F are simulated contour plots of the transmission coefficient for configurations 1 and 3, respectively. The regions (eigenmodes) of interest of vibration mode-shapes plotted in FIG. 8D are marked with a white dashed circle on both contour plots in FIGS. 8E and 8F.

From configuration 1 shown in FIG. 8E, which achieves a broader spatial vibration distribution compared to the other two configurations, is located at $f/f_0=1$. However, at the particular cavity length $L_0=3.56$ µm, there is another eigenmode in its vicinity (at $f/f_0=0.99$). This is not the case in configuration 3 shown in FIG. 8F in which the circled region is nearly isolated from the surrounding modes for a given horizontal slice at $L_0=3.87$ µm. The perturbations induced through the coefficients $p_1$ and $p_2$ are used to isolate a particular mode from the others and therefore optimize the localization of the eigenmode.

Figure 8G:
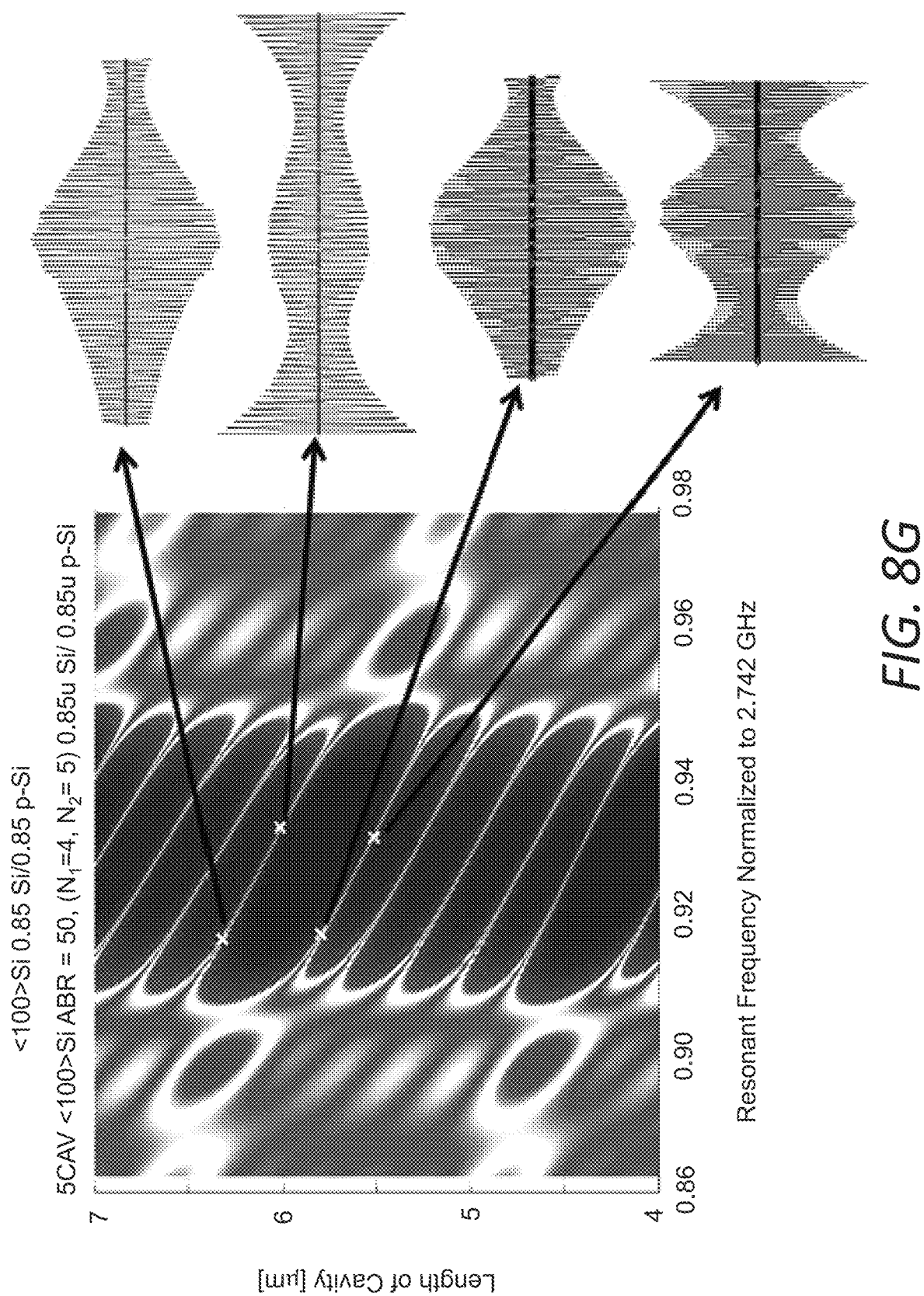
FIG. 8G shows a contour plot of the amplitude response of an unreleased coupled 5-cavity resonator, as a function of frequency and cavity length; each horizontal slice of the contour plot corresponds to the amplitude frequency response of a particular design; the individual mode-shapes shown on the right correspond to the marked spots (designs) on the contour plot.

FIG. 8G shows a contour plot the amplitude response of an unreleased coupled 5-cavity resonator, as a function of frequency and cavity length. Using these simulated plots, an optimal cavity length can be obtained for the desired mode shape of the resonator (i.e., large amplitudes of vibration in the center of the cavity to minimize the losses though outer reflectors).

Figure 9A:
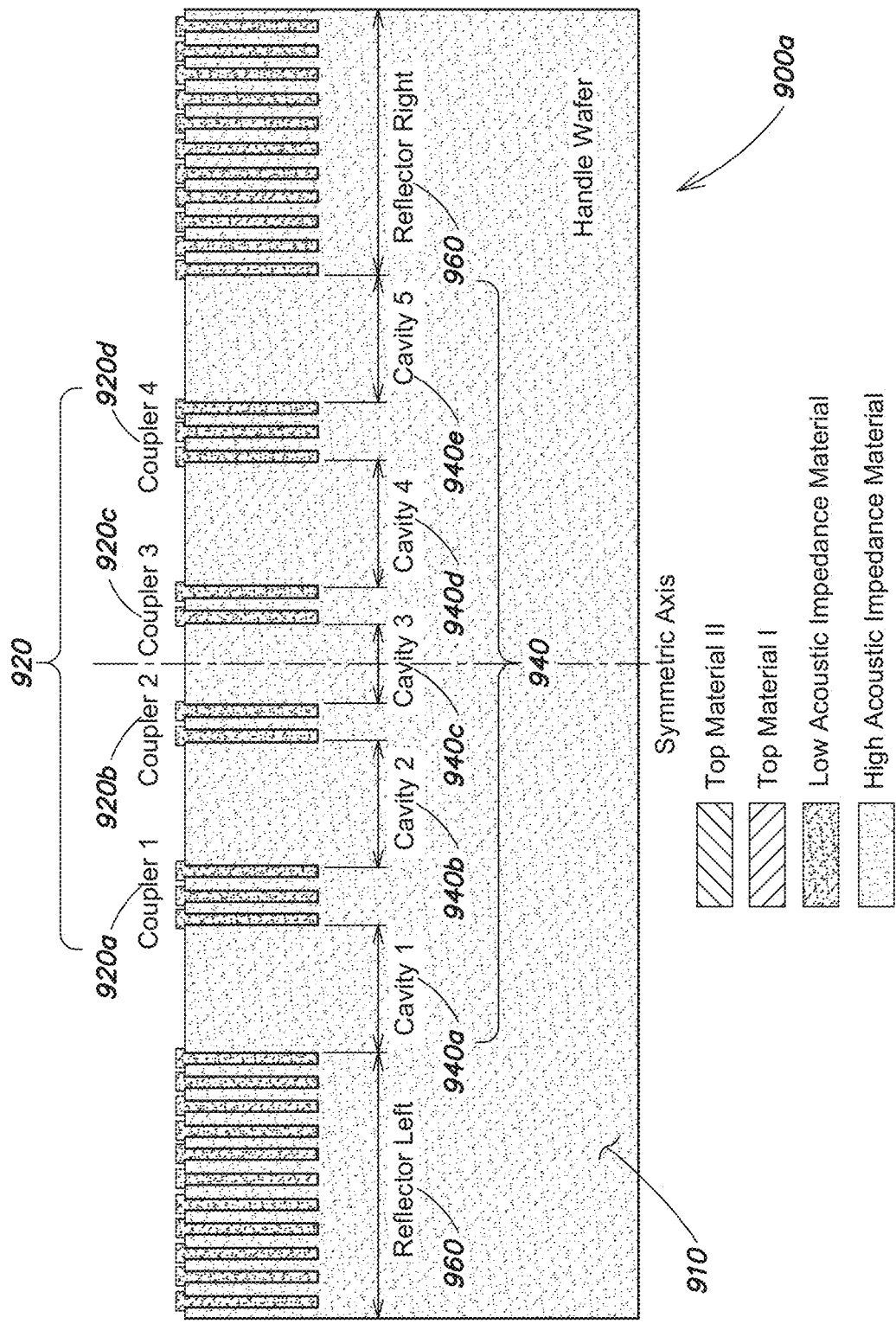
FIGS. 9A-9C show an unreleased coupled multi-cavity resonator with three exemplary structural configurations utilizing zero, one and two top surface layers.

FIG. 9A shows an embodiment of an unreleased coupled multi-cavity resonator 900a comprising a plurality of ABGCs 920, a plurality of resonant cavities 940 coupled by the ABGCs 920, and a pair of outer ABRs 960 disposed on a substrate 910 without top surface layers. In this configuration, both the ABGCs 920 and the resonant cavities 940 have different dimensions and are positioned to generate a strong acoustic resonance within the resonator 900a. The dimensions of cavities 940 and ABGCs 920 in the lateral direction are selected to maximize Q at a given frequency and to generate large vibration energy within the cavities 940 to reduce the $R_x$. In doing so, a symmetry axis is needed to obtain the desire mode-shape with a high Q and a low $R_x$.

Hence, the 5 cavities 940 (940a, 940b, 940c, 940d and 940e) included in the configuration are all not of equal length. However to maintain symmetry, cavity 940a and cavity 940e are designed to have the same length, as are the cavity 940b and cavity 940d. The cavity 940c is the center cavity in which the resonator's acoustic symmetry lies. Equally important is the symmetry exhibited by the ABGCs 920 (920a, 920b, 920c and 920d) that are designed to couple the cavities 940. As shown in FIG. 9A, the ABGCs 920 do not have equal number of grating pairs, and hence, are of different sizes and dimensions. To achieve a specific mode-shape and to maintain symmetry, the ABGC 920a and the ABGC 920d are identical, and the ABGC 920b and the ABGC 920c have identical structural specifications.

Figure 9B:
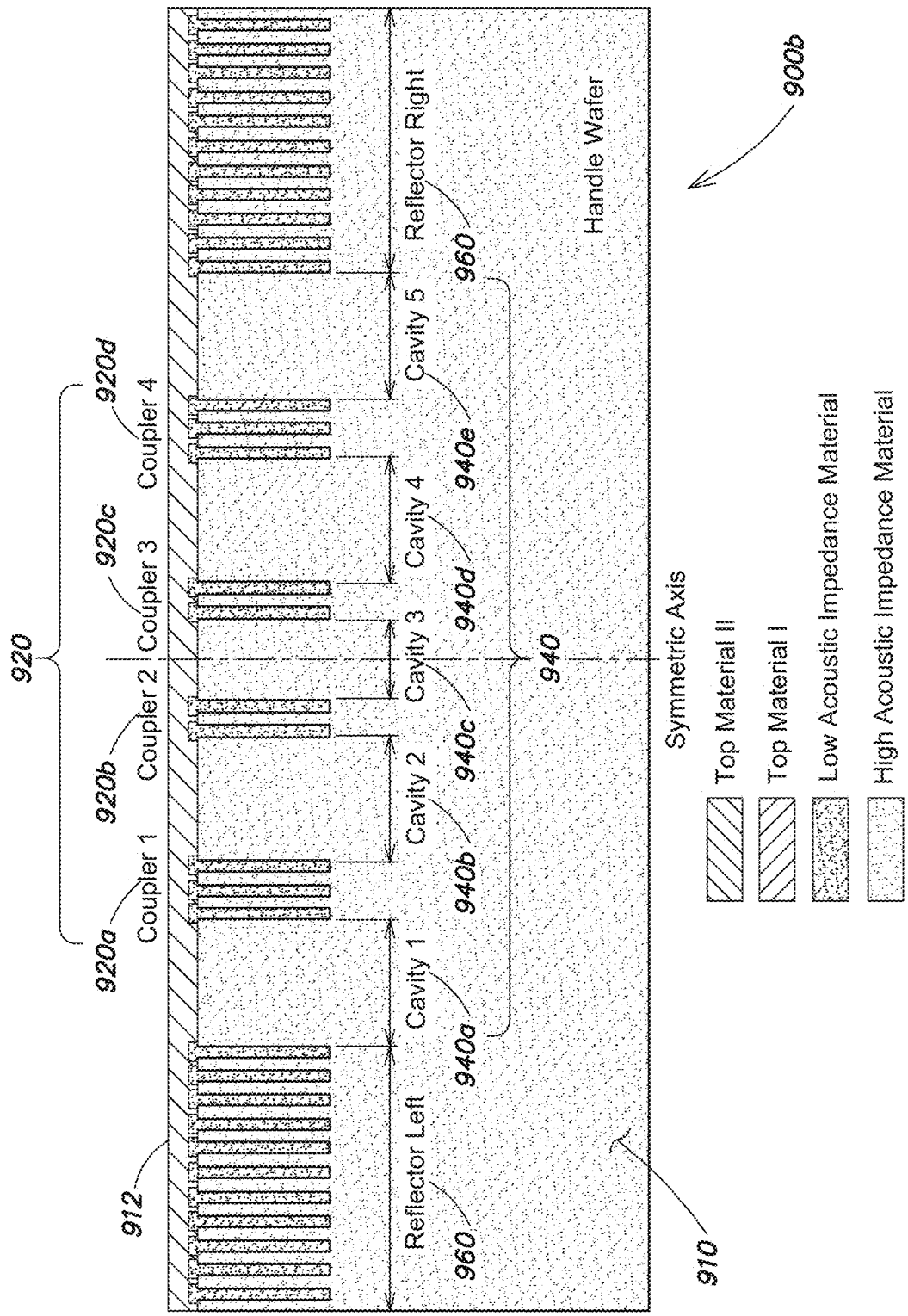

FIG. 9B shows an alternate embodiment of an unreleased coupled multi-cavity resonator 900b comprising a plurality of ABGCs 920, a plurality of resonant cavities 940 coupled by the ABGCs 920, and a pair of outer ABRs 960 disposed on a substrate 910 with a top surface layer 912. In this configuration, the resonator 900b is substantially similar to the resonator 900a, as described in FIG. 9A, except for the inclusion of the top surface layer 912 which can add additional functions and can enable a better acoustic confinement within the resonator 900b.

Figure 9C:
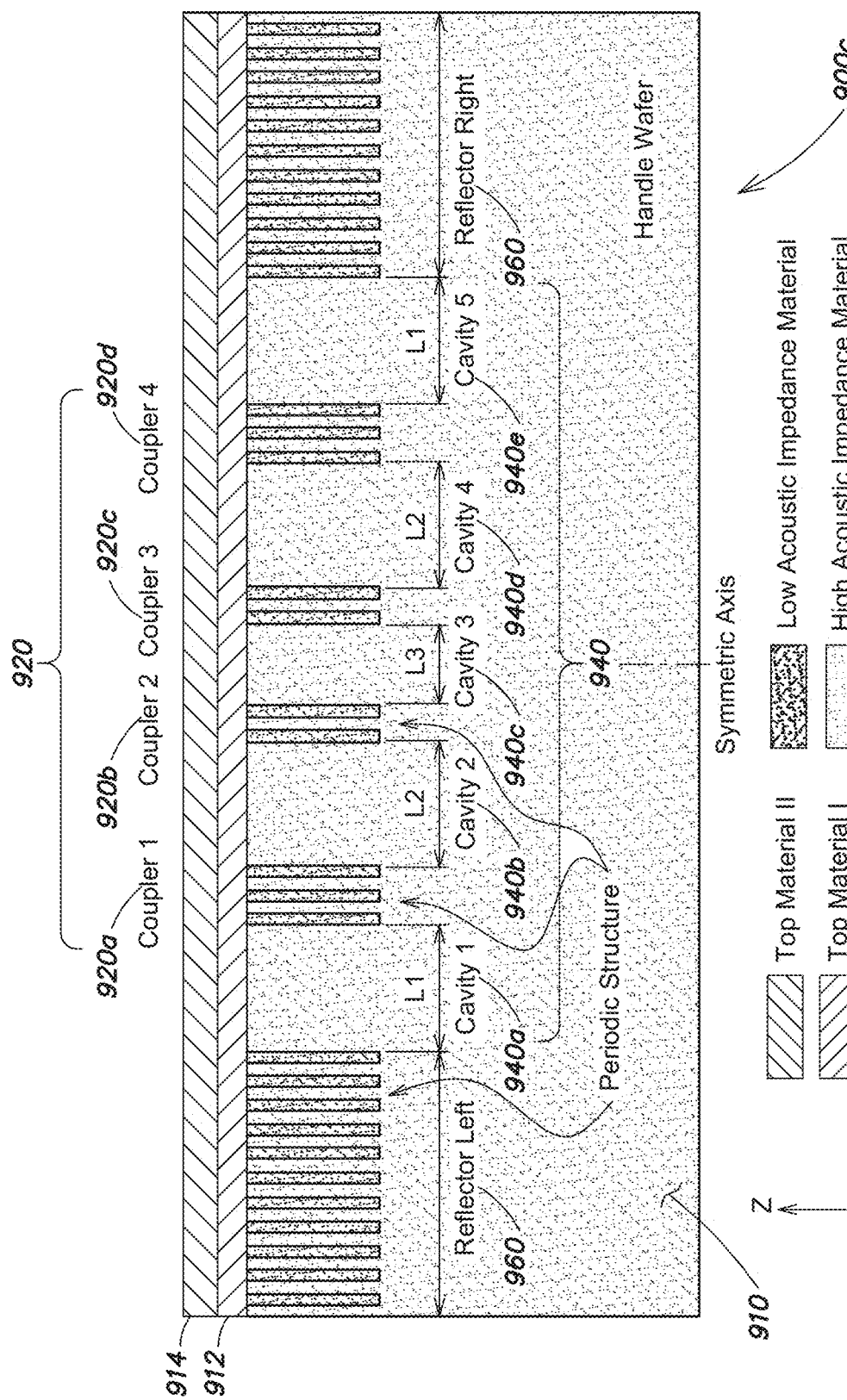

FIG. 9C shows another embodiment of an unreleased coupled multi-cavity resonator 900c comprising a plurality of ABGCs 920, a plurality of resonant cavities 940 coupled by the ABGCs 920, and a pair of outer ABRs 960 disposed on a substrate 910 with two top surface layers 912 and 914. In this configuration, the resonator 900c is substantially similar to the resonator 900a, as described in FIG. 9A and the resonator 900b, as described in FIG. 9B, except for the inclusion of two top surface layer 912 and 914 which can add additional functions and a better acoustic confinement within the resonator 900c.

Unreleased Coupled Multi-Cavity Resonators with Gradient Index (GRIN) Sections

Figure 10:
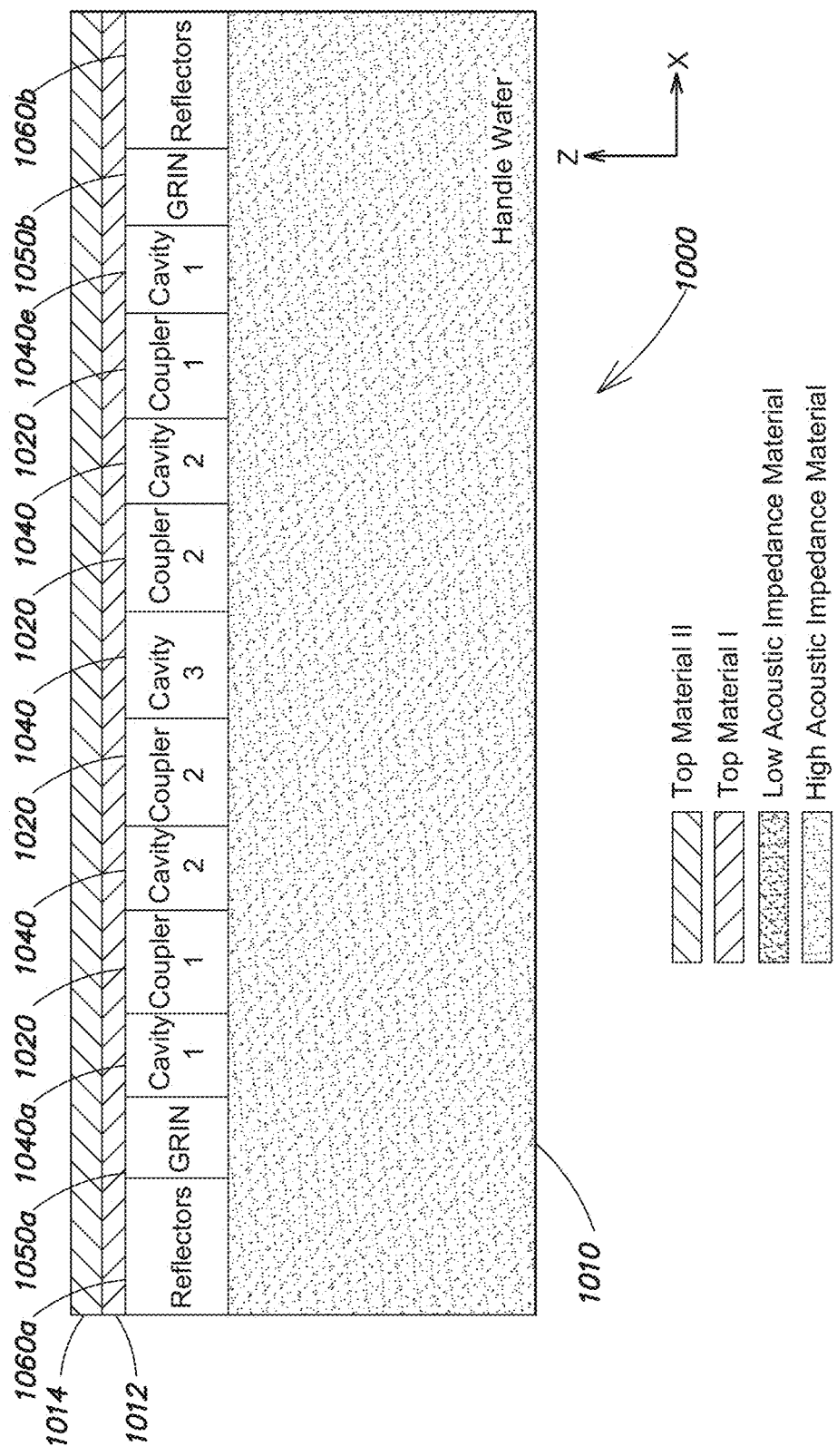
FIG. 10 is an abstracted schematic illustration of the use of chirped or graded period ABR structures in unreleased coupled multi-cavity resonators to further increase the Q of the resonators.

FIG. 10 is a schematic illustration of the use of gradient index "GRIN" structures to further increase the Q of an unreleased coupled multi-cavity resonator 1000 by providing gradual (either linear or exponential in nature) structural transitions to match, for example, the pitch size or physical dimensions of adjacent structures within the resonator 1000. Said another way, the periodicity of the Bragg gratings in the GRIN structures are varied spatially, e.g., in a gradual or linear fashion, to match dimensions of the adjacent components, such as ABGCs, ABRs and Bragg gratings used in resonant cavities with integrated transducers and sensors). As shown in FIG. 10, the unreleased resonator 1000 may comprise a plurality of ABGCs 1020, a plurality of resonant cavities 1040 coupled by the ABGCs 1020, a pair of outer ABRs 1060a and 1060b (collectively, ABRs 1060) disposed on a substrate 1010 with two top surface layers 1012 and 1014, and a pair of GRIN sections 1050a and 1050b (collectively, GRINs 1050).

In the configuration embodied in FIG. 10, the resonator 1000 is substantially similar to the resonator 900c, shown in FIG. 9C, except for the inclusion of GRIN structures 1050. The GRINs 1050a and 1050b can provide gradual structural transitions between the outer ABRs 1060a and 1060b and their adjacent resonant cavities 1040a and 1040e, respectively, by gradually changing the pitch size of the Bragg gratings to match those of adjacent structures. Similarly, another type or set of GRIN structures may also be used to provide gradual structural transitions between the resonant cavities 1040 and their neighboring ABGCs 1020 by gradually changing the pitch size of the Bragg gratings between the adjacent structures, as described later in detail in respect to FIG. 11B.

Figure 11A:
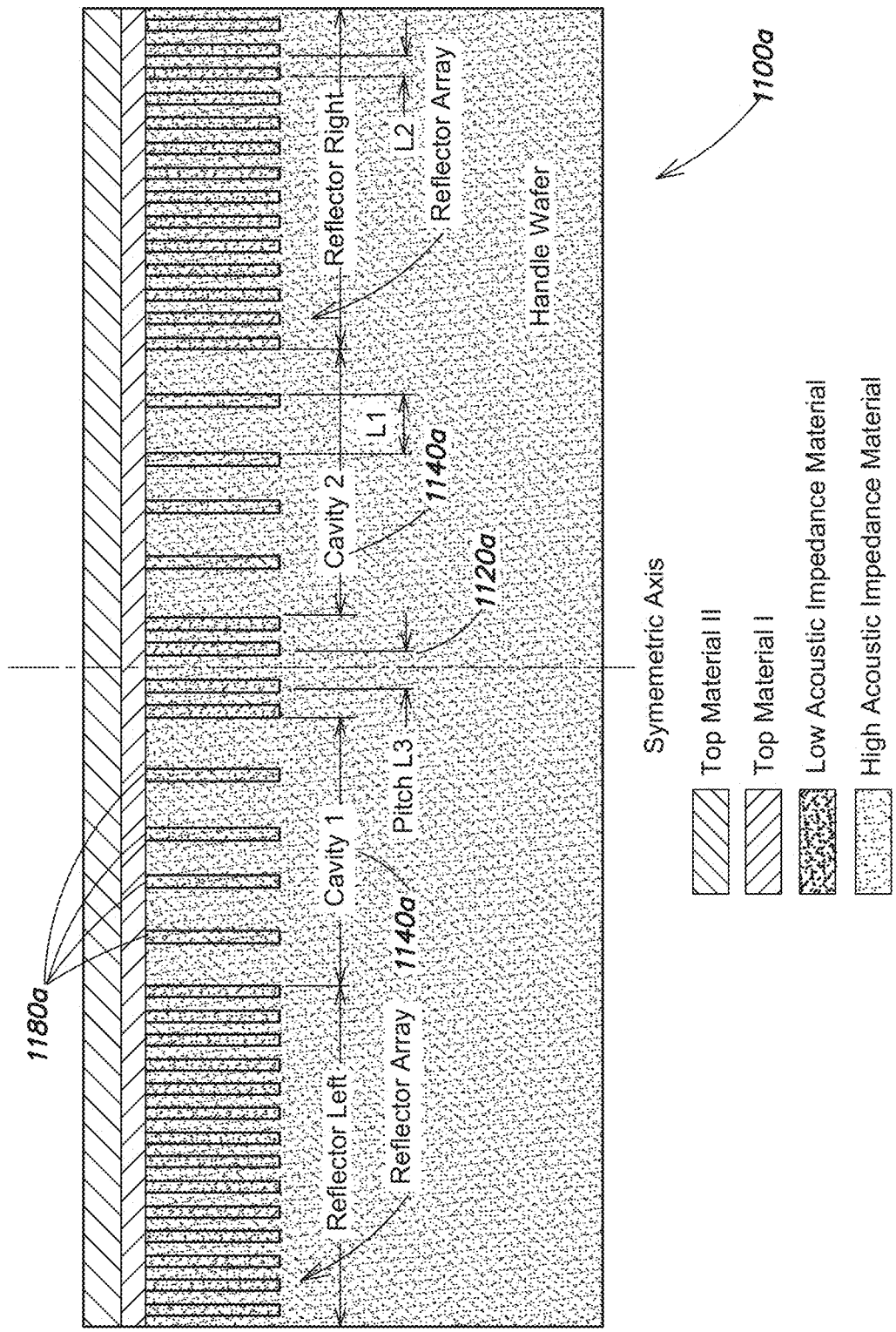
FIG. 11A shows an exemplary design configuration of an unreleased coupled multi-cavity resonator comprising outer ABR structures, and ABGC structures coupling resonant cavities with integrated transducer arrays.

FIG. 11A shows an exemplary configuration of an unreleased coupled multi-cavity resonator 1100a with an ABGC 1120a and resonant cavities 1140a containing transducer arrays. This configuration is a more complex variation of the resonator 300, shown in FIG. 3 and the resonator 400a, as shown in FIG. 4A. In FIG. 3, the resonant cavities 340 are homogeneous regions of the substrate 310. In FIG. 4A, the resonant cavities 440 are non-monolithic materials with heterogeneous structures containing more than one type of material. In that configuration, the transducer 480 is a single stack of three slabs of 482, 484 and 482 that work as the transducing unit that generate acoustic waves inside the resonant cavity 440a. Instead of a single transducer 480 that resides in FIG. 4A, the configuration shown in FIG. 11A includes 4 transducers 1180a within each of the resonant cavities 1140a. This multiple-transducer design can help generate a more targeted mode-shape and a higher Q. Multiple transducers can also provide more efficient driving and sensing if the driving acoustic profile matches the mode-shape, which also lowers the motional resistance $R_x$. In addition, multiple transducers help preserve the translational symmetry preserved and thus give a higher mechanical quality factor Q. The multiple-transducer design also improves the (k,w) distribution of the driving, as discussed below.

Figure 11B:
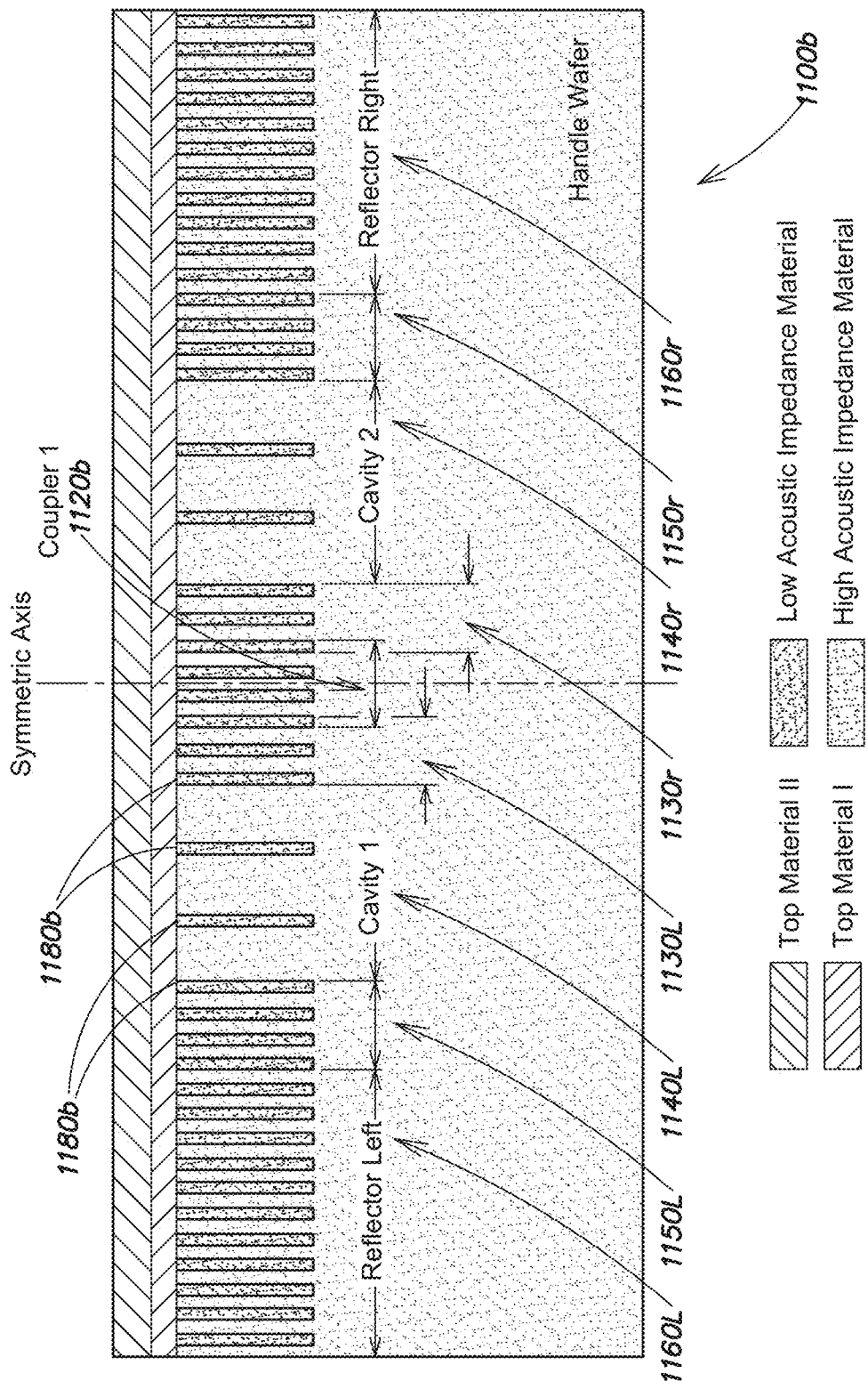
FIG. 11B shows a more enhanced design configuration of an unreleased coupled multi-cavity resonator comprising outer ABR structures, ABGC structures coupling resonant cavities with integrated transducer arrays, and GRIN structures to provide gradual structural transition between adjacent components.

FIG. 11B shows an exemplary configuration with a highly complex design of an unreleased coupled multi-cavity resonator 1100b with integrated GRIN structures 1150l and 1150r disposed between adjacent ABRs 1160l and 1160r and resonant cavities 1140l and 1140r, along with integrated GRINs 1130l and 1130r disposed between the resonant cavities 1140b and the ABGC 1120b. In this configuration, all the included structural components of the resonator 1100b are listed as the following, beginning from the left to the right of FIG. 11B: ABR 1160l, GRIN 1150l, cavity 1140l, GRIN 1130l, ABGC 1120b, GRIN 1130r, cavity 1140r, GRIN 1150r, and ABR 1160r. As stated above, the GRINs 1150l, 1150r, 1130l, and 1130r are designed to provide gradual structural transitions between the outer ABRs 1160l and 1160r and their adjacent resonant cavities 1140b by gradually changing the pitch size of the Bragg gratings to match the pitch sizes of adjacent structures. Similarly, the GRINs 1130 are also designed to provide gradual structural transitions between the resonant cavities 1140l and 1140r and their coupler ABGC 1120b by gradually changing the pitch size of the Bragg gratings of the transducers 1180b to match the pitch size of the ABGCs 1120b.

Unreleased Coupled Multi-Cavity Resonators with Interdigitated Transducers (IDT) and Sensors Multi-cavity resonator designs improve the driving (transduction) efficiency by enabling optimized mechanical driving distributions (in the (k, ω) space), and thereby can help reduce activation of adjacent acoustic modes and improve the Q. Coupled-cavities within a resonator can enable the use of interdigitated transducer (IDT) unit cells for generation of a more defined acoustic transduction profile with wave-vector k, as well as the possibility for differential-driving/differential-sensing of acoustic modes and mode-shapes. This is similar to the inter-digitation used in the metal electrode patterns of SAW resonators, where the pitch is set to the SAW acoustic wavelength. The benefit of this design configuration is that the k wave vector transduced in the driving is much more localized and defined in the (k, ω) space, and as a result, scattering into other spurious modes that can leak into existing unreleased structures is reduced. This suppression of spurious acoustic modes can in turn improve frequency stability of the resonator. In addition, the IDT configurations also enable differential driving and sensing schemes which have the potential to significantly reduce the electrical feed-through.

Figure 12A:
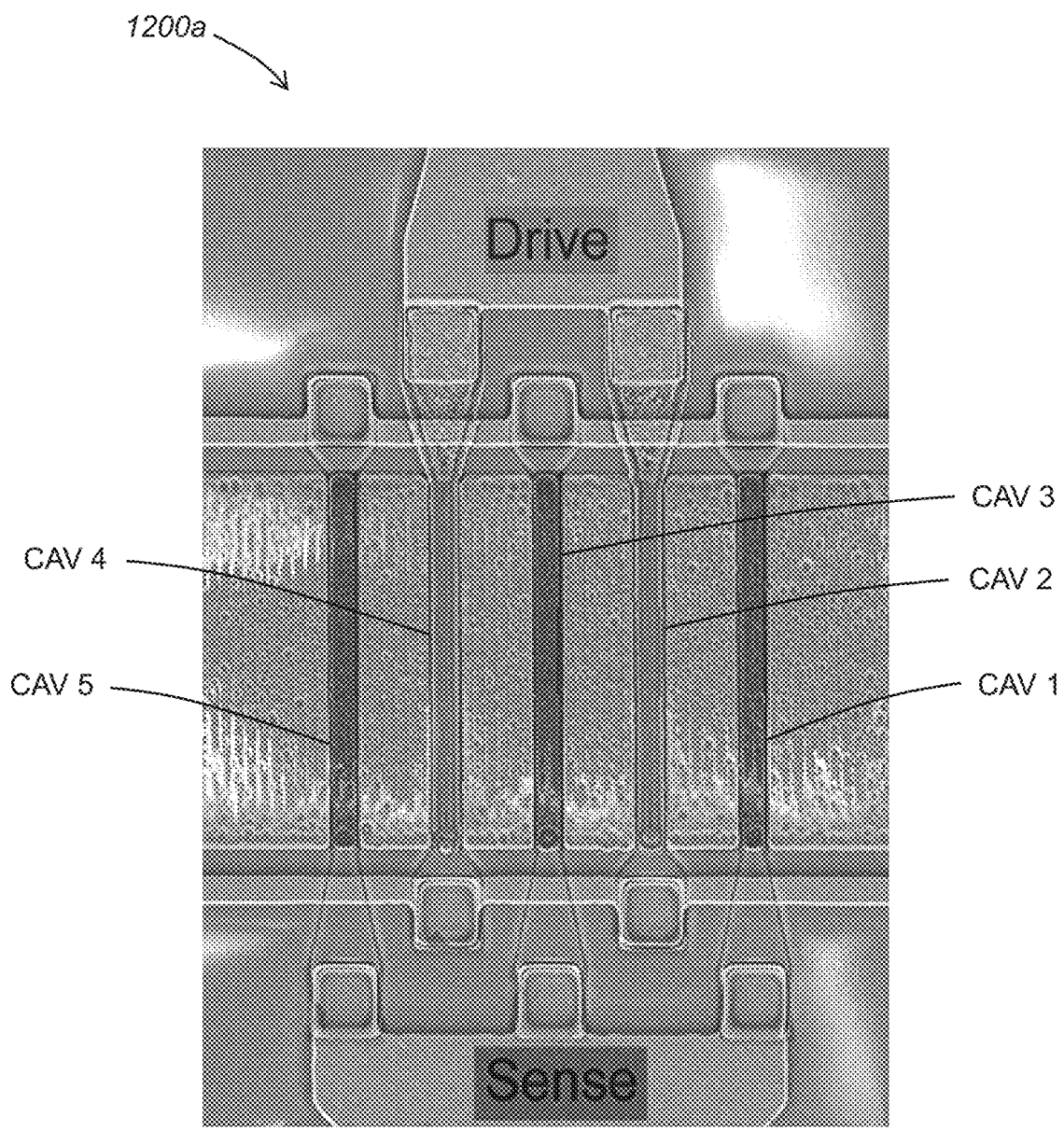
FIG. 12A is an annotated scanning electron micrograph of an unreleased multi-cavity coupled resonator with interdigitated transducers and sensors.

FIG. 12A is a scanning electron micrograph "top-view" of an unreleased multi-cavity coupled resonator 1200a with interdigitated transducers and sensors. In this configuration, there are 5 cavities disposed in the resonator 1200a, with 2 cavities connected to the contact pad labeled "Drive" and 3 cavities connected to the contact pad labeled "Sense." As illustrated, the driving signal is transduced through the cavities 2 and 4 while the signal is sensed through cavities 1, 3 and 5.

Figure 12B:
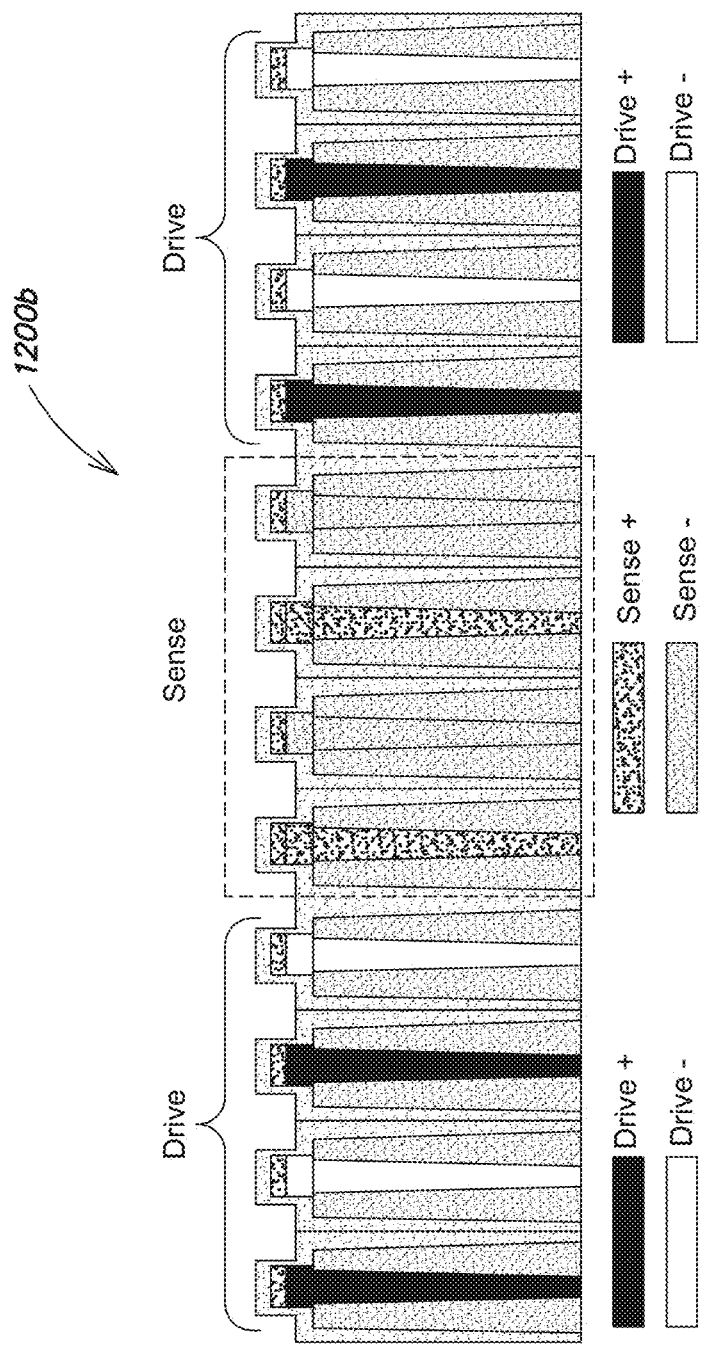
FIG. 12B shows a cross-section schematic of an unreleased coupled multi-cavity resonator with a differential drive/differential sense configuration.

Unreleased Coupled Multi-Cavity Resonators with Differential Drive/Differential Sense Configuration FIG. 12B shows a cross-section schematic of an unreleased coupled multi-cavity resonator 1200b with interdigitated transducers to enable a differential drive/differential sense configuration. As illustrated in the figure, a resonator cavity labeled "Drive" can comprise a plurality of transducing unit cells, sandwiching a cavity section labeled "Sense" comprising a plurality of sensing unit cells. This configuration can enable deployment of differential-drive and differential-sensing schemes to improve the transduction (driving) efficiency (e.g., by matching the strain distribution of the acoustic mode within the cavity), or by using them in more advanced schemes to suppress the common-mode feed-through current to enhance the signal output while lowering the noise floor. Regardless of chosen schemes or resonator designs, an added benefit of such configurations culminates in lowering of the $R_x$ of the resonator 1200b.

Unreleased Coupled Multi-Cavity Structures as Transmission Filters

The unreleased coupled multi-cavity resonator topologies can be used as narrowband electronic transmission filters, similar to the traditional FBAR/SAW resonators used in wireless transceivers. By adjusting the coupling strength between the cavities, the number of cavities, and cavity lengths, the filter's central frequency, pass bandwidth, passband ripple, and shape-factors can be specifically designed to attain some target filter properties. For example, a transmission line (TL) filter can be configured for use as a customized narrowband transmission filter operating at a desired center frequency with tunable band-pass behavior determined by the number of Fabry-Perot repeating units included within the filter structure, whereas a multi-pole (MP) filter can be configured so that a combined band-pass behavior can be generated by a collection of overlapping acoustic modes from individual operating frequencies of coupled-cavities in the MP configuration. Specifically, the use of ABGCs in these multi-cavity acoustic resonant structures enables these devices to work as electronic transmission filters.

Figure 13:
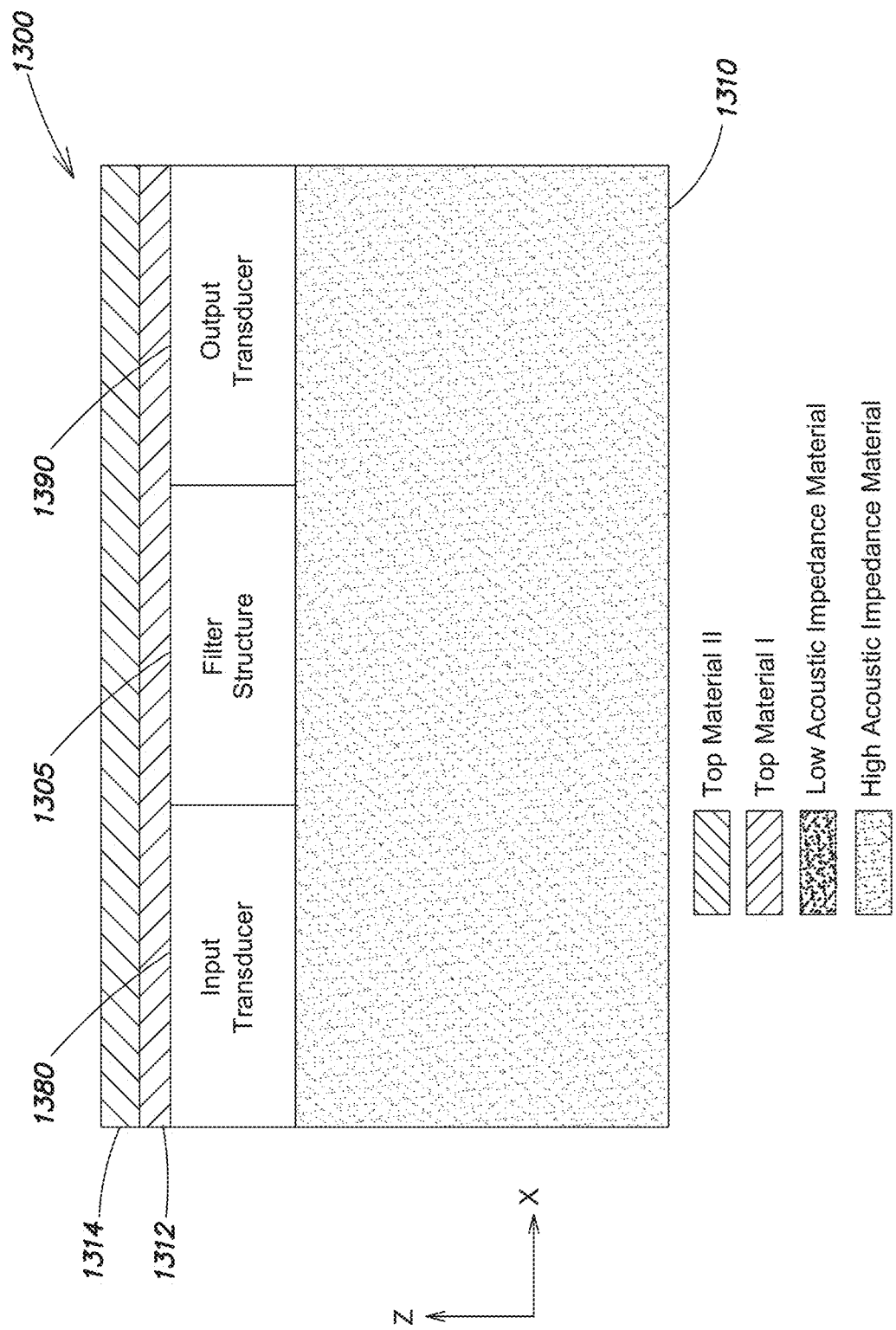
FIG. 13 is a schematic illustration of unreleased transmission filter (TL) architecture.

FIG. 13 is a schematic illustration of unreleased multi-cavity transmission filter architecture. In this design architecture, the transmission filter 1300 may comprise an input transducer 1380, a filter structure 1305, an output transducer 1390 and two optional surface layers 1312 and 1314 disposed on a substrate 1310. The materials used for the components described herein are substantially similar to those described in FIGS. 1 and 2A-2C.

Unlike the resonators described in the earlier sections and figures, the transmission filter 1300 utilizes the resonant cavities and ABGCs in a different arrangement to function as a filter instead of a resonator. One difference between the two device types lies in the spectrum of the frequency response. In the resonator configuration, the acoustic modes are represented as spikes in the frequency spectrum response, and are usually well separated from each other. This way, an oscillator circuit will "lock" to one of the modes, and not trigger any other frequencies, hence the high stability and precise frequency output. For the filter configuration, there is a broad frequency response (i.e., the response is flat for a whole range of frequencies which is suitable as a band-pass filter).

There are at least two structurally distinct transmission filter configurations: a Transmission Line (TL) configuration and a Multi-Pole (MP) topology. The TL configuration typically does not include external reflectors (e.g., ABRs). It also uses a combination of $(LH)^N$ material stacked in a particular fashion as described in greater detail below, e.g., $(LH)_N H (LH)^N$, etc. The materials, periods, and stack may be selected to achieve particular filter characteristics (e.g., center frequencies, pass bandwidth, pass band shape, roll-off, shape factor, etc.). Conversely, a MP topology comprises multiple cavities coupled together between a pair of external ABRs in a configuration similar to that of a multi-cavity resonator: drive on one end, sense on the other end. A MP topology can be programmed selectively for use as a filter or a resonator. Both TL and MP devices may be patterned lithographically to provide multi-frequency operation on the same die.

Figure 14A:
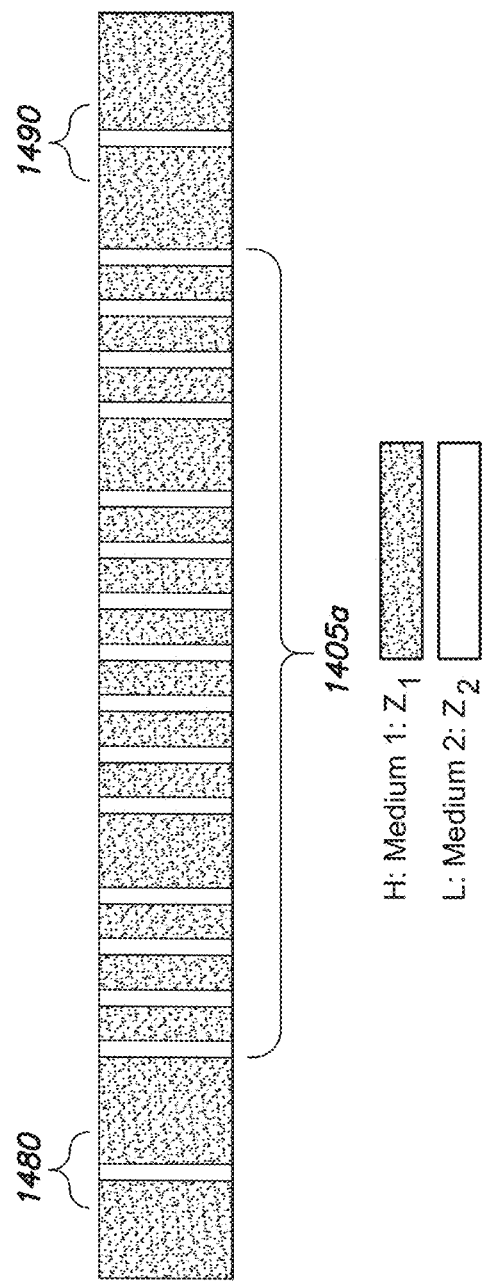
FIG. 14A is a schematic illustration of a 1-D unreleased transmission line (TL) filter.

Unreleased Coupled Multi-Cavity Structures in Transmission Line (TL) Configuration FIG. 14A shows the diagram of a transmission line configuration of an unreleased band-pass filter 1405a. The signal is fed to the driving transducer 1480 which generates longitudinal vibrations that travel throughout the filter section 1405a. The vibration energy is then converted back into the electrical domain through the motional current generated at the sensing unit 1490. Note that the driving transducer 1480 can be an electrostatically/dielectrically driven capacitor or piezoelectrically driven transducer and the sensor 1490 can be an electrostatic/dielectric or piezoresistive sensing unit. In the TL scheme, the scattering parameter of interest is the $S_{21}$ coefficient of the filter. Typical RF measurements parameters used for filters are the $S_{21}$ and usually the insertion loss (linked to the $S_{11}$) of the filter.

Figure 14B:
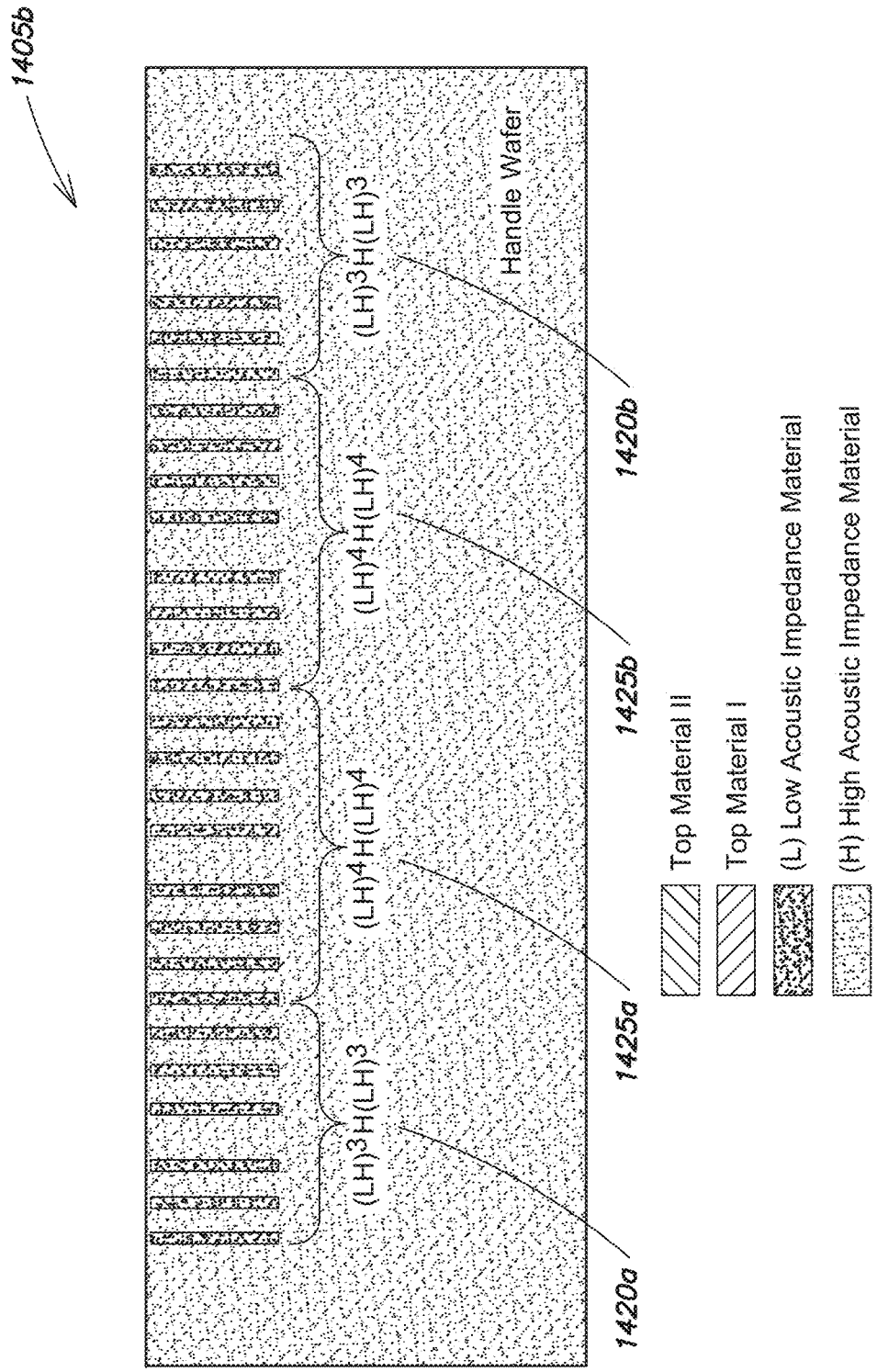
FIG. 14B is a schematic illustration of a TL filter structure $(LH)^N H (LH)^N$; this structure can be considered as a Fabry-Perot Resonator (FPR).

FIG. 14B shows an unreleased TL band-pass filter 1405b with ABGC structures that can be constructed using different periodic repetitions (e.g., with periodicity N) of high-acoustic impedance (H) and low acoustic impedance materials (L), both quarter wavelength sections at a design frequency $f_0$. In operation of these TL filters, inserting a quarter-wave layer of material H between two $(LH)^N$ structures can generate an ultra-narrowband transmission peak in the frequency response. The basic unit of this TL filter structure is $(LH)^N H (LH)^N$ and this building block is defined as a Fabry-Perot Resonator (FPR). Specifically, FIG. 14B shows $(LH)^3 H (LH)^3$ outer building blocks 1420a and 1420b and $(LH)^4 H (LH)^4$ inner building blocks 1425a and 1425b. The FPR can also be obtained by inter-changing the role of the H and L in the designs. By repeating the FPR structure several times and with different lengths of periodicity N, it is possible to design a TL filter with a very narrow transmission band centered on $f_0$.

In an exemplary configuration of a TL filter with 4 repeated FPR structures, the whole family of designs can be described as $$(LH)^{N_1} H (LH)^{N_1} | (LH)^{N_2} H (LH)^{N_2} | (LH)^{N_3} H (LH)^{N_3} | (LH)^{N_4} H (LH)^{N_4}$$

where the different $(N_1, N_2, \ldots)$ coefficients are used to optimize the pass-band bandwidth, shape factor and ripple of the TL filter. These filter designs can be annotated as $\text{Filter}_{LH} (N_1, N_2, N_3, N_4)$.

Figure 14C:
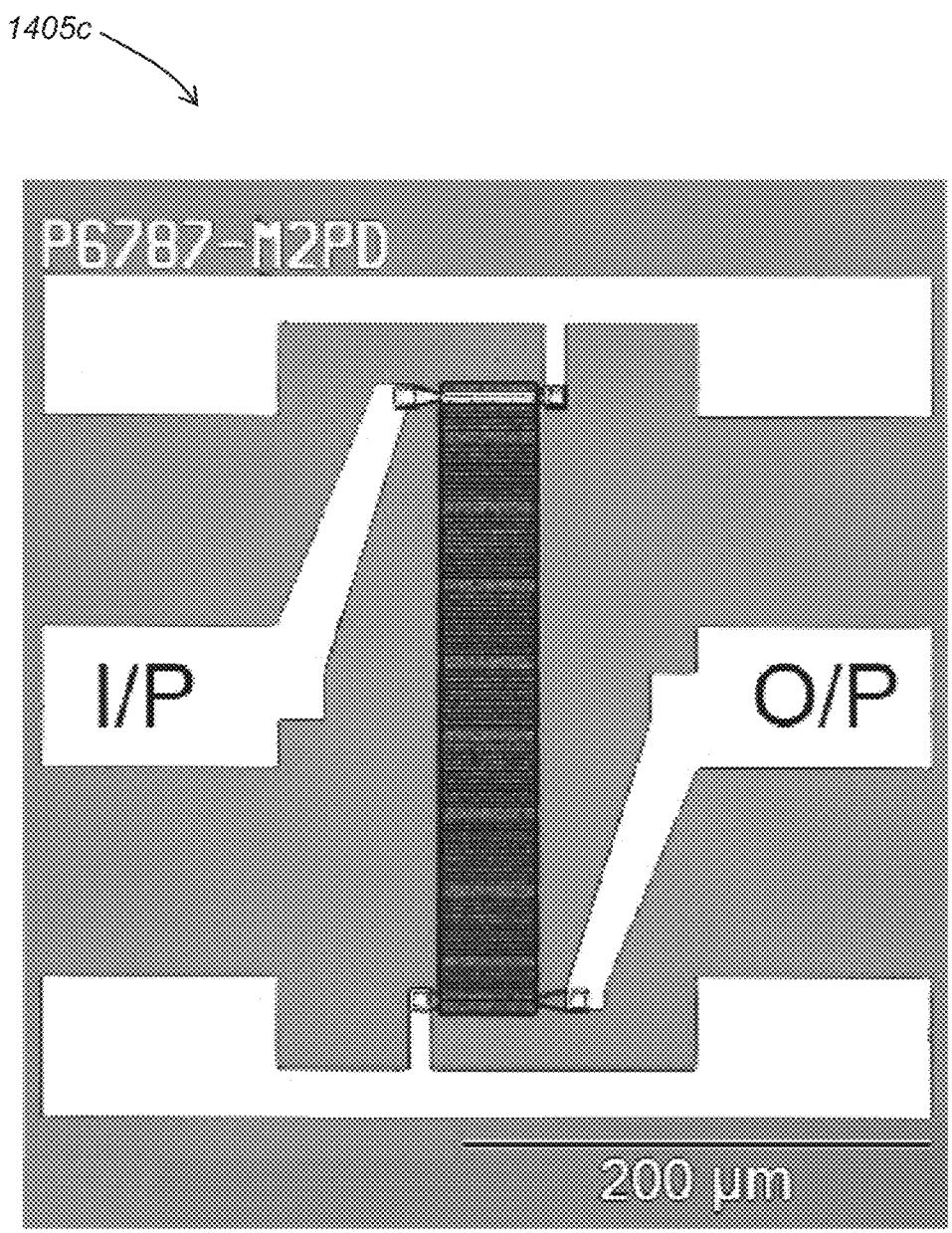
FIG. 14C is an optical micrograph over a schematic illustration of a 1-D unreleased TL filter configuration.

FIG. 14C shows an optical micrograph of a fabricated TL filter 1405c on a substrate 1410. In the configuration shown, the filter 1405c includes a signal input contact pad labelled "I/P," a signal output contact pad labelled "O/P," and a strip of darker region of transmission filter containing an array of resonant cavities, acoustic couplers and various acoustic components. The electrical signal can applied to the transmission filter via the signal input contact pad I/P. The transmission filter passes the signal within the transmitted frequency band, and the resulting filtered output signal is emitted via the signal output contact pad O/P.

In some embodiments, a plurality of lithographically defined filters 1405c with different operating frequencies can be incorporated in a "filter bank" all within the same substrate 1410 to work with various wireless communications standards. This integration process can be readily achievable using available CMOS compatible processes.

Unreleased Coupled Multi-Cavity Structures with S/SiO$_2$ Narrowband Filters

The frequency response of the $\text{Filter}_{LH} (N_1, N_2, N_3, N_4)$ structures described above can be simulated as a function of the materials used and periodicity lengths $N_i$ using 1-dimensional MATLAB simulations. For a given structure (i.e., if the N1, N2 ... are set), the amplitudes of incoming and reflecting waves are solved in each domain of the filter. This way, the output wave is computed to obtain the scattering parameters, such as $S_{21}$ and $S_{11}$, etc. One can also use the Mason model to produce similar simulations.

Figure 15A:
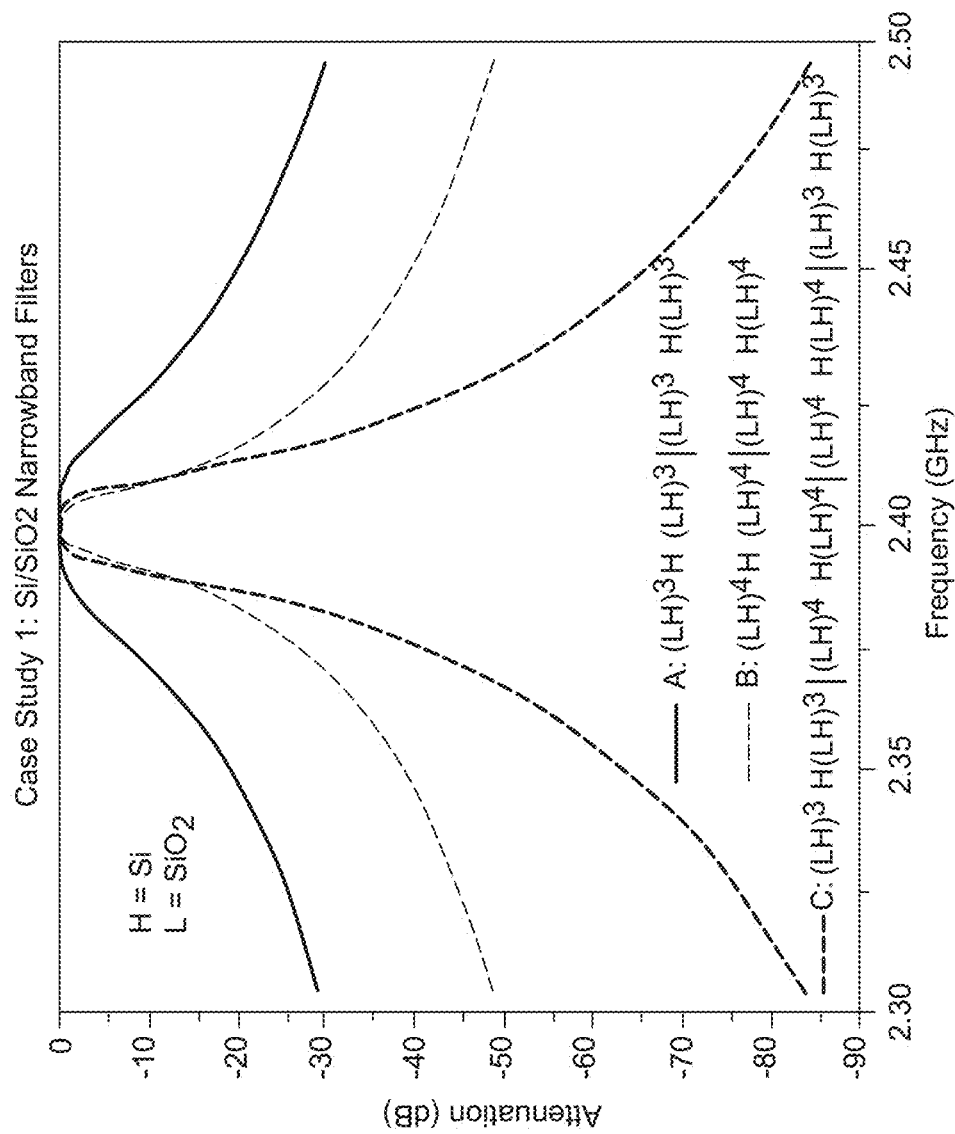
FIG. 15A shows a plot of 1-D transmission filter responses around a frequency of 2.4 GHz of an unreleased TL transmission filter comprising a single-crystalline silicon/silicon dioxide material combination.

FIG. 15A shows a plot of the simulated transmission responses (attenuation in dB vs. input frequency) of different narrowband transmission line filters produced in this way for a silicon/silicon dioxide (Si/SiO$_2$) material pair selection. By choosing different periodicity $N_i$, as well as different repetition schemes, the pass-band bandwidth, shape-factor and ripple of the filter structures can be tuned, as shown with the different responses of Designs A, B and C.

As shown in FIG. 15A, Design C has a 3 dB bandwidth of 13.8 MHz and a 30 dB bandwidth of 36.5 MHz (i.e., a 3 dB/30 dB shape factor of 2.64). Note that for these three designs, the transmission has a flat-band response with a relatively low ripple. This ripple can be reduced by modifying the periodicity of the designs.

Table 2 shows some of the ratios of acoustic impedances that are included in the simulation efforts.

TABLE 2

Ratios of Acoustic Impedances for some Material Combinations

| Material combinations | Ratios of Acoustic Impedances |
|---|---|
| Si/SiO$_2$ | 1.748677098 |
| Si/SiN | 0.750580629 |
| Cu/SiO$_2$ | 3.161947824 |
| Al/SiO$_2$ | 1.353709762 |
| W/SiO$_2$ | 7.837215934 |
| AlN/SiO$_2$ | 2.838344667 |
| polySi/SiO$_2$ | 1.600084242 |
| Si/polySi | 1.092865645 |
| SCS110/polySi | 1.033208337 |

Figure 15B:
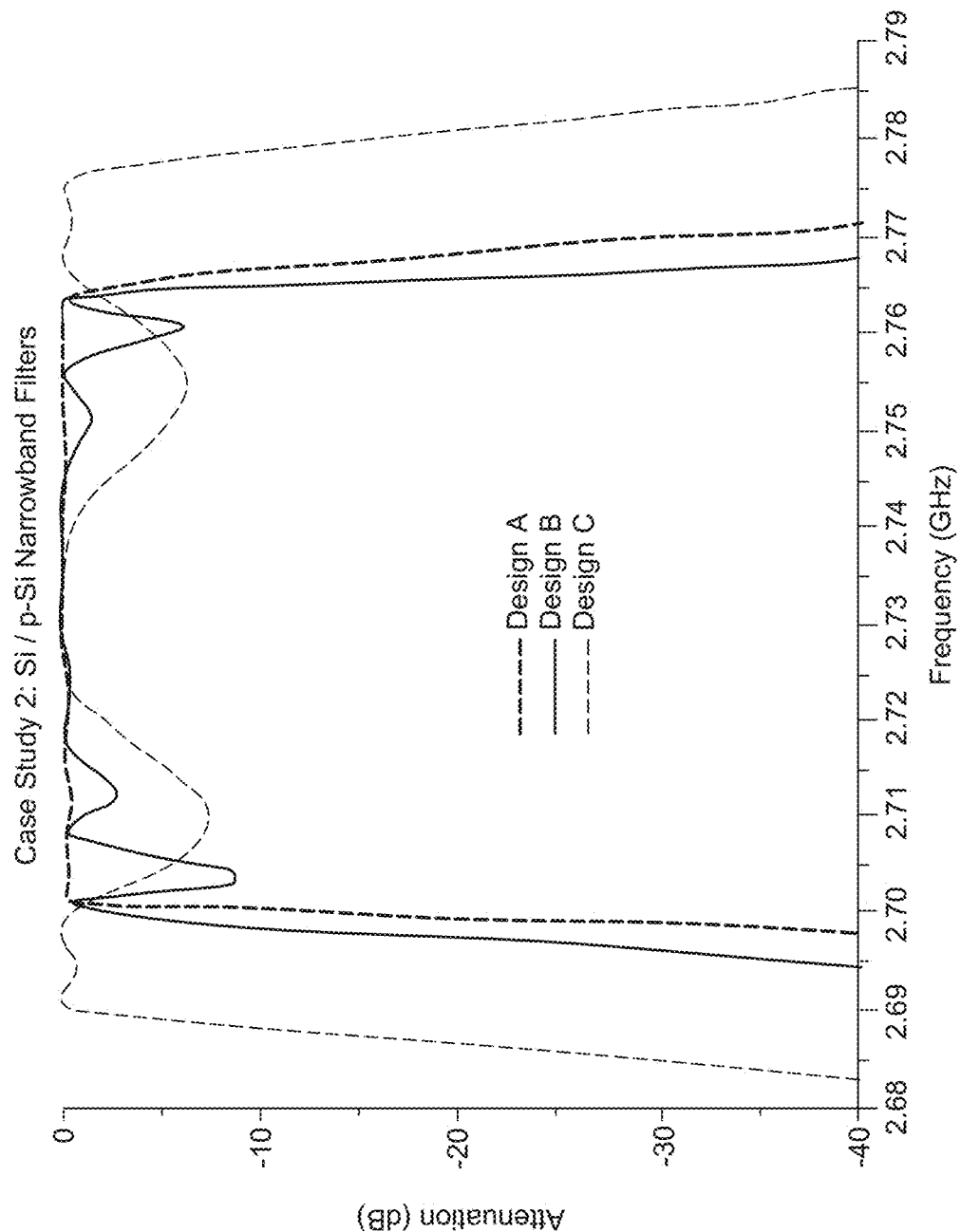
FIG. 15B shows a plot of 1-D filtered transmission responses of an unreleased TL transmission filter comprising a single-crystalline silicon/polycrystalline silicon material combination.

Unreleased Coupled Multi-Cavity Structures with Si/p-Si Narrowband Transmission Filters FIG. 15B shows a plot of the simulated transmission responses of different narrowband transmission filters produced using the silicon/polycrystalline silicon (Si/p-Si) material pair. In this configuration, the overall length of the TL filters needs to be larger because of the low acoustic impedance mismatch between the two materials. The filter responses shown in FIG. 15B correspond to three different designs using the stacking of two filter sections as

TABLE 3

Design parameters for the Si/p-Si transmission filters
|Filter$_{LH}$(N$_1$, N$_2$, N$_3$, N$_4$)|Filter$_{HL}$(N$_4$, N$_3$, N$_2$, N$_1$)|

| Parameters | Design A | Design B | Design C |
| --- | --- | --- | --- |
| N$_1$ | 6 | 8 | 4 |
| N$_2$ | 7 | 8 | 8 |
| N$_3$ | 8 | 8 | 4 |
| N$_4$ | 8 | 8 | 8 |

The design parameters are summarized in Table 3. In these simulations, the Bragg unit cell is set to $L_{p\text{-}Si}=L_{Si}=850$ nm.

From FIG. 15B, the number $N_i$ periodicity affects both the width of the pass-band as well as the ripple. The pass-band width can be lowered by increasing the periodicity of the structures, hence making the overall filter structures longer. The ripple on the other hand is optimized by using asymmetric structures as the one of Design A.

Figure 15C:
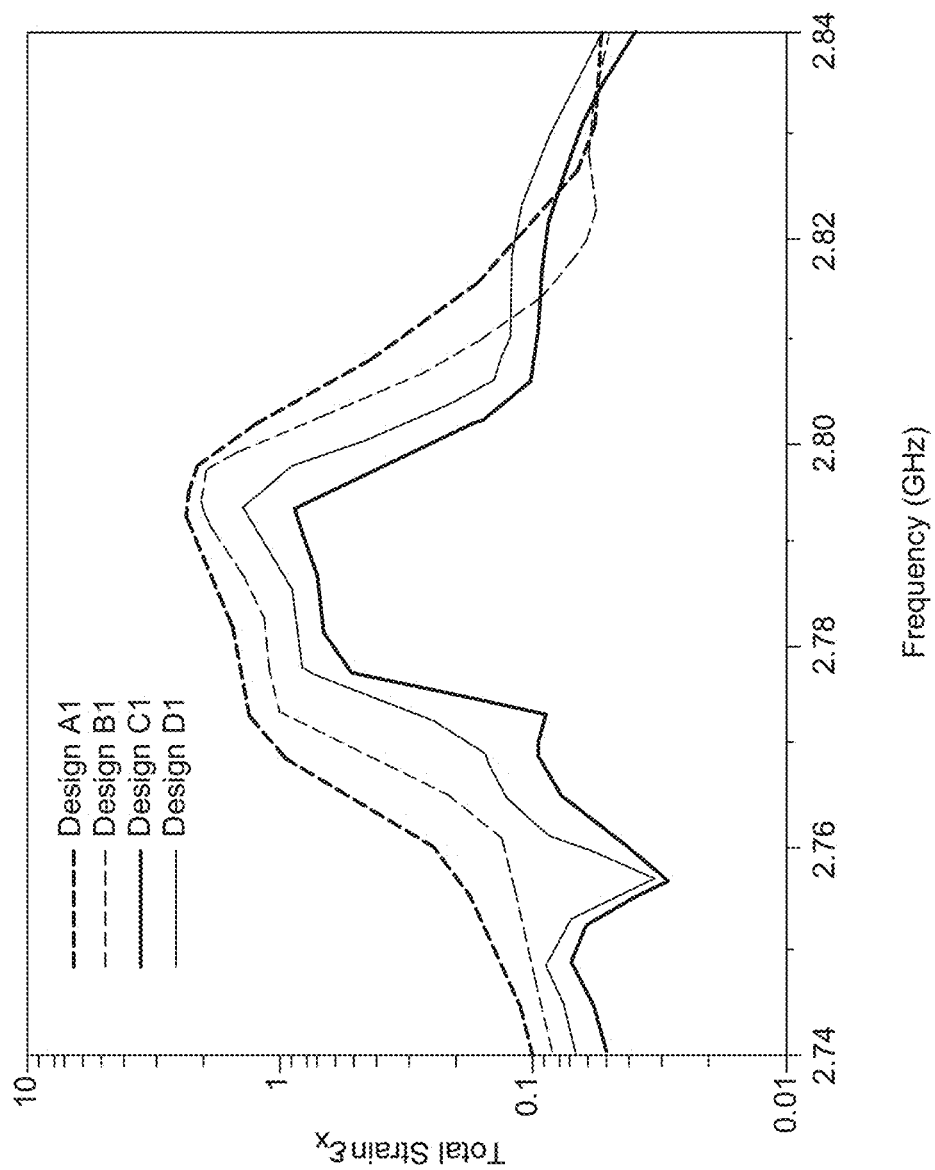
FIG. 15C shows a plot of longitudinal strain in the sensing unit for different unreleased TL filter designs.

FIG. 15C shows the simulated (COMSOL) total longitudinal strain Ex in a dielectric sensing unit for different filters based on Filter$_{LH}$(N$_1$, N$_2$, N$_2$, N$_1$) structures, as summarized in Table 4. The relatively low simulated off-band rejection may be due to the large scattering of the acoustic energy in the bulk as well as the coupling to spurious surface modes.

TABLE 4

Design parameters for the Si/p-Si transmission filters used in the COMSOL simulations

| Parameters | Design A1 | Design B1 | Design C1 | Design D1 |
| --- | --- | --- | --- | --- |
| N$_1$ | 12 | 15 | 20 | 17 |
| N$_2$ | 15 | 15 | 17 | 17 |

Unreleased Coupled Multi-Cavity Structures in Multi-Pole (MP) Configuration

Figure 16:
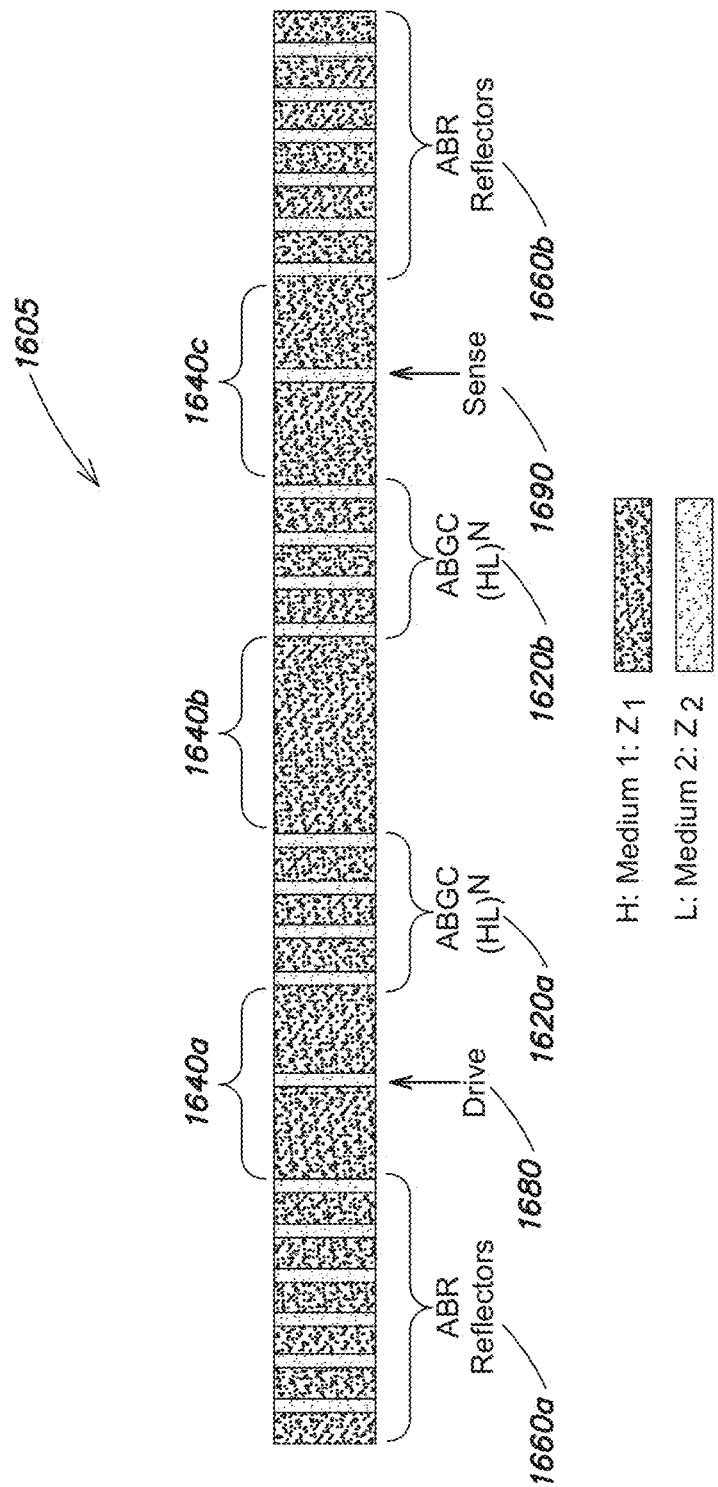
FIG. 16 is a schematic illustration of a cavity-driven, 1-D unreleased multi-pole (MP) transmission filter.

FIG. 16 shows a schematic illustration of an unreleased coupled multi-cavity transmission filter 1605 in a multi-pole (MP) configuration that includes a N number of resonant cavities 1640 acoustically coupled together using ABGC structures 1620a and 1620b (collectively, ABGC structures 1620) to produce a system with N-poles on a substrate 1610 with outer ABRs 1660a and 1660b (collectively, ABRs 1660). In the configuration shown in FIG. 16, there are 3 resonant cavities 1640a-1640c (collectively, cavities 1640) coupled by 2 ABGC structures 1620. The structure parameters (e.g., cavity length, number, ABGC number of periods, etc.) can be varied in order to bring the multiple resonances closer together in frequency.

Unlike the TL transmission filters 1405a or 1405b as described in FIGS. 14A and 14B, respectively, the band-pass behavior of the filter 1605 is achieved by combining 5 available modes of vibrations generated by the presence of 5 coupled-cavities within the MP filter 1605. Variations in the cavity sections are similar to variations in the resonators, but in the MP configuration, the resonant cavities are arranged to bring the multiple resonances closer together in frequency. Each of the ABGC structures 1620 between adjacent cavities 1640 can generate a frequency separation between the resonant modes, and as a result, the width of the band-pass as well as many other parameters of the MP filter can be engineered by configuring both the ABGCs 1620 and resonant cavities 1640.

The MP filter 1605 also includes a resonant cavity 1640a that functions as a transducer 1680 to drive the signal and another resonant cavity 1640b that functions as a sensor 1690 to sense the output signal. This configuration is structurally similar to the resonator 400a, as described in FIG. 4A, but this device 1605 works as a transmission filter whereas the device 400a functions as a resonator. As with the resonator configuration, the multi-drive/multi-sense configurations can be used drive the signal on multiple cavities to achieve the different pass-band shapes of the filters.

Conclusion

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of designing and making the technology disclosed herein may be implemented using hardware, software or a combination thereof. When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes (e.g., of designing and making the coupling structures and diffractive optical elements disclosed above) outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of" will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of" "only one of" or "exactly one of" "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. An apparatus comprising:
a semiconductor substrate;
a plurality of resonant cavities defined by at least one solid material disposed in and/or on the semiconductor substrate, the plurality of resonant cavities comprising a first resonant cavity and a second resonant cavity;
a first acoustic coupler, disposed between the first resonant cavity and the second resonant cavity, to couple an acoustic wave between the first resonant cavity and the second resonant cavity, wherein the first acoustic coupler comprises alternating layers of a first solid material having a first acoustic impedance and a second solid material having a second acoustic impedance different than the first acoustic impedance, wherein the alternating layers alternate at a first period; and
a second acoustic coupler disposed between the second resonant cavity and a third resonant cavity in the plurality of resonant cavities, the second acoustic coupler comprising layers of the first solid material and the second solid material alternating at a second period different than the first period.

2. The apparatus of claim 1, wherein the first resonant cavity is configured to resonate at a first frequency and the second resonant cavity is configured to resonate at a second frequency different than the first frequency.

3. The apparatus of claim 1, wherein the first acoustic coupler has an acoustic path length less than or equal to half a wavelength of the acoustic wave and the first acoustic impedance is lower than the acoustic impedance of the first resonant cavity.

4. The apparatus of claim 1, wherein:
the first resonant cavity has a first length greater than the first period.

5. The apparatus of claim 1, further comprising:
a reflector, in acoustic communication with the first resonant cavity, to reflect the acoustic wave at least partially toward the first resonant cavity.

6. The apparatus of claim 1, further comprising:
a transducer, in acoustic communication with the first resonant cavity, to apply a driving signal to the first resonant cavity so as to generate the acoustic wave.

7. The apparatus of claim 1, further comprising:
a sensor, in acoustic communication with at least one resonant cavity in the plurality of resonant cavities, to sense the acoustic wave.

8. The apparatus of claim 1, further comprising:
at least one layer of solid material disposed on the plurality of resonant cavities.

9. An apparatus comprising:
a semiconductor substrate;
a plurality of resonant cavities defined by at least one solid material disposed in and/or on the semiconductor substrate, the plurality of resonant cavities comprising a first resonant cavity and a second resonant cavity; and
a first acoustic coupler, disposed between the first resonant cavity and the second resonant cavity, to couple an acoustic wave between the first resonant cavity and the second resonant cavity, wherein:
the first acoustic coupler comprises alternating layers of a first solid material having a first acoustic impedance and a second solid material having a second acoustic impedance different than the first acoustic impedance;
the alternating layers alternate at a first period; and
the first resonant cavity has a first length equal to about half the first period.

10. An apparatus comprising:
a semiconductor substrate;
a plurality of resonant cavities defined by at least one solid material disposed in and/or on the semiconductor substrate;
at least one transducer, in acoustic communication with at least one resonant cavity in the plurality of resonant cavities, to apply a driving signal to the at least one resonant cavity so as to generate an acoustic wave;
a plurality of acoustic Bragg grating couplers (ABGCs), each ABGC in the plurality of ABGCs disposed between a respective pair of resonant cavities in the plurality of resonant cavities to couple the acoustic wave among the plurality of resonant cavities; and
a sensor, in acoustic communication with the at least one resonant cavity in the plurality of resonant cavities, to sense the acoustic wave,
wherein the plurality of resonant cavities comprises a first resonant cavity comprising a first solid material having a first acoustic impedance and a second solid material having a second acoustic impedance greater than the first acoustic impedance.

11. The apparatus of claim 10, wherein the first solid material and the second solid material are arrayed at a period greater than a period of at least one ABGC in the plurality of ABGCs.

12. An apparatus comprising:
a semiconductor substrate;
a plurality of resonant cavities defined by at least one solid material disposed in and/or on the semiconductor substrate;
at least one transducer, in acoustic communication with at least one resonant cavity in the plurality of resonant cavities, to apply a driving signal to the at least one resonant cavity so as to generate an acoustic wave;
a plurality of acoustic Bragg grating couplers (ABGCs), each ABGC in the plurality of ABGCs disposed between a respective pair of resonant cavities in the plurality of resonant cavities to couple the acoustic wave among the plurality of resonant cavities; and
a sensor, in acoustic communication with the at least one resonant cavity in the plurality of resonant cavities, to sense the acoustic wave,
wherein the plurality of resonant cavities comprises at least one resonant cavity having a length equal to about half of a period of at least one ABGC in the plurality of ABGCs.

13. An apparatus comprising:
a semiconductor substrate;
a plurality of resonant cavities defined by at least one solid material disposed in and/or on the semiconductor substrate;
at least one transducer, in acoustic communication with at least one resonant cavity in the plurality of resonant cavities, to apply a driving signal to the at least one resonant cavity so as to generate an acoustic wave;
a plurality of acoustic Bragg grating couplers (ABGCs), each ABGC in the plurality of ABGCs disposed between a respective pair of resonant cavities in the plurality of resonant cavities to couple the acoustic wave among the plurality of resonant cavities; and
a sensor, in acoustic communication with the at least one resonant cavity in the plurality of resonant cavities, to sense the acoustic wave, wherein the plurality of ABGCs comprises:
a first ABGC having a first grating period; and
a second ABGC having a second grating period greater than the first grating period.

14. An apparatus comprising:
a semiconductor substrate;
a plurality of resonant cavities defined by at least one solid material disposed in and/or on the semiconductor substrate;
at least one transducer, in acoustic communication with at least one resonant cavity in the plurality of resonant cavities, to apply a driving signal to the at least one resonant cavity so as to generate an acoustic wave;
a plurality of acoustic Bragg grating couplers (ABGCs), each ABGC in the plurality of ABGCs disposed between a respective pair of resonant cavities in the plurality of resonant cavities to couple the acoustic wave among the plurality of resonant cavities;
a sensor, in acoustic communication with the at least one resonant cavity in the plurality of resonant cavities, to sense the acoustic wave; and
a pair of acoustic Bragg grating reflectors, in acoustic communication with the plurality of resonant cavities, to at least partially confine the acoustic wave within the plurality of resonators.

15. An apparatus comprising:
a semiconductor substrate;
at least one periodic array of first unit cells defined in or disposed on the semiconductor substrate at a first period selected to at least partially reflect an acoustic wave having a wavelength $\lambda$, each unit cell in the at least one periodic array of first unit cells comprising a first layer of solid material having a first acoustic impedance and a second layer of solid material having a second acoustic impedance; and
at least one periodic array of second unit cells defined in or disposed on the semiconductor substrate at a second period selected to at least partially transmit the acoustic wave, each unit cell in the at least one periodic array of second unit cells comprising a third layer of solid material having a third acoustic impedance and a fourth layer of solid material having a fourth acoustic impedance,
wherein the first period is about $\lambda/2$ and the second period is about $\lambda$.

16. The apparatus of claim 15, further comprising:
at least one cavity defined in or disposed on the semiconductor substrate in acoustic communication with the at least one periodic array of first unit cells and the at least one periodic array of second unit cells.

* * * * *